(12) United States Patent
Seo et al.

(10) Patent No.: US 8,247,804 B2
(45) Date of Patent: Aug. 21, 2012

(54) LIGHT-EMITTING ELEMENT, LIGHT-EMITTING DEVICE, AND ELECTRONIC DEVICE

(75) Inventors: Satoshi Seo, Kanagawa (JP); Nobuharu Ohsawa, Kanagawa (JP)

(73) Assignee: Semiconductor Energy Laboratory Co., Ltd. (JP)

( * ) Notice: Subject to any disclaimer, the term of this patent is extended or adjusted under 35 U.S.C. 154(b) by 358 days.

(21) Appl. No.: 12/465,317

(22) Filed: May 13, 2009

(65) Prior Publication Data

US 2009/0283757 A1  Nov. 19, 2009

(30) Foreign Application Priority Data

May 16, 2008  (JP) ................................. 2008-130215
Jul. 31, 2008  (JP) ................................. 2008-198721

(51) Int. Cl.
*H01L 51/52*  (2006.01)
(52) U.S. Cl. ...................... 257/40; 257/98; 257/E51.018
(58) Field of Classification Search .................... 257/40, 257/98
See application file for complete search history.

(56) References Cited

U.S. PATENT DOCUMENTS

| | | | |
|---|---|---|---|
| 3,833,894 A | 9/1974 | Aviram et al. | |
| 5,375,250 A | 12/1994 | Van den Heuvel | |
| 5,922,481 A | 7/1999 | Etzbach et al. | |
| 6,090,434 A | 7/2000 | Sugiura et al. | |
| 6,340,588 B1 | 1/2002 | Nova et al. | |
| 6,387,546 B1 | 5/2002 | Hamada et al. | |
| 6,447,934 B1 | 9/2002 | Suzuki et al. | |
| 6,504,300 B2 | 1/2003 | Kawamura et al. | |
| 6,509,217 B1 | 1/2003 | Reddy | |
| 6,528,815 B1 | 3/2003 | Brown et al. | |
| 6,580,213 B2 | 6/2003 | Yamazaki | |
| 6,670,052 B2 | 12/2003 | Hirose et al. | |
| 6,683,322 B2 | 1/2004 | Jackson et al. | |
| 6,683,802 B2 | 1/2004 | Katoh | |
| 6,750,472 B2 * | 6/2004 | Suzuki et al. | .................. 257/40 |

(Continued)

FOREIGN PATENT DOCUMENTS

EP  1 565 041 A1  8/2005

(Continued)

OTHER PUBLICATIONS

Kajii, H. et al, "Study of Transient Electroluminescence Process Using Organic Light-Emitting Diode with Partial Doping Layer," Japanese Journal of Applied Physics, vol. 45, No. 4B, 2006, pp. 3721-3724.

(Continued)

*Primary Examiner* — A. Sefer
(74) *Attorney, Agent, or Firm* — Husch Blackwell LLP

(57) ABSTRACT

Disclosed is a light-emitting element with a good carrier balance and manufacturing method thereof which does not require the formation of the heterostructure. The light-emitting element includes an organic compound film containing a first organic compound as the main component (base material) between an anode and a cathode, wherein the organic compound film is provided in contact with the anode and with the cathode. The first organic compound further includes a light-emitting region to which a light-emitting substance is added and includes a hole-transport region to which a hole-trapping substance is added and/or an electron-transport region to which an electron-trapping substance is added. The hole-transport region is located between the light-emitting region and the anode, and the electron-transport region is located between the light-emitting region and the cathode.

16 Claims, 49 Drawing Sheets

U.S. PATENT DOCUMENTS

| | | | |
|---|---|---|---|
| 6,809,952 B2 | 10/2004 | Masui | |
| 6,833,201 B2 | 12/2004 | Czerw et al. | |
| 6,847,047 B2 | 1/2005 | VanBuskirk et al. | |
| 6,977,389 B2 | 12/2005 | Tripsas et al. | |
| 6,995,509 B2 | 2/2006 | Yamazaki et al. | |
| 7,050,326 B2 | 5/2006 | Anthony | |
| 7,053,545 B2 | 5/2006 | Yamazaki | |
| 7,196,360 B2 | 3/2007 | Seo et al. | |
| 7,220,985 B2 | 5/2007 | Cheung et al. | |
| 7,351,999 B2 | 4/2008 | Li | |
| 7,359,230 B2 | 4/2008 | Sumida et al. | |
| 7,420,203 B2 | 9/2008 | Tsutsui et al. | |
| 7,456,425 B2 | 11/2008 | Seo et al. | |
| 7,474,049 B2 | 1/2009 | Liu et al. | |
| 7,498,740 B2 | 3/2009 | Yamazaki | |
| 7,528,542 B2 | 5/2009 | Kawamura et al. | |
| 7,622,200 B2 | 11/2009 | Ohsawa et al. | |
| 2001/0031509 A1 | 10/2001 | Yamazaki | |
| 2001/0051207 A1 | 12/2001 | Yamagata et al. | |
| 2002/0105005 A1* | 8/2002 | Seo et al. | 257/101 |
| 2003/0127967 A1 | 7/2003 | Tsutsui et al. | |
| 2003/0209974 A1* | 11/2003 | Yamazaki | 313/504 |
| 2004/0018383 A1* | 1/2004 | Aziz et al. | 428/690 |
| 2004/0150328 A1 | 8/2004 | Czerw et al. | |
| 2004/0164302 A1 | 8/2004 | Arai et al. | |
| 2005/0100760 A1 | 5/2005 | Yokoyama | |
| 2005/0174875 A1 | 8/2005 | Katoh | |
| 2005/0221121 A1* | 10/2005 | Ishihara et al. | 428/690 |
| 2006/0011908 A1 | 1/2006 | Ohsawa et al. | |
| 2006/0029828 A1 | 2/2006 | Kanno et al. | |
| 2006/0043859 A1 | 3/2006 | Fukuoka et al. | |
| 2006/0051615 A1 | 3/2006 | Kanno et al. | |
| 2006/0083946 A1 | 4/2006 | Lee et al. | |
| 2006/0091797 A1 | 5/2006 | Tsutsui et al. | |
| 2006/0131562 A1 | 6/2006 | Li | |
| 2006/0145168 A1 | 7/2006 | Yamazaki | |
| 2006/0158102 A1 | 7/2006 | Kawamura et al. | |
| 2006/0164006 A1 | 7/2006 | Yamazaki et al. | |
| 2006/0267068 A1 | 11/2006 | Sato et al. | |
| 2006/0267487 A1 | 11/2006 | Ozaki et al. | |
| 2007/0090756 A1 | 4/2007 | Okada et al. | |
| 2007/0116983 A1* | 5/2007 | Kanno et al. | 428/690 |
| 2007/0153565 A1 | 7/2007 | Nomura et al. | |
| 2007/0172699 A1 | 7/2007 | Nakashima et al. | |
| 2007/0194301 A1 | 8/2007 | Sezi et al. | |
| 2007/0230235 A1 | 10/2007 | Abe et al. | |
| 2008/0006821 A1 | 1/2008 | Suzuki et al. | |
| 2008/0007164 A1 | 1/2008 | Suzuki et al. | |
| 2008/0007165 A1 | 1/2008 | Suzuki et al. | |
| 2008/0048180 A1 | 2/2008 | Abe et al. | |
| 2008/0057609 A1 | 3/2008 | Li | |
| 2008/0090102 A1* | 4/2008 | Fujita | 428/704 |
| 2008/0111480 A1* | 5/2008 | Lee et al. | 313/504 |
| 2008/0122350 A1 | 5/2008 | Sakata et al. | |
| 2008/0142794 A1 | 6/2008 | Shitagaki et al. | |
| 2008/0149923 A1 | 6/2008 | Ohsawa et al. | |
| 2008/0210928 A1 | 9/2008 | Abe et al. | |
| 2008/0231177 A1 | 9/2008 | Nomura et al. | |
| 2008/0284318 A1* | 11/2008 | Deaton et al. | 313/504 |
| 2009/0053488 A1 | 2/2009 | Jinde et al. | |
| 2009/0091246 A1 | 4/2009 | Tsuji et al. | |
| 2009/0140643 A1 | 6/2009 | Ohsawa et al. | |
| 2009/0167168 A1 | 7/2009 | Seo et al. | |
| 2009/0174326 A1* | 7/2009 | Ishikawa et al. | 313/506 |
| 2009/0200918 A1* | 8/2009 | Seo et al. | 313/503 |
| 2009/0206331 A1 | 8/2009 | Seo et al. | |
| 2009/0206732 A1* | 8/2009 | Seo et al. | 313/504 |
| 2010/0033082 A1* | 2/2010 | Liu et al. | 313/504 |
| 2010/0078631 A1 | 4/2010 | Pieh | |
| 2010/0109518 A1* | 5/2010 | Suzuki et al. | 313/504 |

FOREIGN PATENT DOCUMENTS

| | | |
|---|---|---|
| EP | 1 881 543 A1 | 1/2008 |
| JP | 2000-68057 | 3/2000 |
| JP | 2001-291592 | 10/2001 |
| JP | 2004-79414 | 3/2004 |
| JP | 2004-221045 | 8/2004 |
| JP | 2004-273163 | 9/2004 |
| JP | 2006-66890 | 3/2006 |
| JP | 2006-156888 | 6/2006 |
| JP | 2006-173619 | 6/2006 |
| JP | 2007-59848 | 3/2007 |
| JP | 2007-134677 | 5/2007 |
| JP | 2007-234514 | 9/2007 |
| JP | 2009-37981 | 2/2009 |
| WO | WO 2006/070619 A1 | 7/2006 |
| WO | WO 2006/121105 A1 | 11/2006 |
| WO | WO 2007/063896 * | 6/2007 |

OTHER PUBLICATIONS

European Search Report re application No. EP 07012956.4, dated Oct. 5, 2007.

Office Action re Chinese application No. CN 200710106525.3, dated Nov. 13, 2009 (with English translation).

Office Action re Chinese application No. CN 200710127179.7, dated Nov. 27, 2009 (with English translation).

Office Action re Chinese application No. 200710127178.2, dated Mar. 23, 2010 (with English translation).

Tang, C.W. et al, "Organic Electroluminescent Diodes," Applied Physics Letters, vol. 51, No. 12, Sep. 21, 1987, pp. 913-915.

Adachi, C. et al, "Electroluminescence in Organic Films with Three-Layer Structure," Japanese Journal of Applied Physics, vol. 27, No. 2, Feb. 1988, pp. L269-L271.

Tsutsui, T. et al., "High Quantum Efficiency in Organic Light-Emitting Devices with Iridium-Complex as a Triplet Emissive Center", Jpn. J. Appl. Phys., vol. 38, Part 2, No. 12B, Dec. 15, 1999, pp. L1502-L1504.

Goldsmith, C.R. et al., "C-H Bond Activation by a Ferric Methoxide Complex: Modeling the Rate-Determining Step in the Mechanism of Lipoxygenase," J. Am. Chem. Soc., vol. 124, No. 1, 2002, pp. 83-96.

Onishi, T. et al., "A Method of Measuring an Energy Level," *High Molecular EL Materials—Development of Light-Emitting High Molecular Compounds*, Kyoritsu Shuppan, Dec. 25, 2004, pp. 64-67 (with English translation, pp. 1-3).

Lee, M-T et al., "Improved Stability of Organic Electroluminescent Devices by Doping Styrylamines in Hole or Electron Transporting Layer," Applied Physics Letters, vol. 86, No. 10, 2005, pp. 103501-1-103501-3.

Cina, S. et al, "Efficient Electron Injection from PEDOT-PSS into a Graded-n-Doped Electron Transporting Layer in an Inverted OLED Structure," SID 05 Digest: SID International Symposium Digest of Technical Papers, vol. 36, 2005, pp. 819-821.

International Search Report re application No. PCT/JP2009/058959, dated Sep. 8, 2009.

Written Opinion re application No. PCT/JP2009/058959, dated Sep. 8, 2009.

* cited by examiner

LIGHT-EMITTING ELEMENT, LIGHT-EMITTING DEVICE, AND ELECTRONIC DEVICE

TECHNICAL FIELD

The present invention relates to a light-emitting element that employs electroluminescence. Further, the present invention relates to a light-emitting device and an electronic device each having the light-emitting element.

BACKGROUND ART

In recent years, research and development of light-emitting elements using electroluminescence (EL) have been extensively conducted. In the basic structure of such a light-emitting element, a light-emitting substance is interposed between a pair of electrodes. By applying a voltage to this element, light emission can be obtained from the light-emitting substance.

Since this type of light-emitting element is a self-luminous type, it has advantages over a liquid crystal display in that visibility of a pixel is high and that no backlight is needed. Therefore, light-emitting elements are thought to be suitable as flat panel display elements. Further, such a light-emitting element also has advantages in that the element can be fabricated to be thin and lightweight and that response speed is very high.

Further, since this type of a light-emitting element can be formed to have a film shape, surface light emission can be easily obtained. This feature is difficult to realize with point light sources typified by a filament lamp and an LED or with linear light sources typified by a fluorescent light. Therefore, such light-emitting elements also have a high utility value as surface light source that can be applied to lighting apparatuses or the like.

Light-emitting elements using electroluminescence are broadly classified according to whether they use an organic compound or an inorganic compound as a light-emitting substance.

When an organic compound is used as a light-emitting substance, by application of a voltage to a light-emitting element, electrons and holes are injected into a layer containing the light-emitting organic compound from a pair of electrodes, whereby a current flows. Then, the carriers (i.e., electrons and holes) recombine to place the light-emitting organic compound into an excited state. The light-emitting organic compound returns to a ground state from the excited state, thereby emitting light. Such a light-emitting element using a light-emitting organic compound is generally referred to as an organic EL element.

Note that an excited state of an organic compound can be of two types: a singlet excited state and a triplet excited state, and luminescence from the singlet excited state is referred to as fluorescence, and luminescence from the triplet excited state is referred to as phosphorescence.

Proposal of a heterostructure in which layers of different organic compounds are stacked has brought about significant development of such light-emitting elements (see Non-Patent Document 1). That is because adopting a heterostructure increases carrier recombination efficiency and then improves emission efficiency. Then, a double heterostructure in which a light-emitting layer is formed between a hole-transport layer and an electron-transport layer has been proposed (see Non-Patent Document 2). An element structure based on the double heterostructure is now mainstream.

Further, by increasing the number of stacked layers, an attempt to improve lifetime has been made lately. For example, in Patent Document 1, an increase in lifetime is attempted by providing a layer to decelerate transport of electrons in addition to an electron-transport layer.

[Patent Document 1] Japanese Published Patent Application No. 2006-66890.
[Non-Patent Document 1] C. W. Tang and S. A. Vanslyke, *Applied Physics Letters*, Vol. 51, No. 12, 913-915, 1987.
[Non-Patent Document 2] C. Adachi, et al., *Japanese Journal of Applied Physics*, Vol. 27, L269-L271, 1988.

DISCLOSURE OF INVENTION

Considering the emission principle of organic EL elements, an increase in carrier recombination efficiency enables an improvement of emission efficiency. Further, since a variation in the balance of the recombination (carrier balance) over time results in a variation in emission efficiency over time, suppression of a variation in carrier balance over time leads to an increase in lifetime.

The reason for the necessity of the heterostructure as described in Background Art is that, with a single substance, it is difficult to fabricate a light-emitting element that has high carrier recombination efficiency (i.e., a good carrier balance between transport of holes and transport of electrons) or has a carrier balance that is not easily changed over time. Therefore, by complexing a heterostructure, an attempt to improve both emission efficiency and lifetime has been made.

However, on the other hand, the complexity of a heterostructure causes complication of a process for fabricating an element and adversely affects manufacturing costs and yield. For example, in the fabrication of an organic EL element having a complicated multilayer structure by a vacuum evaporation method, a substrate needs transferring through a number of chambers for forming a large number of layers, which inflates manufacturing costs (especially, the cost of a manufacturing apparatus). Further, if even one of the layers is defective, then the whole element is defective, which significantly decreases product yield.

As described above, the complexity of a heterostructure adversely affects manufacturing costs and yield, and accordingly is a major factor in interrupting practical application of an organic EL element at present.

Further, from the viewpoint of development of materials, a clear guideline for development is obscure because the number of possible combinations of materials in a heterostructure become enormous. For example, even if an electron-transport layer that is highly effective in improving the efficiency and lifetime of a light-emitting element having a red light-emitting layer is developed, the electron-transport layer often has the adverse effect of causing a significant deterioration in lifetime by being applied to a light-emitting element having a light-emitting layer of an emission color that is different from red (e.g., blue light-emitting element).

Namely, although a certain degree of emission efficiency can be ensured by adopting a heterostructure, lifetime could improve or drastically decrease depending on the adopted heterostructure. The cause of this phenomenon is very difficult to elucidate. Therefore, at present, such a phenomenon tends to be simply attributed to affinity of materials and hinders establishment of a strategy of the development of materials.

It can be said that the above problem is an adverse effect resulted from the traditional strategy in development of device properties which relies on the heterostructure. Therefore, in an embodiment of the present invention, a light-emitting element with a good carrier balance is fabricated without forming a heterostructure. Accordingly, a light-emitting element with high emission efficiency which can be easily fabricated is provided.

Further, in the embodiment of the present invention, a light-emitting element in which a variation in carrier balance over time is small is fabricated without forming a heterostructure. Accordingly, a light-emitting element with long lifetime which can be easily fabricated is provided.

Furthermore, by using a light-emitting element of an embodiment of the present invention, a light-emitting device with low power consumption and long lifetime is provided. Moreover, an electronic device with long lifetime is provided.

SUMMARY OF THE INVENTION

Many organic compounds enable both holes and electrons to flow therethrough in a thin film state and thus are inherently bipolar. In other words, in many cases, even a material called a hole-transport material enables electrons to flow therethrough, whereas even a material called an electron-transport material enables holes to flow therethrough. In an organic compound, however, since the hole-transport capability and the electron-transport capability are at different levels, the carrier balance between holes and electrons is difficult to strike with a single material.

However, as a result of intense study, the present inventors have found that even with a single film containing a single substance, the carrier balance can be improved by adding a carrier-trapping substance to an appropriate position of the film. The present inventors have found that this find can be used to solve the aforementioned problem without forming a heterostructure by applying an element structure as described below.

An embodiment of the present invention is a light-emitting element that includes an organic compound film containing a first organic compound between an anode and a cathode. The organic compound film is provided in contact with the anode and with the cathode. The organic compound film includes a light-emitting region to which a light-emitting substance is added and a hole-transport region to which a hole-trapping substance is added. The hole-transport region is located between the light-emitting region and the anode.

Further, an embodiment of the present invention is a light-emitting element that includes an organic compound film containing a first organic compound between an anode and a cathode. The organic compound film is provided in contact with the anode and with the cathode. The organic compound film includes a light-emitting region to which a light-emitting substance is added and an electron-transport region to which an electron-trapping substance is added. The electron-transport region is located between the light-emitting region and the cathode.

Further, an embodiment of the present invention is a light-emitting element that includes an organic compound film containing a first organic compound between an anode and a cathode. The organic compound film is provided in contact with the anode and with the cathode. The organic compound film includes a light-emitting region to which a light-emitting substance is added, a hole-transport region to which a hole-trapping substance is added, and an electron-transport region to which an electron-trapping substance is added. The hole-transport region is located between the light-emitting region and the anode. The electron-transport region is located between the light-emitting region and the cathode.

Note that in the above structure, in order that the hole-trapping substance effectively may trap holes, the HOMO (highest occupied molecular orbital) level of the hole-trapping substance is preferably higher than the HOMO level of the first organic compound by 0.2 eV or more. Further, in order that the electron-trapping substance effectively trap electrons, the LUMO level of the electron-trapping substance is preferably lower than the LUMO level of the first organic compound by 0.2 eV or more.

Here, although the above-described light-emitting element has a structure in which the carrier balance in the organic compound film including the first organic compound is improved, injection of carriers from the electrodes to the organic compound film is also important in enabling the light-emitting element to emit light more efficiently. Balance of this injection from the electrodes is important also in terms of lifetime since a change in carrier balance over time leads to luminance decay.

Therefore, in the above-described light-emitting element, an electron-accepting substance is preferably added to a region of the organic compound film, which is in contact with the anode. Further, an electron-donating substance is preferably added to a region of the organic compound film, which is in contact with the cathode. In order to achieve an improved carrier balance, it is preferable that an electron-accepting substance be added to the region of the organic compound film, which is in contact with the anode, and that an electron-donating substance be added to the region of the organic compound film, which is in contact with the cathode.

Moreover, it is effective to apply a mechanism of charge generation to the injection of carriers from the electrodes to the organic compound film.

Specifically, a preferable embodiment of the present invention is a light-emitting element according to the above-described light-emitting element, in which a charge generation region is provided in a region where the organic compound film is in contact with the anode. The charge generation region includes an N-type region to which an electron-donating substance is added and a P-type region to which an electron-accepting substance is added. The N-type region is located between the P-type region and the anode.

Another preferable embodiment of the present invention is a light-emitting element according to the above-described light-emitting element, in which a charge generation region is provided in a region where the organic compound film is in contact with the cathode. The charge generation region includes an N-type region to which an electron-donating substance is added and a P-type region to which an electron-accepting substance is added. The P-type region is located between the N-type region and the cathode.

In order to achieve an improved carrier balance, the charge generation regions are preferably provided both on the anode side and on the cathode side. Therefore, another preferable embodiment of the present invention is a light-emitting element according to the above-described light-emitting element, in which a first charge generation region is provided in a region where the organic compound film is in contact with the anode and a second charge generation region is provided in a region where the organic compound film is in contact with the cathode. The first charge generation region includes a first N-type region to which a first electron-donating substance is added and a first P-type region to which a first electron-accepting substance is added. The first N-type region is located between the first P-type region and the anode. The second charge generation region includes a second N-type region to which a second electron-donating substance is added and a second P-type region to which a second electron-accepting substance is added. The second P-type region is located between the second N-type region and the cathode.

Further, a preferable embodiment of the present invention to which the mechanism of charge generation is applied is a light-emitting element according to the above-described light-emitting element, in which a first electron-accepting substance is added to the region where the organic compound film is in contact with the anode and a charge generation region is provided in a region where the organic compound film is in contact with the cathode. The charge generation region includes an N-type region to which an electron-donating substance is added and a P-type region to which a second electron-accepting substance is added. The P-type region is located between the N-type region and the cathode.

Further, a preferable embodiment of the present invention to which the mechanism of charge generation is applied is a light-emitting element according to the above-described light-emitting element, in which a charge generation region is provided in a region where the organic compound film is in contact with the anode and a first electron-donating substance is added to a region where the organic compound film is in contact with the cathode. The charge generation region includes an N-type region to which a second electron-donating substance is added and a P-type region to which an electron-accepting substance is added. The N-type region is located between the P-type region and the anode.

A structure of a light-emitting element of the embodiment of the present invention as described above is useful particularly for simplification of a conventional phosphorescent light-emitting element which requires a special element structure including a hole-blocking layer or the like. Accordingly, a preferable structure of a light-emitting element of an embodiment of the present invention is a light-emitting element in which the light-emitting substance is a phosphorescent compound.

In recent years, a technique in which a full color display can be fabricated by providing a white light-emitting element with color filters has been proposed. A feature of such a technique is simplicity with which a full color display can be fabricated by forming just a white light-emitting element over a substrate. Thus, a light-emitting element of the embodiment of the present invention which can be easily fabricated is applied to a white light-emitting element, which is combined with color filters; accordingly, the effect of reducing costs can be obtained at the same time.

A white light-emitting element usually includes a plurality of light-emitting substances that emit light of different colors. Accordingly, a preferable embodiment of a light-emitting element of the present invention is a light-emitting element that has a structure of the above-described light-emitting element, and the light-emitting substance is a plurality of light-emitting substances that emit light of different colors. The light-emitting substances preferably include a light-emitting substance that emits red light, a light-emitting substance that emits green light, and a light-emitting substance that emits blue light, in particular. Further, for an improvement of luminous efficiency, the light-emitting substances preferably include a light-emitting substance that emits red light, a light-emitting substance that emits yellow light, a light-emitting substance that emits green light, and a light-emitting substance that emits blue light. With such a structure, a white light-emitting element that has the element structure of a light-emitting element of an embodiment of the present invention and exhibits white light emission can be obtained.

Note that an embodiment of the present invention includes a light-emitting device having the above-described light-emitting element. Thus, an embodiment of the present invention is a light-emitting device that has the above-described light-emitting element. A control circuit configured to control light emission of the light-emitting element can be incorporated to the light-emitting device.

Note that the term "light-emitting device" in the present specification includes an image display device, a light-emitting device, or a light source (including a lighting apparatus). Further, the following are all included in the "light-emitting device": a module in which a connector, for example, a flexible printed circuit (FPC), a tape automated bonding (TAB) tape, or a tape carrier package (TCP) is attached to a panel provided with a light-emitting element; a module provided with a printed wiring board at the end of the TAB tape or the TCP; and a module in which an integrated circuit (IC) is directly mounted to a light-emitting element by chip on glass (COG) method.

Further, an electronic device in which a light-emitting element of an embodiment of the present invention is used for a display portion is also included in the scope of the invention. Thus, an electronic device of an embodiment of the present invention includes a display portion, in which the display portion includes the above-described light-emitting element. A control circuit configured to control light emission of the light-emitting element can be incorporated to the light-emitting device.

By applying the present invention, a light-emitting element with a good carrier balance can be fabricated without forming a heterostructure. Accordingly, a light-emitting element with high emission efficiency which is easily fabricated can be provided.

Further, by applying the present invention, a light-emitting element in which a variation in carrier balance over time is small can be fabricated without forming a heterostructure. Accordingly, a light-emitting element with long lifetime can be provided.

Furthermore, by using the present invention, a light-emitting device with low power consumption and long lifetime can be provided. Moreover, an electronic device with long lifetime can be provided.

BEST MODE FOR CARRYING OUT THE INVENTION

Figure 1A:
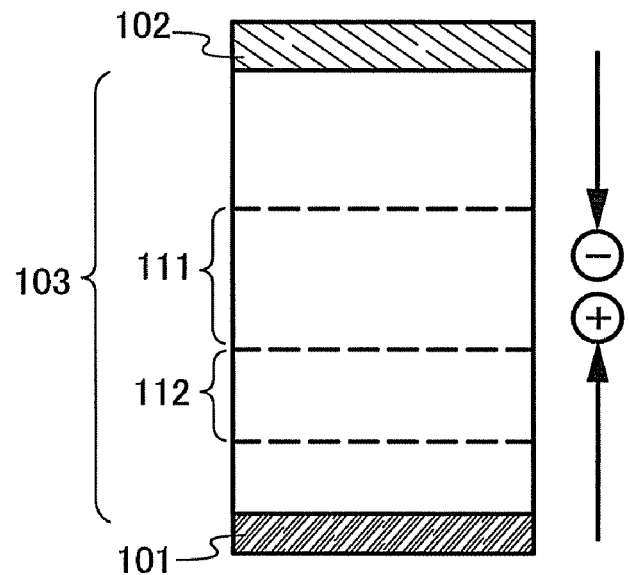
FIGS. 1A and 1B illustrate a light-emitting element according to an embodiment of the present invention.

Hereinafter, embodiments of the present invention will be described using the accompanying drawings. Note that the present invention is not limited to the description below, and the modes and details of the present invention can be easily modified in various ways by those skilled in the art without departing from the spirit and scope of the present invention. Therefore, the embodiments of the present invention should not be construed as being limited to the description of the embodiment modes and examples below. Note that in the description of the embodiments of the present invention below, the same reference numerals may be used to denote the same components among the different drawings in some cases.

Embodiment 1

In Embodiment 1, the concept and basic structure of the embodiment of the present invention will be described with reference to materials and fabrication methods which are used.

First, a case is considered where an organic compound film provided between an anode and a cathode contains a single organic compound (hereinafter, referred to as a first organic compound) and where a light-emitting substance is added to the organic compound film in order to control a light-emitting region and an emission color. This light-emitting region to which the light-emitting substance is added is preferably away from the anode and from the cathode so as to prevent quenching due to the electrode.

Many of organic compounds enable both holes and electrons to flow therethrough in a thin film state. In other words, in many cases, even a material that is generally called a hole-transport material enables electrons to flow therethrough, whereas even a material called an electron-transport material enables holes to flow therethrough. Therefore, by determining the work functions of the anode and the cathode (specifically, selecting an anode with a high work function and a cathode with a low work function) as appropriate, a light-emitting function can be exhibited even with the above-described structure.

However, with just this structure, it is difficult to enable a light-emitting element to efficiently emit light. That is because, in an organic compound, the hole-transport capability and the electron-transport capability are usually at different levels, and accordingly even if the organic compound film includes the first organic compound as the main component (base material), it is difficult to strike the carrier balance between holes and electrons. Thus, even if the light-emitting substance is added to the organic compound film to form the light-emitting region, the position of the light-emitting region is unlikely to coincide with that of a main region for carrier recombination, and accordingly emission efficiency is difficult to improve.

The present inventors expected that the carrier balance can be adjusted with an additive to solve this problem. In other words, the present inventors expected that, for example, when the first organic compound is a substance in which the hole-transport property is higher than the electron-transport property, the rate of transport of holes in the region between the anode and the light-emitting region can be decreased, and the carrier recombination efficiency can be increased, not only by adding the light-emitting substance to form the light-emitting region, but also by adding a hole-trapping substance between the light-emitting region and the anode. The present inventors also expected that when the first organic compound is, in contrast, a substance in which the electron-transport property is higher than the hole-transport property, the rate of transport of electrons in the region between the cathode and the light-emitting region can be decreased and the carrier recombination efficiency can be increased, not only by adding the light-emitting substance to form the light-emitting region, but also by adding an electron-trapping substance between the light-emitting region and the cathode. Naturally, these structures may be combined to design the most suitable carrier balance between holes and electrons.

In other words, it is an important concept of the present invention that the carrier balance is controlled not with a heterojunction between stacked layers of different substances but with a homojunction between stacked regions in which a single specific substance is used as their main component (base material) and appropriate additives are added in an appropriate region.

Hereinafter, an element structure based on the above concept is specifically described using FIGS. 1A and 1B, FIGS. 2A and 2B, and FIGS. 3A and 3B.

Figure 1B:
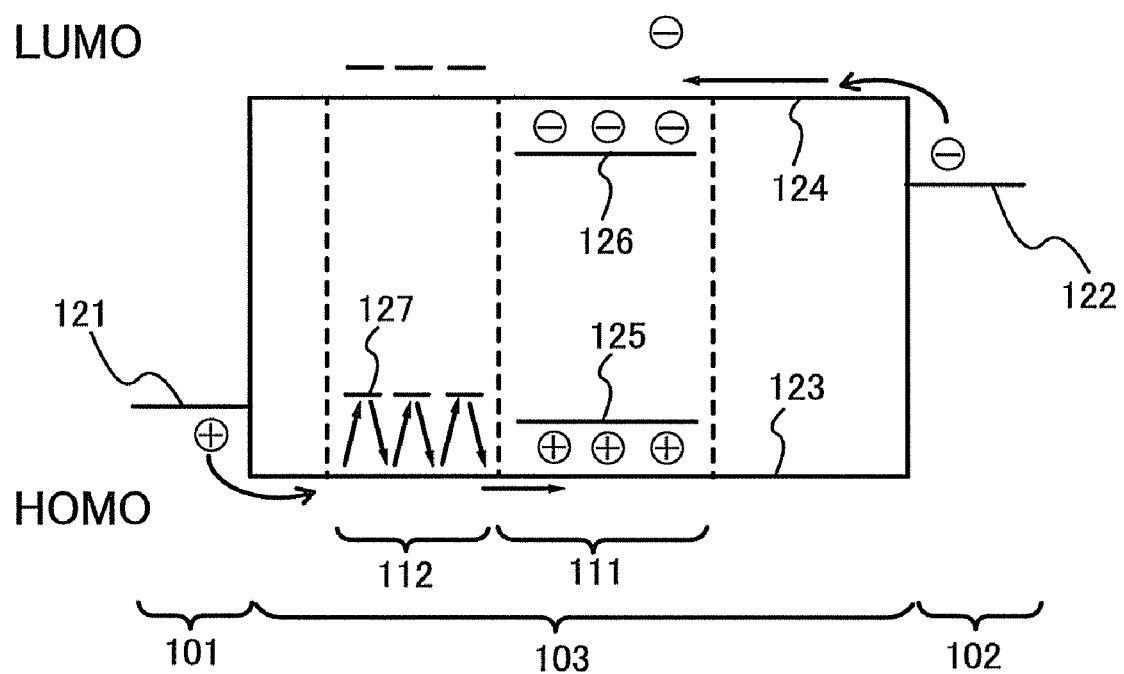

First, FIGS. 1A and 1B illustrate an example of a light-emitting element of an embodiment of the present invention which has an organic compound film 103 including a first organic compound between an anode 101 and a cathode 102. The organic compound film 103 is provided in contact with the anode 101 and with the cathode 102. The organic compound film 103 includes a light-emitting region 111 to which a light-emitting substance is added and a hole-transport region 112 to which a hole-trapping substance is added. The hole-transport region 112 is located between the light-emitting region 111 and the anode 101. FIG. 1A is a schematic diagram of the element structure, and FIG. 1B is a band diagram thereof.

Note that in FIG. 1B, reference numeral 121 denotes the Fermi level of the anode 101, reference numeral 122 denotes the Fermi level of the cathode 102, reference numeral 123 denotes the HOMO level of the first organic compound, reference numeral 124 denotes the LUMO (lowest unoccupied molecular orbital) level of the first organic compound, reference numeral 125 denotes the HOMO level of the light-emitting substance, reference numeral 126 denotes the LUMO level of the light-emitting substance, and reference numeral 127 denotes the HOMO level of the hole-trapping substance. Here, for efficient trapping of holes, the HOMO level 127 of the hole-trapping substance is preferably higher than the HOMO level 123 of the first organic compound, more preferably higher by 0.2 eV or more, in particular.

Note that in this specification, "having high HOMO level or high LUMO level" means having high energy level, and "having low HOMO level or low LUMO level" means having low energy level. For example, it can be said that a substance A having a HOMO level of −5.5 eV has lower HOMO level by 0.3 eV than a substance B having a HOMO level of −5.2 eV and has higher HOMO level by 0.2 eV than a substance C having a HOMO level of −5.7 eV.

A structure as illustrated in FIGS. 1A and 1B is effective particularly when the first organic compound has a high hole-transport property. In other words, by providing the hole-transport region 112 to which the hole-trapping substance is added between the light-emitting region 111 and the anode 101, the rate of transport of holes in the hole-transport region 112 is decreased, and excessive holes can be prevented from being supplied to the light-emitting region 111. Accordingly, since a phenomenon in which holes pass through the light-emitting region 111 can be suppressed, the carrier recombination efficiency can be increased.

Figure 2A:
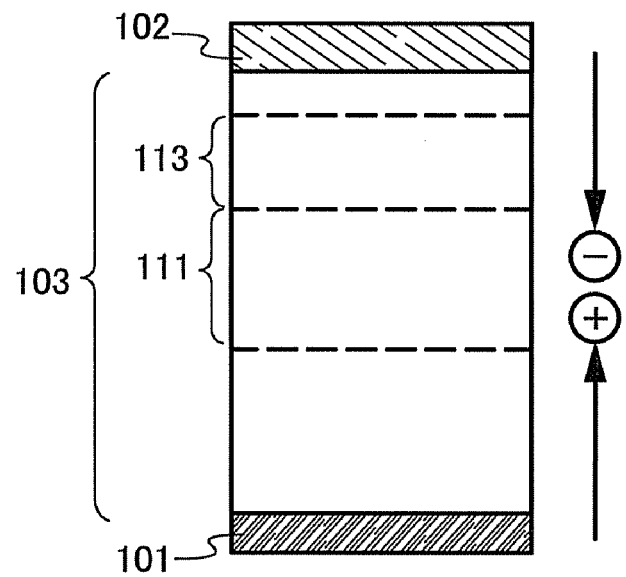
FIGS. 2A and 2B illustrate a light-emitting element according to an embodiment of the present invention.
Figure 2B:
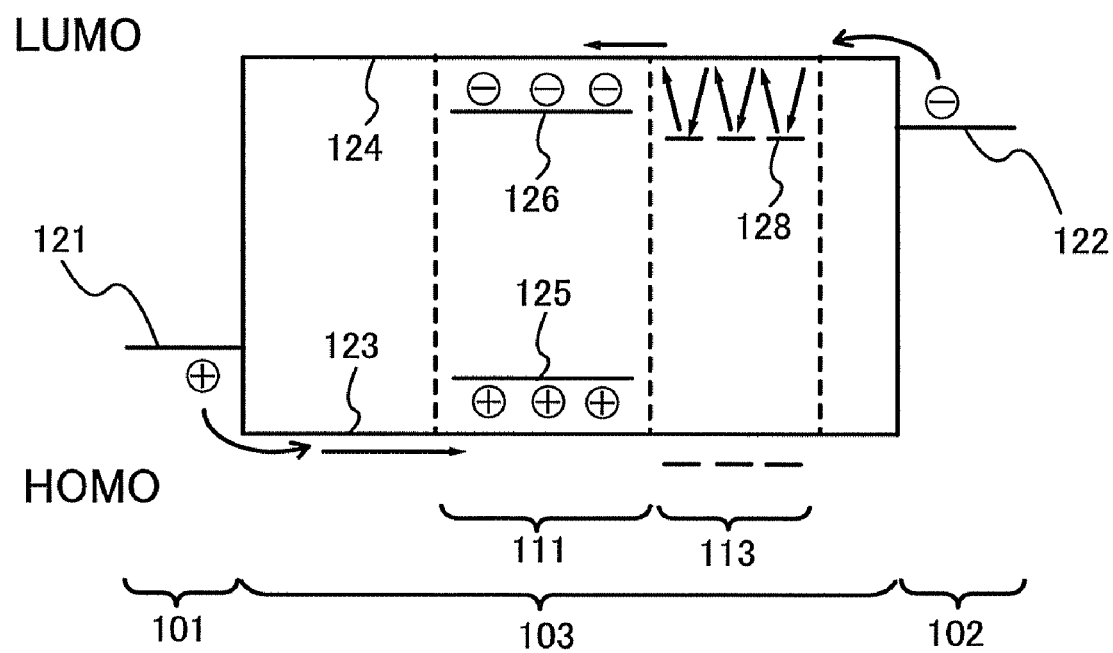

On the other hand, FIGS. 2A and 2B illustrate an example of a light-emitting element of an embodiment of the present invention which includes the organic compound film 103 containing the first organic compound between the anode 101 and the cathode 102. The organic compound film 103 is provided in contact with the anode 101 and with the cathode 102. The organic compound film 103 includes the light-emitting region 111 to which the light-emitting substance is added and an electron-transport region 113 to which the electron-trapping substance is added. The electron-transport region 113 is located between the light-emitting region 111 and the cathode 102. FIG. 2A is a schematic diagram of the element structure, and FIG. 2B is a band diagram thereof.

Note that in FIG. 2B, reference numeral 128 denotes the LUMO level of the electron-trapping substance and the other reference numerals are similar to those in FIGS. 1A and 1B. Here, for efficient trapping of electrons, the LUMO level 128 of the electron-trapping substance is preferably lower than the LUMO level 124 of the first organic compound, more preferably lower by 0.2 eV or more, in particular.

A structure as illustrated in FIGS. 2A and 2B is effective particularly when the first organic compound has a high electron-transport property. In other words, by providing the electron-transport region 113 to which the electron-trapping substance is added between the light-emitting region 111 and the cathode 102, the rate of transport of electrons in the electron-transport region 113 is decreased, and excessive electrons can be prevented from being supplied to the light-emitting region 111. Accordingly, since a phenomenon in which electrons pass through the light-emitting region 111 can be suppressed, the carrier recombination efficiency can be increased.

Figure 3A:
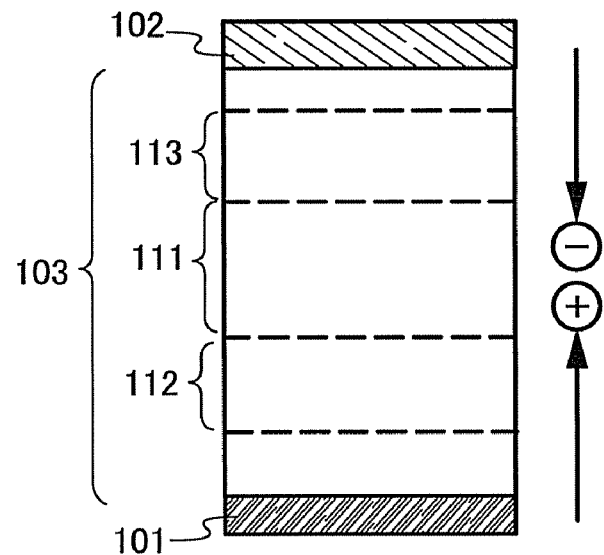
FIGS. 3A and 3B illustrate a light-emitting element according to an embodiment of the present invention.
Figure 3B:
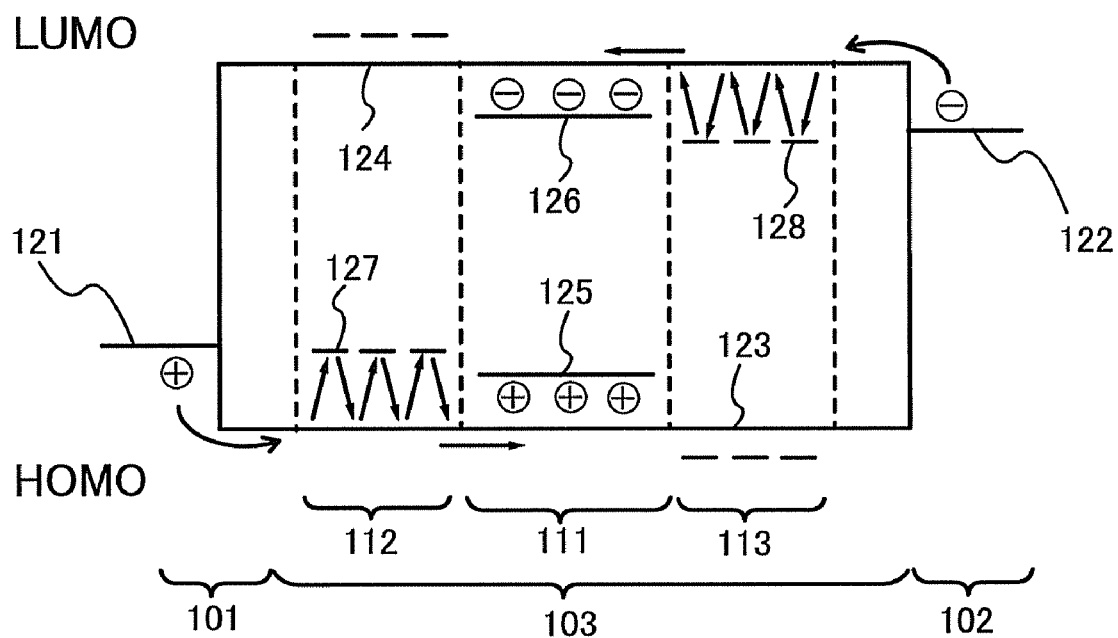

Further, a structure in which the transport of both holes and electrons are controlled, such as an element structure as illustrated in FIGS. 3A and 3B, is more preferable. FIGS. 3A and 3B illustrate an example of a light-emitting element of an embodiment of the present invention which includes the organic compound film 103 containing the first organic compound between the anode 101 and the cathode 102. The organic compound film 103 is provided in contact with the anode 101 and with the cathode 102. The organic compound film 103 includes the light-emitting region 111 to which the light-emitting substance is added, the hole-transport region 112 to which the hole-trapping substance is added, and the electron-transport region 113 to which the electron-trapping substance is added. The hole-transport region 112 is located between the light-emitting region 111 and the anode 101. The electron-transport region 113 is located between the light-emitting region 111 and the cathode 102. FIG. 3A is a schematic diagram of the element structure, and FIG. 3B is a band diagram thereof. In addition, reference numerals in FIGS. 3A and 3B are similar to those in FIGS. 1A and 1B and FIGS. 2A and 2B.

Also in this case, for efficient trapping of holes, the HOMO level 127 of the hole-trapping substance is preferably higher than the HOMO level 123 of the first organic compound, more preferably higher by 0.2 eV or more, in particular. Further, for efficient trapping of electrons, the LUMO level 128 of the electron-trapping substance is preferably lower than the LUMO level 124 of the first organic compound, more preferably lower by 0.2 eV or more, in particular.

With a structure as illustrated in FIGS. 3A and 3B, both the transport of holes and electrons are controlled, and the carrier recombination efficiency can be increased.

Note that in a light-emitting element of the embodiments of the present invention, as illustrated in FIGS. 1A and 1B or FIGS. 3A and 3B, the light-emitting region 111 and the hole-transport region 112 may be in contact with each other or away from each other. Further, the hole-transport region 112 and the anode 101 may be in contact with each other or away from each other. Moreover, plural light-emitting regions 111 and/or plural hole-transport regions 112 may be formed. Furthermore, plural kinds of light-emitting substances and/or plural kinds of hole-trapping substances may be added.

Also, in a light-emitting element of the embodiments of the present invention, as illustrated in FIGS. 2A and 2B or FIGS. 3A and 3B, the light-emitting region 111 and the electron-transport region 113 may be in contact with each other or away from each other. Further, the electron-transport region 113 and the cathode 102 may be in contact with each other or away from each other. Moreover, plural light-emitting regions 111 and/or plural electron-transport regions 113 may be formed. Furthermore, plural kinds of light-emitting substances and/or plural kinds of electron-trapping substances may be added.

Note that the organic compound film including the first organic compound may further include a substance other than the light-emitting substance, the hole-trapping substance, and the electron-trapping substance. Examples of such substances include an additive for inhibiting crystallization of the organic compound film including the first organic compound and an assist dopant for efficient energy transfer from the first organic compound to the light-emitting substance.

In any of the structures in FIGS. 1A and 1B, FIGS. 2A and 2B, and FIGS. 3A and 3B, it is important that the transport of holes and/or electrons is controlled by adding a substance that traps carriers. The control of the transport of holes as illustrated in FIGS. 1A and 1B can be freely and precisely performed by varying parameters such as the energy difference between the HOMO level 127 of the hole-trapping substance and the HOMO level 123 of the first organic compound, the amount of the hole-trapping substance that is added, the thickness of the hole-transport region 112 to which the hole-trapping substance is added, etc. Also, the control of the transport of electrons as illustrated in FIGS. 2A and 2B can be freely and precisely performed by varying parameters such as the energy difference between the LUMO level 128 of the electron-trapping substance and the LUMO level 124 of the first organic compound, the amount of the electron-trapping substance that is added, the thickness of the electron-transport region 113 to which the electron-trapping substance is added, etc.

In other words, in an element structure based on the homo-junction as described in the embodiments of the present invention, the most suitable carrier balance can be readily obtained by determining the material used as the first organic compound which is the main component (base material) of the organic compound film, followed by appropriately adding a carrier-trapping substance with known HOMO or LUMO value. Such a high degree of freedom for the design of a material or an element cannot be realized with a conventional heterojunction.

As described above, a feature of the embodiments of the present invention is that a light-emitting element having high emission efficiency can be readily realized by increasing the carrier recombination efficiency with a simple element structure having a high degree of freedom. This feature is highly advantageous also from the point of view of element lifetime.

First, in a light-emitting element of the embodiment of the present invention, since the first organic compound is the main component (base material) of the entire organic compound film, there is no interface in the organic compound film. Thus, the light-emitting element of the embodiments of the present invention is useful in examining deterioration, since identification of the interface that provides an adverse affect is very difficult in the case of a multilayered heterojunction. That is, in a light-emitting element of the embodiments of the present invention, consideration of a problem (exciplex formation or interdiffusion of materials) caused at an interface between layers is not needed. Accordingly, the development of materials can be carried out focusing on only their isolated properties, which facilitates the establishment of the design strategy for element structure.

Further, since the rate of transport of carriers can be controlled with a component (i.e., carrier-trapping substance) the amount of which is the smallest of those of the components included in a given region, a light-emitting element that does not easily vary in property over time and has longer lifetime can be realized. In other words, the carrier balance is not easily changed as compared with the case where the carrier balance is controlled with a single substance. For example, the carrier balance of a layer containing a single substance can be easily changed by a partial change in morphology, partial crystallization, or the like. However, in a light-emitting element of the embodiment of the present invention, the rate of transport of carriers is controlled with a component (i.e., carrier-trapping substance) the amount of which is the smallest of those of the components included in a given region, and a change in morphology, crystallization, aggregation, or the like is unlikely to be generated in the component (carrier-trapping substance). Accordingly, it is possible to obtain a light-emitting element that does not easily vary over time in carrier balance and has long lifetime, which contributes to a decrease in emission efficiency over time.

Furthermore, a light-emitting element of the embodiment of the present invention is advantageous also from the point of view of fabrication process. At present, most light-emitting elements which are subjected to practical use are manufactured by a dry process such as a vacuum evaporation method. That is because a dry process in which influence of oxygen or water can be easily eliminated is advantageous for an improvement of lifetime.

However, in the fabrication of a light-emitting element having a heterostructure by a dry process, a substrate needs transferring through a number of chambers for forming a plurality of layers, which inflates manufacturing costs (especially, the cost of a manufacturing apparatus). Further, if even one of the layers is defective, then the whole element is defective, which significantly decreases product yield. Furthermore, since it is thought that even in vacuum, residual oxygen, moisture, or the like can be adsorbed between steps of forming the layers (e.g., during transfer of the substrate), caution is necessary to ensure lifetime.

On the other hand, a light-emitting element of the embodiment of the present invention can be fabricated by a dry process just in such a manner that the additives are added by co-evaporation while the first organic compound is evaporated. Accordingly, a manufacturing apparatus can be simplified to obtain advantages of manufacturing costs or yield. Further, because successive formation of the organic compound films can be conducted in vacuum, adsorption of residual oxygen or moisture can be prevented; therefore, the effect of improving the lifetime can be obtained. Note that a co-evaporation method refers to an evaporation method by which evaporation is conducted from a plurality of evaporation sources at the same time in one treatment chamber.

As described above, by applying the embodiments of the present invention, a light-emitting element with a good carrier balance can be fabricated without forming a heterostructure. Thus, a light-emitting element that is easily fabricated and has high emission efficiency can be provided.

Further, by applying the embodiments of the present invention, a light-emitting element in which a variation in carrier balance over time is negligible can be fabricated without forming a heterostructure. Thus, a light-emitting element that is easily fabricated and has long lifetime can be provided.

Next, examples of materials that can be used for a light-emitting element of the embodiment of the present invention will be specifically given below.

First, for the first organic compound, although there is no limitation as long as it can transport carriers, it is difficult to use a substance having an extremely high ionization potential or a substance having an extremely low electron affinity because both holes and electrons should be injected from the electrodes. Therefore, it is preferable that the ionization potential be 6.5 eV or less (i.e., the HOMO be −6.5 eV or more) and that the electron affinity be 2.0 eV or more (i.e., the LUMO be −2.0 eV or less). Further, if the hole-transport capability and the electron-transport capability are at extremely different levels, the carrier balance might be difficult to control even by adding the carrier-trapping substance; therefore, the first organic compound preferably has some degree of hole-transport capability and some degree of electron-transport capability.

Accordingly, the first organic compound is preferably any of condensed aromatic compounds such as naphthalene derivatives, anthracene derivatives, phenanthrene derivatives, pyrene derivatives, tetracene derivatives, chrysene derivatives, and the like. Specifically, there are 9,10-diphenylanthracene (abbreviation: DPAnth), 9,10-bis(3,5-diphenylphenyl)anthracene (DPPA), 9,10-di(2-naphthyl)anthracene (abbreviation: DNA), 2-tert-butyl-9,10-di(2-naphthyl)anthracene (abbreviation: t-BuDNA), 9,9′-bianthryl (abbreviation: BANT), 9,9′-(stilbene-3,3′-diyl)diphenanthrene (abbreviation: DPNS), 9,9′-(stilbene-4,4′-diyl)diphenanthrene (abbreviation: DPNS2), 3,3′,3″-(benzene-1,3,5-triyl) tripyrene (abbreviation: TPB3), 5,12-diphenyltetracene, rubrene, and the like. Further, among condensed aromatic compounds, a condensed aromatic compound having an aromatic amine skeleton or an electron-rich skeleton such as a π-electron-rich heteroaromatic ring (e.g., pyrrole, indole, carbazole, dibenzofuran, or dibenzothiophene) which can easily accept both holes and electrons is particularly preferable. Specifically, there are 4,4′-bis[N-(1-naphthyl)-N-phenylamino]biphenyl (abbreviation: NPB or α-NPD), N,N-diphenyl-9-[4-(10-phenyl-9-anthryl)phenyl]-9H-carbazol-3-amine (abbreviation: CzA1PA), 9-phenyl-9′-[4-(10-phenyl-9-anthryl)phenyl]-3,3′-bi(9H-carbazole) (abbreviation: PCCPA), 4-(10-phenyl-9-anthryl)triphenylamine (abbreviation: DPhPA), 4-(9H-carbazol-9-yl)-4′-(10-phenyl-9-anthryl)triphenylamine (abbreviation: YGAPA), N,9-diphenyl-N-[4-(10-phenyl-9-anthryl)phenyl]-9H-carbazol-3-amine (abbreviation: PCAPA), N,9-diphenyl-N-{4-[4-(10-phenyl-9-anthryl)phenyl]phenyl}-9H-carbazol-3-amine (abbreviation: PCAPBA), N,9-diphenyl-N-(9,10-diphenyl-2-anthryl)-9H-carbazol-3-amine (abbreviation: 2PCAPA), 6,12-dimethoxy-5,1,1-diphenylchrysene, N,N′,N′,N″,N″,N‴,N‴-octaphenyldibenzo[g,p]chrysene-2,7,10,15-tetraamine (abbreviation: DBC1), 9-[4-(10-phenyl-9-anthryl)phenyl]-9H-carbazole (abbreviation: CzPA), 3,6-diphenyl-9-[4-(10-phenyl-9-anthryl)phenyl]-9H-carbazole (abbreviation: DPCzPA), and the like.

Further, in consideration of the property of accepting both holes and electrons, the first organic compound is more preferably a bipolar compound that has both an electron-rich skeleton such as an aromatic amine skeleton or a π-electron-rich heteroaromatic ring (e.g., pyrrole, indole, carbazole, dibenzofuran, or dibenzothiophene) and an electron-deficient skeleton such as a π-electron-deficient heteroaromatic ring (e.g., pyridine, quinoline, quinoxaline, diazole, or polyazole) within a molecule at the same time. Specifically, there are 4,4′-(quinoxaline-2,3-diyl)bis(N,N-diphenylaniline) (abbreviation: TPAQn), N,N′-(quinoxaline-2,3-diyldi-4,1-phenylene)bis(N-phenyl-1,1′-biphenyl-4-amine) (abbreviation: BPAPQ), N,N′-(quinoxaline-2,3-diyldi-4,1-phenylene)bis[bis(1,1′-biphenyl-4-yl)amine] (abbreviation: BBAPQ), 4,4′-(quinoxaline-2,3-diyl)bis{N-[4-(9H-carbazol-9-yl)phenyl]-N-phenylaniline} (abbreviation: YGAPQ), N,N′-(quinoxaline-2,3-diyldi-4,1-phenylene)bis(N,9-diphenyl-9H-carbazol-3-amine) (abbreviation: PCAPQ), 4-(9H-carbazol-9-yl)-4′-(3-phenylquinoxalin-2-yl)triphenylamine (abbreviation: YGA1PQ), N,9-diphenyl-N-[4-(3-phenylquinoxalin-2-yl)phenyl]-9H-carbazol-3-amine (abbreviation: PCA1PQ), N,N,N′-triphenyl-N′-[4-(3-phenylquinoxalin-2-yl)phenyl]-1,4-phenylenediamine (abbreviation: DPA1PQ), 9-[4-(5-phenyl-1,3,4-oxadiazol-2-yl)phenyl]-9H-carbazole (abbreviation: CO11), 4-(9H-carbazol-9-yl)-4′-(5-phenyl-1,3,4-oxadiazol-2-yl)triphenylamine (abbreviation:YGAO11), N,9-diphenyl-N-[4-(5-phenyl-1,3,4-oxadiazol-2-yl)phenyl]-9H-carbazol-3-amine (abbreviation: PCAO11), N,N,N′-triphenyl-N′-[4-(5-phenyl-1,3,4-oxadiazol-2-yl)phenyl]-1,4-phenylenediamine (abbreviation: DPAO11), 4-(9H-carbazol-9-yl)-4′-(4,5-diphenyl-4H-1,2,4-triazol-3-yl)triphenylamine (abbreviation: YGATAZ1), 4-(9H-carbazol-9-yl)-4′-(3,5-diphenyl-4H-1,2,4-triazol-4-yl)triphenylamine (abbreviation: YGATAZ2), and the like.

Further, many metal complexes each have an electron-transport property and at the same time can accept holes. Therefore, for example, any of the following substances can be used for the first organic compound: tris(8-quinolinolato) aluminum(III) (abbreviation: Alq), tris(4-methyl-8-quinolinolato)aluminum(III) (abbreviation: Almq$_3$), bis(10-hydroxybenzo[h]quinolinato)beryllium(II) (abbreviation: BeBq$_2$), bis(8-quinolinolato)zinc(II) (abbreviation: Znq), bis[2-(2-benzoxazolyl)phenolato]zinc(II) (abbreviation: ZnPBO), bis[2-(2-benzothiazolyl)phenolato]zinc(II) (abbreviation: ZnBTZ), and the like.

Note that although the above examples for the first organic compounds are low molecular compounds, any of the following high molecular compounds may be used: poly(9,9-dioctylfluorene-2,7-diyl) (abbreviation: PFO), poly[(9,9-dioctylfluorene-2,7-diyl)-co-(2,5-dimethoxybenzene-1,4-diyl)] (abbreviation: PF-DMOP), poly {(9,9-dioctylfluorene-2,7-diyl)-co-[N,N′-di-(p-n-butylphenyl)-1,4-diaminobenzene]} (abbreviation: TAB-PFH), poly(p-phenylenevinylene) (abbreviation: PPV), poly[(9,9-dihexylfluorene-2,7-diyl)-alt-co-(benzo[2,1,3]thiadiazole-4,7-diyl)] (abbreviation: PFBT), poly[(9,9-dioctyl-2,7-divinylenefluorenylene)-alt-co-(2-methoxy-5-(2-ethylhexyloxy)-1,4-phenylene)], poly[2-methoxy-5-(2′-ethylhexoxy)-1,4-phenylenevinylene] (abbreviation: MEH-PPV), poly(3-butylthiophene-2,5-diyl) (abbreviation: R4-PAT), poly {[9,9-dihexyl-2,7-bis(1-cyanovinylene)fluorenylene]-alt-co-[2,5-bis(N,N′-diphenyl amino)-1,4-phenylene]}, poly {[2-methoxy-5-(2-ethylhexyloxy)-1,4-bis(1-cyanovinylenephenylene)]-alt-co-[2,5-bis(N,N′-diphenylamino)-1,4-phenylene]} (abbreviation: CN-PPV-DPD), and the like.

As the light-emitting substance that is added to the light-emitting region, any of the following various fluorescent compounds can be used, for example: N,N′-bis[4-(9H-carbazol-9-yl)phenyl]-N,N′-diphenylstilbene-4,4′-diamine (abbreviation: YGA2S), 4-(9H-carbazol-9-yl)-4′-(10-phenyl-9-anthryl)triphenylamine (abbreviation: YGAPA), 4-(9H-carbazol-9-yl)-4′-(9,10-diphenyl-2-anthryl)triphenylamine (abbreviation: 2YGAPPA), N,9-diphenyl-N-[4-(10-phenyl- 9-anthryl)phenyl]-9H-carbazol-3-amine (abbreviation: PCAPA), perylene, 2,5,8,11-tetra-tert-butylperylene (abbreviation: TBP), 4-(10-phenyl-9-anthryl)-4'-(9-phenyl-9H-carbazol-3-yl)triphenylamine (abbreviation: PCBAPA), N,N"-(2-tert-butylanthracene-9,10-diyldi-4,1-phenylene)bis[N,N', N'-triphenyl-1,4-phenylenediamine] (abbreviation: DPABPA), N,9-diphenyl-N-[4-(9,10-diphenyl-2-anthryl)phenyl]-9H-carbazol-3-amine (abbreviation: 2PCAPPA), N-[4-(9,10-diphenyl-2-anthryl)phenyl]-N,N',N'-triphenyl 1,4-phenylenediamine (abbreviation: 2DPAPPA), N,N,N',N', N'',N''',N'''-octaphenyldibenzo[g,p]chrysene-2,7,10,15-tetraamine (abbreviation: DBC1), coumarin 30, N-(9,10-diphenyl-2-anthryl)-N,9-diphenyl-9H-carbazol-3-amine (abbreviation: 2PCAPA), N-[9,10-bis(1,1'-biphenyl-2-yl)-2-anthryl]-N,9-diphenyl-9H-carbazol-3-amine (abbreviation: 2PCABPhA), N-(9,10-diphenyl-2-anthryl)-N,N',N'-triphenyl-1,4-phenylenediamine (abbreviation: 2DPAPA), N-[9,10-bis(1,1'-biphenyl-2-yl)-2-anthryl]-N,N',N'-triphenyl-1,4-phenylenediamine (abbreviation: 2DPABPhA), 9,10-bis(1,1'-biphenyl-2-yl)-N-[4-(9H-carbazol-9-yl)phenyl]-N-phenylanthracen-2-amine (abbreviation: 2YGABPhA), N,N,9-triphenylanthracen-9-amine (abbreviation: DPhAPhA), coumarin 545T, N,N'-diphenylquinacridone (abbreviation: DPQd), rubrene, 5,12-bis(1,1'-biphenyl-4-yl)-6,11-diphenyltetracene (abbreviation: BPT), 2-(2-{2-[4-(dimethylamino)phenyl]ethenyl}-6-methyl-4H-pyran-4-ylidene)propanedinitrile (abbreviation: DCM1), 2-{2-methyl-6-[2-(2,3,6,7-tetrahydro-1H,5H-benzo[ij]quinolizin-9-yl)ethenyl]-4H-pyran-4-ylidene}propanedinitrile (abbreviation: DCM2), N,N,N',N'-tetrakis(4-methylphenyl)tetracene-5,11-diamine (abbreviation: p-mPhTD), 7,13-diphenyl-N,N,N',N'-tetrakis(4-methylphenyl)acenaphtho[1,2-a]fluoranthene-3,10-diamine (abbreviation: p-mPhAFD), 2-{2-isopropyl-6-[2-(1,1,7,7-tetramethyl-2,3,6,7-tetrahydro-1H,5H-benzo[ij]quinolizin-9-yl)ethenyl]-4H-pyran-4-ylidene}propanedinitrile (abbreviation: DCJTI), 2-{2-tert-butyl-6-[2-(1,1,7,7-tetramethyl-2,3,6,7-tetrahydro-1H,5H-benzo[ij]quinolizin-9-yl)ethenyl]-4H-pyran-4-ylidene}propanedinitrile (abbreviation: DCJTB), 2-(2,6-bis{2-[4-(dimethylamino)phenyl]ethenyl}-4H-pyran-4-ylidene)propanedinitrile (abbreviation: BisDCM), 2-{2,6-bis [2-(8-methoxy-1,1,7,7-tetramethyl-2,3,6,7-tetrahydro-1H, 5H-benzo[ij]quinolizin-9-yl)ethenyl]-4H-pyran-4-ylidene}propanedinitrile (abbreviation: BisDCJTM), and the like.

Further, as described above, a phosphorescent compound is preferably used as the light-emitting substance that is added to the light-emitting region. That is because a conventional phosphorescent light-emitting element requires a special element structure including a hole-blocking layer or the like, and accordingly a light-emitting element of the embodiments of the present invention is useful for simplification of the phosphorescent light-emitting element.

Furthermore, in order to enable a phosphorescent compound to efficiently emit light with the conventional heterostructure, it is necessary to increase not only the triplet excitation energy of the host material of the light-emitting layer but also the triplet excitation energy of a material of the hole-transport layer and/or electron-transport layer which is/are adjacent to the light-emitting layer (i.e., a material in a layer which is adjacent to the light-emitting layer). This places a significant burden on the development of materials. In contrast, a light-emitting element of the embodiments of the present invention has the advantage of enabling a phosphorescent compound to efficiently emit light just by increasing the triplet excitation energy of the first organic compound. Naturally, also in a light-emitting element of the embodiments of the present invention, the hole-trapping substance and/or the electron-trapping substance is/are added to a region that is adjacent to the light-emitting region. However, these are additives and not directly in contact with the phosphorescent substance added to the light-emitting region. Since energy transfer efficiency is inversely proportional to the sixth power of distance in general, energy is not easily transferred from the phosphorescent substance to the hole-trapping substance or the electron-transporting substance in a device structure of the embodiments of the present invention. Thus, the embodiments of the present invention can sufficiently take advantage of the potential for high emission efficiency of a phosphorescent light-emitting element.

From the above-described reason, in a preferable structure of a light-emitting element of the embodiments of the present invention, the light-emitting substance is a phosphorescent compound. As phosphorescent compounds, specifically, there are bis[2-(4',6'-difluorophenyl)pyridinato-N,$C^{2'}$]iridium(III) tetrakis(1-pyrazolyl)borate (abbreviation: FIr6), bis[2-(4',6'-difluorophenyl)pyridinato-N$C^{2'}$]iridium(III) picolinate (abbreviation: FIrpic), bis[2-(3',5'-bistrifluoromethylphenyl)pyridinato-N,$C^{2'}$]iridium(II) picolinate (abbreviation: Ir($CF_3$ppy)$_2$(pic)), bis[2-(4',6'-difluorophenyl)pyridinato-N,$C^{2'}$]iridium(III) acetylacetonate (abbreviation: FIracac), tris(2-phenylpyridinato-N,$C^{2'}$)iridium(III) (abbreviation: Ir(Ppy)$_3$), bis(2-phenylpyridinato)iridium(III) acetylacetonato (abbreviation: Ir(ppy)$_2$(acac)), bis(benzo[h]quinolinato)iridium(III) acetylacetonate (abbreviation: Ir(bzq)$_2$(acac)), bis(2,4-diphenyl-1,3-oxazolato-N,$C^{2'}$)iridium(II) acetylacetonate (abbreviation: Ir(dpo)$_2$(acac)), bis [2-(4'-perfluorophenylphenyl)pyridinato]iridium(III) acetylacetonate (abbreviation: Ir(p-PF-ph)$_2$(acac)), bis(2-phenylbenzothiazolato-N,$C^{2'}$)iridium(III) acetylacetonate (abbreviation: Ir(bt)$_2$(acac)), bis[2-(2'-benzo[4,5-α]thienyl) pyridinato-N,$C^{3'}$]iridium(III) acetylacetonate (abbreviation: Ir(btp)$_2$(acac)), bis(1-phenylisoquinolinato-N,$C^{2'}$)iridium (III) acetylacetonate (abbreviation: Ir(piq)$_2$(acac)), (acetylacetonato)bis[2,3-bis(4-fluorophenyl)quinoxalinato]iridium (III) (abbreviation: Ir(Fdpq)$_2$(acac)), (acetylacetonato)bis(2, 3,5-triphenylpyrazinato)iridium(III) (abbreviation: Ir(tppr)$_2$ (acac)), 2,3,7,8,12,13,17,18-octaethyl-21H,23H-porphyrin platinum(II) (abbreviation: PtOEP), tris(acetylacetonato)(monophenanthroline)terbium(III) (abbreviation: Tb(acac)$_3$ (Phen)), tris(1,3-diphenyl-1,3-propanedionato)(monophenanthroline)europium(III) (abbreviation: Eu(DBM)$_3$(Phen)), tris[1-(2-thenoyl)-3,3,3-trifluoroacetonato](monophenanthroline)europium(III) (abbreviation: Eu(TTA)$_3$(Phen)), and the like.

Note that when a phosphorescent compound is used as the light-emitting substance, the first organic compound should have high triplet excitation energy. From such a point of view, as the first organic compound, a bipolar compound having a heteroaromatic ring, as described above, is preferable.

Although there is no limitation on the hole-trapping substance that is added to the hole-transport region as long as a hole-trapping property is exhibited with respect to the first organic compound, a substance having a low ionization potential (i.e., a high HOMO level) is preferable. Specifically, there are 4,4',4''-tris[N-(1-naphthyl)-N-phenylamino]triphenylamine (abbreviation: 1'-TNATA), 3-[N-(9-phenylcarbazol-3-yl)-N-phenylamino]-9-phenylcarbazole (abbreviation: PCzPCA1), 4,4',4''-tris(N,N-diphenylamino)triphenylamine (abbreviation: TDATA), 4,4',4''-tris[N-(3-methylphenyl)-N-phenylamino]triphenylamine (abbreviation: MTDATA), 1,3, 5-tris[N-(4-diphenylaminophenyl)-N-phenylamino]benzene (abbreviation: DPA3B), N,N'-bis(4-methylphenyl)-N,N'-diphenyl-p-phenylenediamine (abbreviation: DTDPPA), 4,4'-bis[N-(4-diphenylaminophenyl)-N-phenylamino]biphenyl (abbreviation: DPAB), 4,4'-bis(N-{4-[N'-(3-methylphenyl)-N'-phenylamino]phenyl}-N-phenylamino)biphenyl (abbreviation: DNTPD), and the like.

Although there is no limitation on the electron-trapping substance that is added to the electron-transport region as long as an electron-trapping property is exhibited with respect to the first organic compound, a substance having a high electron affinity (i.e., a low LUMO level) is preferable. Specifically, there are acridone, coumarin 102, coumarin 6H, coumarin 480D, coumarin 30, N,N'-dimethylquinacridone (abbreviation: DMQd), N,N'-diphenylquinacridone (abbreviation: DPQd), 9,18-dihydrobenzo[h]benzo[7,8]quino[2,3-b]acridine-7,16-dione (abbreviation: DMNQd-1), 9,18-dimethyl-9,18-dihydrobenzo[h]benzo[7,8]quino[2,3-b]acridine-7,16-dione (abbreviation: DMNQd-2), coumarin 6, coumarin 545T, coumarin 153, (2-{2-[4-(9H-carbazol-9-yl)phenyl]ethenyl}-6-methyl-4H-pyran-4-ylidene)propanedinitrile (abbreviation: DCMCz), 2-(2-{2-[4-(dimethylamino)phenyl]ethenyl}-6-methyl-4H-pyran-4-ylidene)propanedinitrile (abbreviation: DCM1), 2-{2-methyl-6-[2-(2,3,6,7-tetrahydro-1H,5H-benzo[ij]quinolizin-9-yl)ethenyl]-4H-pyran-4-ylidene}propanedinitrile (abbreviation: DCM2), {2-(1,1-dimethylethyl)-6-[2-(2,3,6,7-tetrahydro-1,1,7,7-tetramethyl-1H,5H-benzo[ij]quinolizin-9-yl)ethenyl]-4H-pyran-4-ylidene}propanedinitrile (abbreviation: DCJTB), Nile Red, 2,3-diphenylquinoxaline (abbreviation: DPQ), 2,3-bis(4-fluorophenyl)quinoxaline (abbreviation: FDPQ), 2,3-bis(4-trifluoromethylphenyl)quinoxaline (abbreviation: $CF_3$-DPQ), 2,3,5,8-tetraphenylquinoxaline (abbreviation: TPQ), 2,3,2',3'-tetraphenyl-6,6'-biquinoxaline (abbreviation: DPQ2), 2,3,2',3'-tetrakis(4-fluorophenyl)-6,6'-biquinoxaline (abbreviation: FDPQ2), and the like.

For the anode, a metal, an alloy, an electrically conductive compound, a mixture thereof, or the like having a high work function (specifically, a work function of 4.0 eV or more is preferable) is preferably used. In specific, there are indium oxide-tin oxide (ITO: indium tin oxide), indium oxide-tin oxide containing silicon or silicon oxide, indium oxide-zinc oxide (IZO), indium oxide containing tungsten oxide and zinc oxide (IWZO), and the like. Such electrically conductive metal oxide films are generally formed by sputtering, but may also be formed by an inkjet method, a spin coating method, or the like by application of a sol-gel method or the like. For example, an indium oxide-zinc oxide (IZO) film can be formed by a sputtering method using a target in which 1 to 20 wt % zinc oxide is added to indium oxide. A film of indium oxide containing tungsten oxide and zinc oxide (IWZO) can be formed by a sputtering method using a target in which 0.5 to 5 wt % tungsten oxide and 0.1 to 1 wt % zinc oxide are added to indium oxide. Besides, there are gold (Au), platinum (Pt), nickel (Ni), tungsten (W), chromium (Cr), molybdenum (Mo), iron (Fe), cobalt (Co), copper (Cu), palladium (Pd), titanium (Ti), nitride of a metal material (e.g., titanium nitride), molybdenum oxide, vanadium oxide, ruthenium oxide, tungsten oxide, manganese oxide, titanium oxide, and the like. Alternatively, a conductive polymer such as poly(3,4-ethylenedioxythiophene)/poly(styrenesulfonic acid) (PEDOT/PSS) or polyaniline/poly(styrenesulfonic acid) (PAni/PSS) may be used.

For the cathode, a metal, an alloy, an electrically conductive compound, a mixture thereof, or the like having a low work function (specifically, a work function of 3.8 eV or less is preferable) can be used. Specific examples of such cathode materials include elements belonging to Group 1 and 2 of the periodic table, that is, alkali metals such as lithium (Li) and cesium (Cs), alkaline earth metals such as magnesium (Mg), calcium (Ca), and strontium (Sr), alloys thereof (e.g., MgAg, AlLi), rare-earth metals such as europium (Eu) and ytterbium (Yb), alloys thereof, and the like. Alternatively, the cathode can be formed using a stack of a thin film of an alkali metal compound, an alkaline earth metal compound, or a rare-earth metal compound (e.g., lithium fluoride (LiF), lithium oxide (LiOx), cesium fluoride (CsF), calcium fluoride ($CaF_2$), or erbium fluoride ($ErF_3$)) and a film of a metal such as aluminum. A film of an alkali metal, an alkaline earth metal, or an alloy including any of these elements can be formed by a vacuum evaporation method. In addition, a film of an alloy including an alkali metal or an alkaline earth metal can be formed by a sputtering method. Further, a metal film formed of silver paste or the like can be formed by an inkjet method.

Note that in a light-emitting element of the embodiment of the present invention, at least one of the anode and the cathode should have a light-transmitting property. The light-transmitting property can be ensured by using an electrode material having a light-transmitting property, such as ITO, or by using a thinned electrode.

By combining materials as described above, a light-emitting element of the embodiments of the present invention can be fabricated. Although light emission from the above-mentioned light-emitting substance can be obtained with a light-emitting element of the embodiments of the present invention, light emission of a variety of colors can be obtained by changing the light-emitting substance. In particular, by using a plurality of light-emitting substances that emit light of different colors as the light-emitting substance, light emission having a broad spectrum or white light emission can be obtained.

With a white light-emitting element, a full color display can be fabricated by providing color filters. A feature of such a technique is simplicity with which a full color display can be fabricated by forming just a white light-emitting element over a substrate. Thus, a light-emitting element of the embodiment of the present invention which can be easily fabricated is applied to a white light-emitting element, which is combined with color filters; accordingly, the effect of reducing costs can be obtained at the same time.

As an element structure of a light-emitting element of the embodiments of the present invention which is capable of light emission from a plurality of light-emitting substances that emit light of different colors, a light-emitting region containing the first organic compound to which all the plurality of light-emitting substances that emit light of different colors are added may be formed, or alternatively, a plurality of light-emitting regions to each of which a light-emitting substance is added may be stacked. For example, when three kinds of substances, A, B, and C, are used as the plurality of light-emitting substances that emit light of different colors, all the three kinds of substances, A, B, and C, may be added to the first organic compound to form one light-emitting region while the concentration is adjusted so that light emissions from all of A, B, and C can be obtained. Alternatively, a light-emitting region containing the first organic compound to which A is added, a light-emitting region containing the first organic compound to which B is added, and a light-emitting region containing the first organic compound to which C is added may be sequentially stacked so that light emissions from all of A, B, and C can be obtained.

The plurality of light-emitting substances that emit light of different colors may be selected from the above-described fluorescent compounds and phosphorescent compounds, as appropriate. For example, by combining PCBAPA which emits blue light and rubrene which emits yellow light, white light emission can be obtained. Also, by combining Ir($CF_3$ ppy)$_2$(pic) which emits blue light and Ir(btp)$_2$(acac) which emits red light, white light emission can be obtained.

In particular, the plurality of light-emitting substances that emit light of different colors preferably include a light-emitting substance that emits red light, a light-emitting substance that emits green light, and a light-emitting substance that emits blue light. The light-emitting substance that emits red light preferably has an emission peak in the range of 580 to 700 nm. The light-emitting substance that emits green light preferably has an emission peak in the range of 500 to 540 nm. The light-emitting substance that emits blue light preferably has an emission peak in the range of 400 to 480 nm. For example, by combining DCJTI which emits red light, 2PCAPA which emits green light, and PCBAPA which emits blue light, white light emission can be obtained.

For an improvement of luminous efficiency, the plurality of light-emitting substances that emit light of different colors preferably include a light-emitting substance that emits red light, a light-emitting substance that emits yellow light, a light-emitting substance that emits green light, and a light-emitting substance that emits blue light. The light-emitting substance that emits yellow light preferably has an emission peak in the range of 550 to 570 nm. For example, a combination of DCJTI which emits red light, rubrene which emits yellow light, 2PCAPA which emits green light, and PCBAPA which emits blue light are possible.

A light-emitting element of the embodiment of the present invention, as described above, can be formed over any of a variety of substrates. For the substrate, for example, glass, quartz, plastic, a metal plate, metal foil, or the like can be used. When light emission of the light-emitting element is extracted from the substrate side, a substrate having a light-transmitting property may be used. Note that for the substrate, any other material may be used as long as the material can serve as a support in the fabrication process of the light-emitting element.

Further, by forming a plurality of such light-emitting elements over a substrate, a passive matrix light-emitting device can be fabricated. Moreover, for example, a thin film transistor (TFT) may be formed over a substrate so that a light-emitting element is fabricated over an electrode that is electrically connected to the TFT. Thus, an active matrix light-emitting device which controls the driving of a light-emitting element by a TFT can be fabricated. Note that there is no limitation on the structure of the TFT. The TFT may be either of staggered type or inverted staggered type. Further, a driver circuit formed over a TFT substrate may be formed using both N-type and P-type TFTs, or using either N-type or P-type TFTs. In addition, there is no limitation on the crystallinity of a semiconductor film used for the TFT. Either an amorphous semiconductor film or a crystalline semiconductor film may be used for the TFT. Further, a single crystalline semiconductor film may be used. The single crystalline semiconductor film can be formed by a Smart Cut method (registered trademark) or the like.

Next, a method of fabricating a light-emitting element of the embodiments of the present invention is described. As the fabrication method, a dry process typified by a vacuum evaporation method as described above is preferable. That is because, in the organic compound film of a light-emitting element of the embodiments of the present invention, the first organic compound is the main component (base material) of the entire light-emitting region, hole-transport region, and electron-transport region, and the like, and a dry process makes it easier to form each region separately. From such a point of view, the first organic compound is preferably a low molecular compound.

However, any of a variety of methods can be employed for forming a light-emitting element of the embodiments of the present invention regardless of a dry process or a wet process. Typical examples of wet processes include, but not limited to, an inkjet method, a spin coating method, and the like.

Embodiment 2

In Embodiment 2, another structure of an embodiment of the present invention which is obtained by development of the basic structure disclosed in Embodiment 1 will be described using FIGS. 4A and 4B and FIG. 5.

Figure 4A:
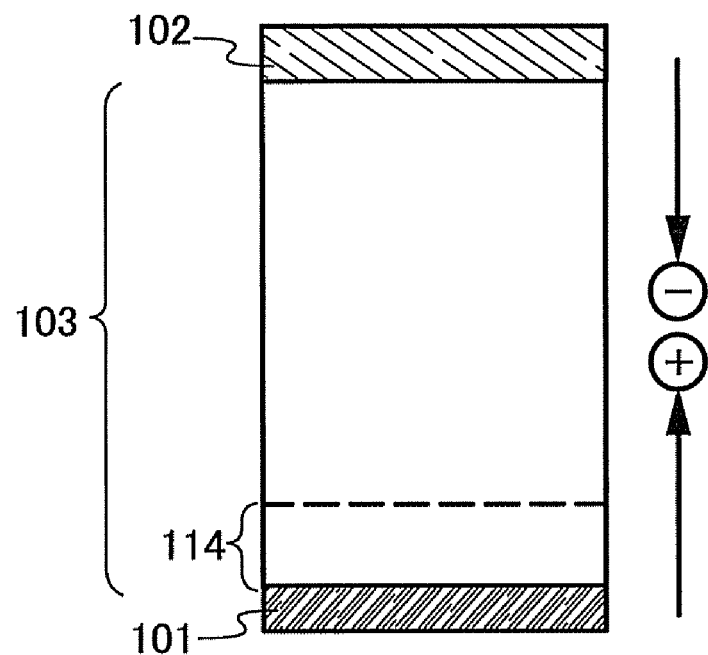
FIGS. 4A and 4B each illustrate a light-emitting element according to an embodiment of the present invention.
Figure 4B:
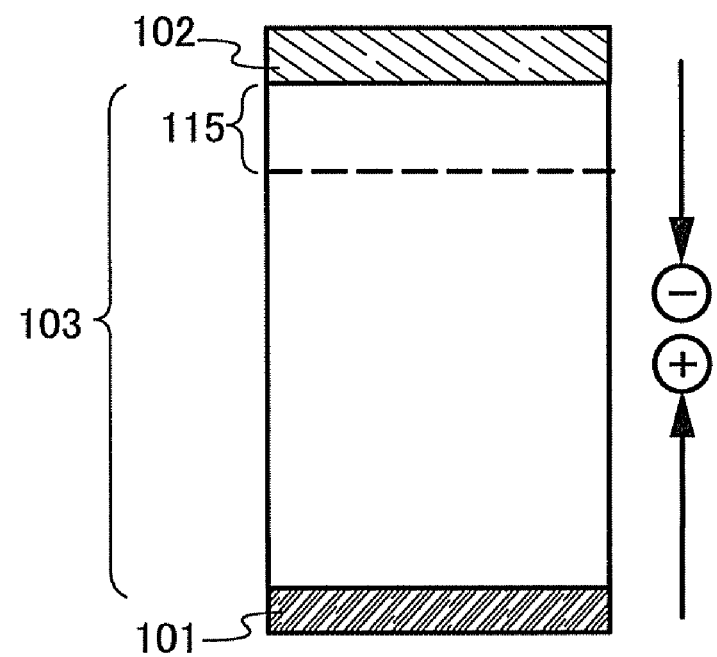
Figure 5:
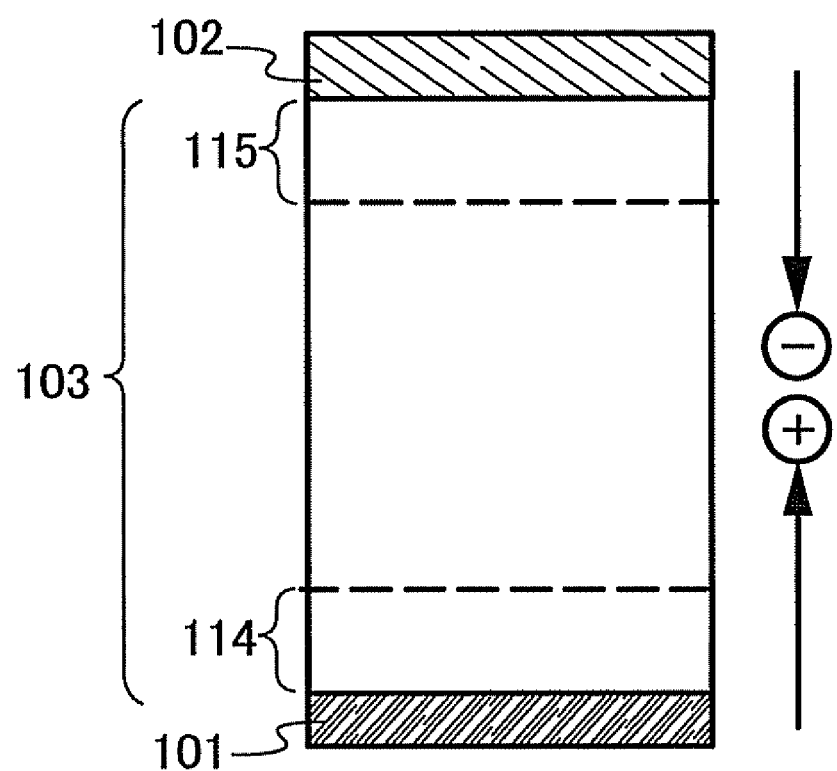
FIG. 5 illustrates a light-emitting element according to an embodiment of the present invention.

FIGS. 4A and 4B and FIG. 5 each illustrate a light-emitting element of an embodiment of the present invention which includes the organic compound film 103 containing the first organic compound between the anode 101 and the cathode 102; the organic compound film 103 is provided in contact with the anode 101 and with the cathode 102. Thus, the organic compound film 103 includes the light-emitting region to which the light-emitting substance is added and further includes the hole-transport region to which the hole-trapping substance is added and/or the electron-transport region to which the electron-trapping substance is added. The structures of these light-emitting region, hole-transport region, and electron-transport region are as disclosed in Embodiment 1.

In the light-emitting element of Embodiment 2, an interface where the electrode and the organic compound film are in contact with each other is more devised than in the light-emitting element disclosed in the Embodiment 1. Hereinafter, this light-emitting element is described using FIGS. 4A and 4B and FIG. 5.

FIG. 4A illustrates a light-emitting element according to the light-emitting element of the embodiment of the present invention which is disclosed in Embodiment 1, wherein a region 114 to which an electron-accepting substance is added (hereinafter, referred to as the hole-inject region 114) is further provided in a region where the organic compound film 103 is in contact with the anode 101. Usually, when the first organic compound contained in the organic compound film 103 has a high ionization potential (a low HOMO level), holes are difficult to inject from the anode 101 to the organic compound film 103. This problem can be, however, solved by providing the hole-inject region 114 as illustrated in FIG. 4A so that a charge-transfer complex is generated in the first organic compound, reducing a barrier of hole injection. Thus, the structure in FIG. 4A is effective when the ionization potential of the first organic compound is high (the HOMO level is low).

On the other hand, FIG. 4B illustrates a light-emitting element according to the light-emitting element of the embodiment of the present invention which is disclosed in Embodiment 1, wherein a region 115 to which an electron-donating substance is added (hereinafter, referred to as the electron-inject region 115) is provided in a region where the organic compound film 103 is in contact with the cathode 102. Usually, when the first organic compound contained in the organic compound film 103 has a low electron affinity (a high LUMO level), electrons are difficult to inject from the cathode 102 to the organic compound film 103. This problem can be, however, solved by providing the electron-inject region 115 as illustrated in FIG. 4B so that a charge-transfer complex is generated in the first organic compound, reducing a barrier of electron injection. Thus, the structure in FIG. 4B is effective when the electron affinity of the first organic compound is low (the LUMO level is high).

An element structure illustrated in FIG. 5 is a further preferable example. FIG. 5 illustrates a light-emitting element according to the light-emitting element of the embodiment of the present invention which is disclosed in Embodiment 1, wherein an electron-accepting substance is added to the region where the organic compound film 103 is in contact with the anode 101 (i.e., the hole-inject region 114 is formed), and an electron-donating substance is added to the region where the organic compound film 103 is in contact with the cathode 102 (i.e., the electron-inject region 115 is formed). According to the above description, the structure in FIG. 5 is effective when the ionization potential of the first organic compound contained in the organic compound film 103 is high (the HOMO level is low) and the electron affinity of the first organic compound is low (the LUMO level is high). That is, an element structure as illustrated in FIG. 5 is very useful when the energy gap of the first organic compound is large.

Thus, the structure in FIG. 5 is said to be useful when light of a color with high energy, such as blue, or white is emitted. Further, since the first organic compound should have a large energy gap when the light-emitting substance is a phosphorescent compound, the element structure in FIG. 5 is useful.

For the element structures illustrated in FIGS. 4A and 4B and FIG. 5, examples of the electron-accepting substance include organic compounds such as 7,7,8,8-tetracyano-2,3,5,6-tetrafluoroquinodimethane (abbreviation: $F_4$-TCNQ) and chloranil and transition metal oxides. Other examples are oxides of metals belonging to Group 4 to Group 8 of the periodic table. Specifically, vanadium oxide, niobium oxide, tantalum oxide, chromium oxide, molybdenum oxide, tungsten oxide, manganese oxide, and rhenium oxide are preferable because of their high electron-accepting properties. Among these, molybdenum oxide is especially preferable because it is stable in air and its hygroscopic property is low so that it can be easily handled.

Further, examples of the electron-donating substance include organic compounds such as tetrathianaphthacene (abbreviation: TTN), nickelocene, and decamethylnickelocene; alkali metals such as lithium (Li) and cesium (Cs), alkaline earth metals such as magnesium (Mg), calcium (Ca), and strontium (Sr), and alloys thereof (e.g., MgAg, AlLi). Alternatively, any of alkali metal compounds (e.g., lithium oxide (LiOx)), alkaline earth metal compounds, or rare metal compounds can be used.

Note that the hole-inject region 114 illustrated in each of FIG. 4A and FIG. 5 can be formed by co-evaporation of the first organic compound and the electron-accepting substance described above. Further, the electron-inject region 115 illustrated in each of FIG. 4B and FIG. 5 can be formed by co-evaporation of the first organic compound and the electron-donating substance described above.

Here, a feature of a structure as illustrated in FIG. 4A or FIG. 5 is that any of a variety of metals, alloys, electrically conductive compounds, mixtures thereof, or the like can be used for the anode 101 regardless of the work functions. The materials for the anode 101 which are given in Embodiment 1 can be used, and alternatively aluminum (Al), silver (Ag), an alloy containing aluminum (e.g., AlSi), or the like can be used, for example. Any of the following materials having a low work function can be used: elements belonging to Group 1 and 2 of the periodic table, that is, alkali metals such as lithium (Li) and cesium (Cs), alkaline earth metals such as magnesium (Mg), calcium (Ca), and strontium (Sr), alloys thereof (e.g., MgAg, AlLi), rare-earth metals such as europium (Eu) and ytterbium (Yb), alloys thereof, and the like. A film of an alkali metal, an alkaline earth metal, or an alloy including any of these elements can be formed by a vacuum evaporation method. In addition, a film of an alloy including an alkali metal or an alkaline earth metal can be formed by a sputtering method. Further, a film formed of silver paste or the like can be formed by an inkjet method.

Further, in a structure as illustrated in FIG. 4B and FIG. 5, for a layer in contact with the cathode 102, any of various conductive materials such as Al, Ag, ITO, and indium oxide-tin oxide containing silicon or silicon oxide, regardless of the work functions can be used. Films of these conductive materials can be formed by a sputtering method, an inkjet method, a spin coating method, or the like.

Note that Embodiment 2 can be combined with any other embodiment as appropriate.

Embodiment 3

In Embodiment 3, another structure of an embodiment of the present invention which is obtained by development of the basic structure disclosed in Embodiment 1 will be described using FIGS. 6A and 6B and FIG. 7.

Figure 6A:
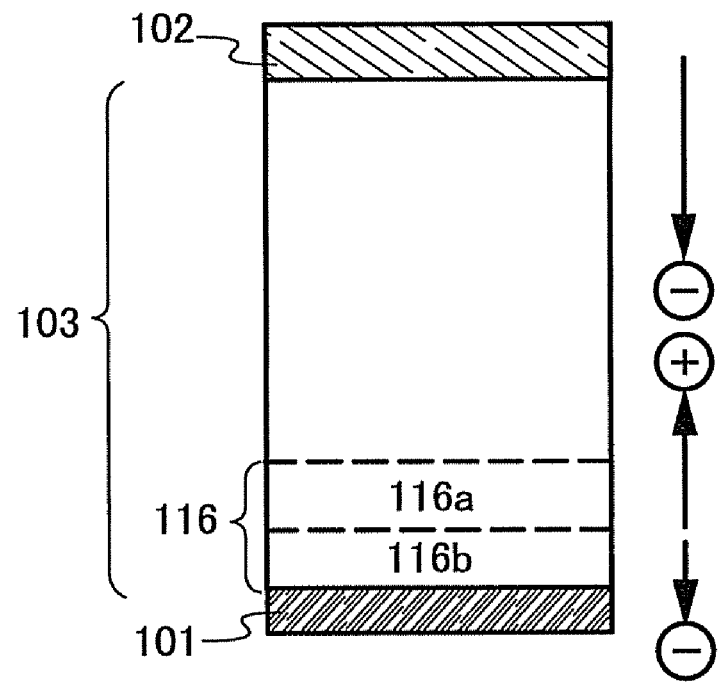
FIGS. 6A and 6B each illustrate a light-emitting element according to an embodiment of the present invention.
Figure 6B:
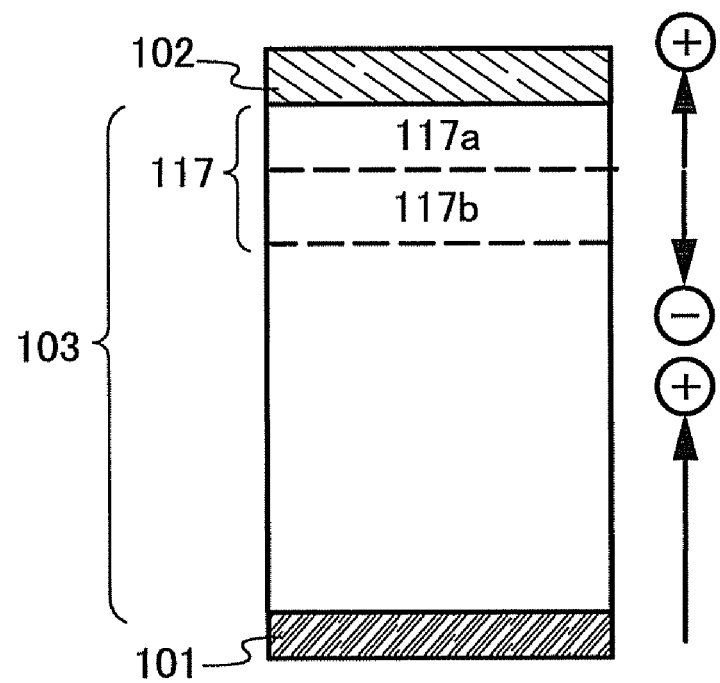
Figure 7:
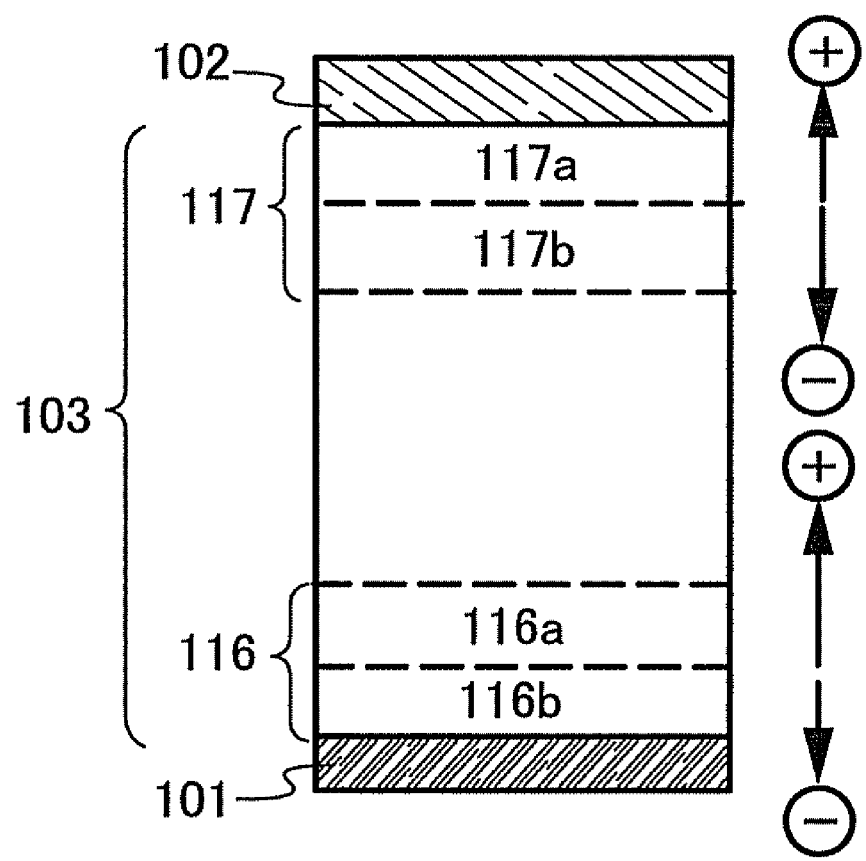
FIG. 7 illustrates a light-emitting element according to an embodiment of the present invention.

FIGS. 6A and 6B and FIG. 7 each illustrate a light-emitting element of an embodiment of the present invention which includes the organic compound film 103 containing the first organic compound between the anode 101 and the cathode 102, wherein the organic compound film 103 is provided in contact with the anode 101 and with the cathode 102. Thus, the organic compound film 103 includes the light-emitting region to which the light-emitting substance is added and further includes a hole-transport region to which a hole-trapping substance is added and/or an electron-transport region to which an electron-trapping substance is added. The structures of these light-emitting region, hole-transport region, and electron-transport region are similar to those disclosed in Embodiment 1.

In the light-emitting element of Embodiment 3, an interface where the electrode and the organic compound film are in contact with each other is more devised than in the light-emitting element disclosed in the Embodiment 1. Hereinafter, this light-emitting element is described using FIGS. 6A and 6B and FIG. 7.

FIG. 6A illustrates a light-emitting element according to the light-emitting element of the embodiment of the present invention which is disclosed in Embodiment 1, wherein a charge generation region 116 is provided in a region where the organic compound film 103 is in contact with the anode 101. The charge generation region 116 includes an N-type region 116b in which the electron-donating substance is added to the first organic compound and a P-type region 116a in which the electron-accepting substance is added to the first organic compound. The N-type region 116b is located between the P-type region 116a and the anode 101.

Usually, when the first organic compound contained in the organic compound film 103 has a high ionization potential (a low HOMO level), holes are difficult to inject from the anode 101 to the organic compound film 103. However, since, with the charge generation region 116 as provided in FIG. 6A, electrons and holes are generated in the charge generation region 116 and are transported toward the anode 101 and the cathode 102, respectively, by application of a voltage, the barrier of hole injection from the anode 101 to the organic compound film 103 can be neglected. Thus, the structure in FIG. 6A is effective when the ionization potential of the first organic compound is high (the HOMO level is low).

On the other hand, FIG. 6B illustrates a light-emitting element according to the light-emitting element of the embodiment of the present invention which is disclosed in Embodiment 1, wherein a charge generation region 117 is provided in the region where the organic compound film 103 is in contact with the cathode 102. The charge generation region 117 includes an N-type region 117b in which the electron-donating substance is added to the first organic compound and a P-type region 117a in which the electron-accepting substance is added to the first organic compound. The P-type region 117a is located between the N-type region 117b and the cathode 102.

Usually, when the first organic compound contained in the organic compound film 103 has a low electron affinity (a high LUMO level), electrons are difficult to inject from the cathode 102 to the organic compound film 103. However, with the charge generation region 117 as provided in FIG. 6B, since electrons and holes are generated in the charge generation region 117 and transferred toward the anode 101 and the cathode 102, respectively, by application of a voltage, the barrier of electron injection from the cathode 102 to the organic compound film 103 can be neglected. Thus, the structure in FIG. 6B is effective when the electron affinity of the first organic compound is low (the LUMO level is high).

An element structure illustrated in FIG. 7 is a further preferable example. FIG. 7 illustrates a light-emitting element according to the light-emitting element of the embodiment of the present invention which is disclosed in Embodiment 1, wherein the first charge generation region 116 is provided in the region where the organic compound film 103 is in contact with the anode 101, and the second charge generation region 117 is provided in the region where the organic compound film 103 is in contact with the cathode 102. According to the above description, the structure in FIG. 7 is effective when the ionization potential of the first organic compound contained in the organic compound film 103 is high (the HOMO level is low) and the electron affinity of the first organic compound is low (the LUMO level is high). That is, an element structure as illustrated in FIG. 7 is very useful when the energy gap of the first organic compound is large.

Thus, the structure in FIG. 7 is useful when light of a color with high energy, such as blue, or white is emitted. Further, since the first organic compound should have a large energy gap when the light-emitting substance is a phosphorescent compound, the element structure in FIG. 7 is useful.

Furthermore, in a structure as illustrated in FIG. 7, charge generation regions having the same structure can be formed in both the region where the organic compound film 103 is in contact with the anode 101 and the region where the organic compound film 103 is in contact with the cathode 102. The first charge generation region 116 supplies holes to the light-emitting region of the light-emitting element, and the second charge generation region 117 supplies electrons to the light-emitting region. When the first charge generation region and the second charge generation have the same structure, the balance of carrier supply does not vary over time. Even if the first charge generation region deteriorates gradually, for example, the second charge generation region also deteriorates to the same degree; thus, the supply balance between holes and electrons for the light-emitting region is not easily lost. Therefore, the structure enables an increase in the lifetime of the element.

Note that the specific structures of the electron-accepting substance, the electron-donating substance, the anode, and the cathode may be similar to those disclosed in Embodiment 2.

Note that Embodiment 3 can be combined with any other embodiment as appropriate.

Embodiment 4

In Embodiment 4, another structure of an embodiment of the present invention which is obtained by development of the basic structure disclosed in Embodiment 1 will be described using FIGS. 8A and 8B.

Figure 8A:
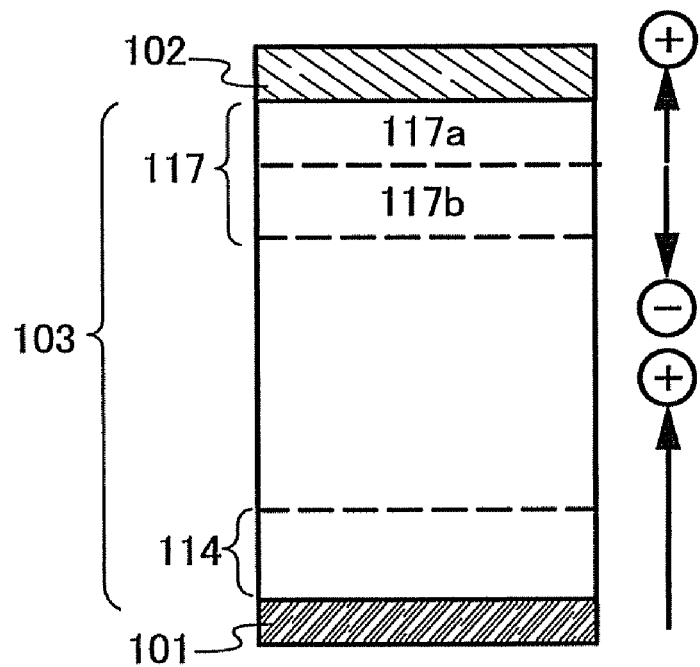
FIGS. 8A and 8B each illustrate a light-emitting element according to an embodiment of the present invention.
Figure 8B:
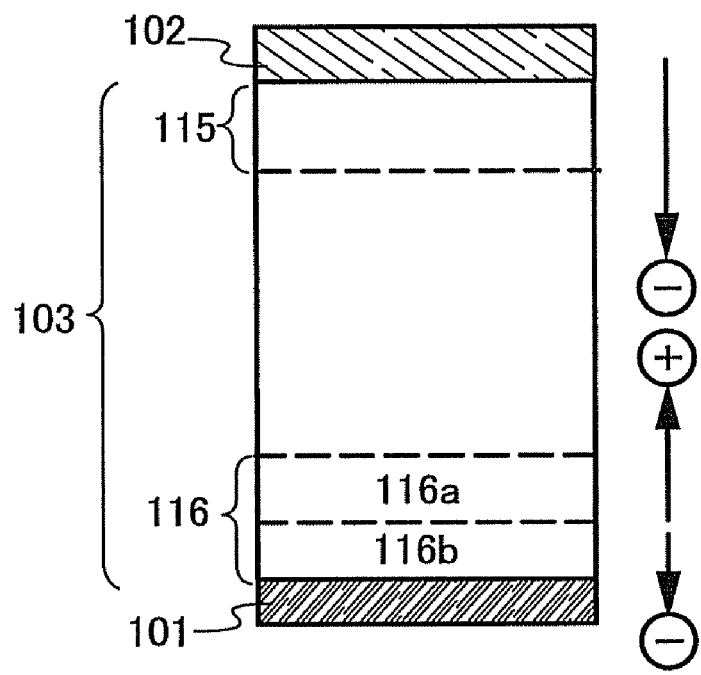

FIGS. 8A and 8B each illustrate a light-emitting element of the embodiment of the present invention which includes the organic compound film 103 containing the first organic compound between the anode 101 and the cathode 102, and the organic compound film 103 is provided in contact with the anode 101 and with the cathode 102. Thus, the organic compound film 103 includes the light-emitting region to which the light-emitting substance is added and further includes the hole-transport region to which the hole-trapping substance is added and/or the electron-transport region to which the electron-trapping substance is added. The structures of these light-emitting region, hole-transport region, and electron-transport region are similar to those disclosed in Embodiment 1.

In the light-emitting element of Embodiment 4, an interface where the electrode and the organic compound film are in contact with each other is more devised than in the light-emitting element disclosed in the Embodiment 1. Hereinafter, this light-emitting element is described using FIGS. 8A and 8B.

FIG. 8A illustrates a light-emitting element according to the light-emitting element of the embodiment of the present invention which is disclosed in Embodiment 1, wherein the hole-inject region 114 to which the electron-accepting substance is added is provided in the region where the organic compound film 103 is in contact with the anode 101, and the charge generation region 117 is provided in the region where the organic compound film 103 is in contact with the cathode 102. The charge generation region 117 includes an N-type region 117b in which the electron-donating substance is added to the first organic compound and a P-type region 117a in which the electron-accepting substance is added to the first organic compound. The P-type region 117a is located between the N-type region 117b and the cathode 102.

The features of the hole-inject region 114 are as described in Embodiment 2. In addition, the features of the charge generation region 117 are as described in Embodiment 3. Accordingly, it is said that a structure as described in FIG. 8A is effective when the ionization potential of the first organic compound contained in the organic compound film 103 is high (the HOMO level is low) and the electron affinity of the first organic compound is low (the LUMO level is high). That is, an element structure as illustrated in FIG. 8A is very effective when the energy gap of the first organic compound is large.

Thus, the structure in FIG. 8A is useful when light of a color with high energy, such as blue, or white is emitted. Further, since the first organic compound should have a large energy gap when the light-emitting substance is a phosphorescent compound, the element structure in FIG. 8A is useful.

On the other hand, FIG. 8B illustrates a light-emitting element according to the light-emitting element of the embodiment of the present invention which is disclosed in Embodiment 1, wherein the charge generation region 116 is provided in the region where the organic compound film 103 is in contact with the anode 101, and the electron-inject region 115 to which the electron-donating substance is added is provided in the region where the organic compound film 103 is in contact with the cathode 102. The charge generation region 116 includes an N-type region 116b in which the electron-donating substance is added to the first organic compound and a P-type region 116a in which the electron-accepting substance is added to the first organic compound. The N-type region 116b is located between the P-type region 116a and the anode 101.

The features of the charge generation region 116 are as described in Embodiment 3. In addition, the features of the electron-inject region 115 are as described in Embodiment 2. Accordingly, it is said that a structure as described in FIG. 8B is effective when the ionization potential of the first organic compound contained in the organic compound film 103 is high (the HOMO level is low) and the electron affinity of the first organic compound is low (the LUMO level is high). That is, an element structure as illustrated in FIG. 8B is very effective when the energy gap of the first organic compound is large.

Thus, the structure in FIG. 8B is useful when light of a color with high energy, such as blue, or white is emitted. Further, since the first organic compound should have a large energy gap when the light-emitting substance is a phosphorescent compound, the element structure in FIG. 8B is useful.

Here, a feature of an element structure as illustrated in each of FIGS. 8A and 8B is that the same structure can be applied to the interface where the organic compound film 103 is in contact with the anode 101 and the interface where the organic compound film 103 is in contact with the cathode 102. In FIG. 8A, for example, the interface where the organic compound film 103 is in contact with the anode 101 is the hole-inject region 114, and the interface where the organic compound film 103 is in contact with the cathode 102 is the P-type region 117a. Both interfaces have the structure in which the electron-accepting substance is added to the first organic compound. Similarly, in FIG. 8B, the interface where the organic compound film 103 is in contact with the anode 101 is the N-type region 116b, and the interface where the organic compound film 103 is in contact with the cathode 102 is the electron-inject region 115. Both interfaces have the structure in which the electron-donating substance is added to the first organic compound.

In other words, both ends (both film surfaces) of the organic compound film 103 can contain the same material. Accordingly, another feature of the element of Embodiment 4 is that stress at the interface between the organic compound film 103 and the anode and stress at the interface between the organic compound film 103 and the cathode can be adjusted to be in the same or substantially the same state. This can increase reliability of the organic compound film.

Note that the specific structures of the electron-accepting substance, the electron-donating substance, the anode, and the cathode may be similar to those disclosed in Embodiment 2.

Note that Embodiment 4 can be combined with any other embodiment as appropriate.

Embodiment 5

In Embodiment 5, a tandem light-emitting element in which a plurality of organic compound films of the embodiment of the present invention as described in Embodiments 1 to 4 are stacked so that emission efficiency and lifetime are further improved will be described with reference to FIG. 9.

Figure 9:
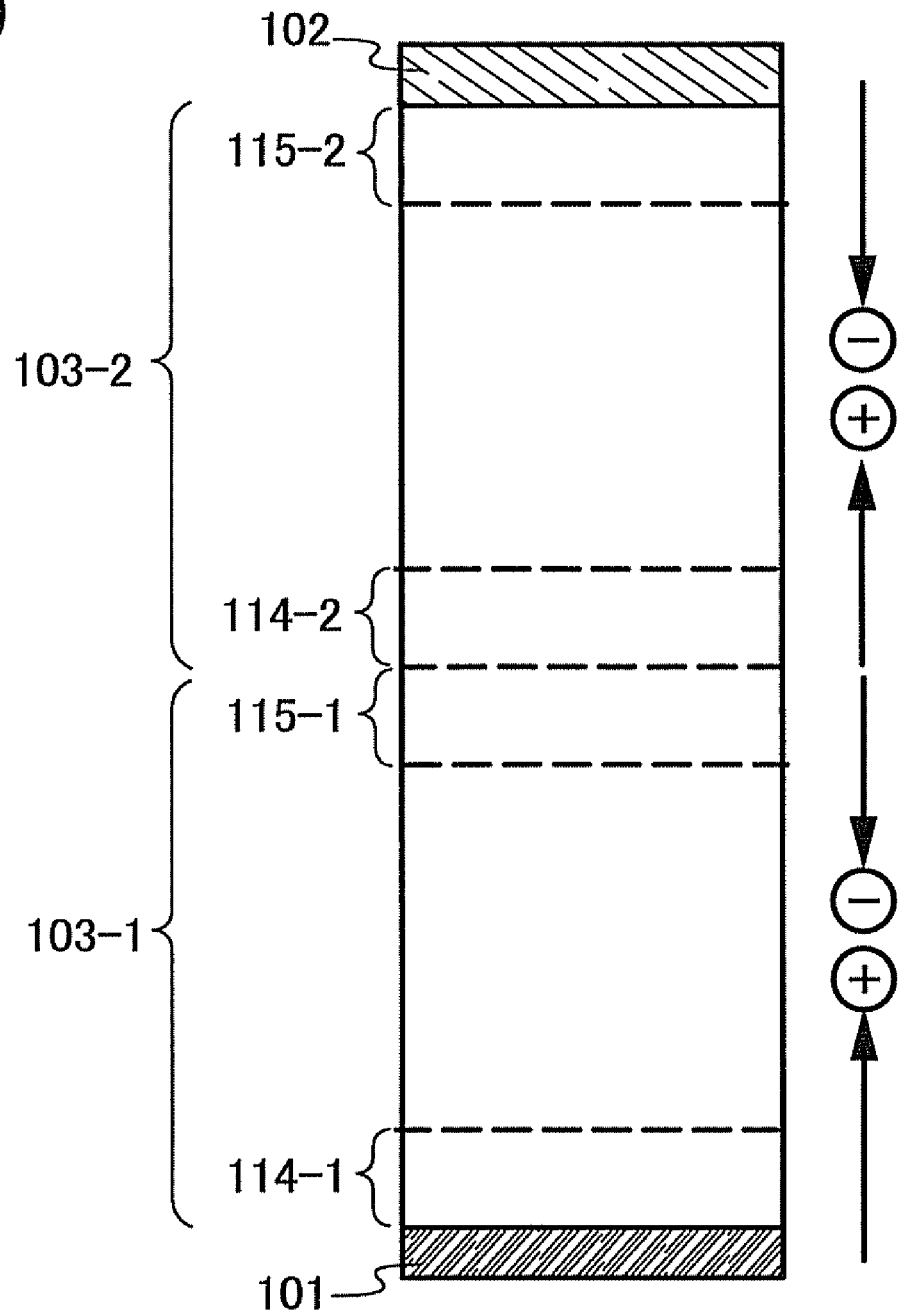
FIG. 9 illustrates a light-emitting element according to an embodiment of the present invention.

FIG. 9 illustrates an example of a light-emitting element of an embodiment of the present invention to which a tandem structure is applied. Between the anode 101 and the cathode 102, two organic compound films as illustrated in FIG. 5 of Embodiment 2 (i.e., a first organic compound film 103-1 and a second organic compound film 103-2) are stacked. As apparent from comparison with FIG. 5, the first organic compound film 103-1 includes a hole-inject region 114-1 to which the electron-accepting substance is added and an electron-inject region 115-1 to which the electron-donating substance is added. Similarly, the second organic compound film 103-2 includes a hole-inject region 114-2 to which the electron-accepting substance is added and an electron-inject region 115-2 to which the electron-donating substance is added. Note that each of the organic compound films 103-1 and 103-2 includes the light-emitting region to which the light-emitting substance is added, and further includes the hole-transport region to which the hole-trapping substance is added and/or the electron-transport region to which the electron-trapping substance is added. The structures of the light-emitting region, the hole-transport region, and the electron-transport region are as described in Embodiment 1.

In the structure in FIG. 9, in a portion where the first organic compound film 103-1 and the second organic compound film 103-2 are in contact with each other, the electron-inject region 115-1 to which the electron-donating substance is added and the hole-inject region 114-2 to which the electron-accepting substance is added are stacked in that order in a direction from the anode 101 toward the cathode 102. This stack structure functions as the charge generation region, as illustrated in FIG. 9. Thus, carriers recombine in both the light-emitting region of the first organic compound film and the light-emitting region of the second organic compound film. In other words, with the same amount of current flowing, a luminance double that of the light-emitting element described in any of Embodiments 1 to 4 can be obtained in principle.

Further, it is important that even such a tandem element can be fabricated very simply by using the structure of the embodiment of the present invention. As illustrated in FIG. 9, since the two organic compound films (103-1 and 103-2) each of which can be formed using the first organic compound as the main component (base material) and stacked, the element can be fabricated just by controlling additives.

Note that although the tandem element having two organic compound films is described in Embodiment 5, a light-emitting element in which three or more organic compound films are stacked can be similarly employed. By applying Embodiment 5, a tandem light-emitting element that is capable of light emission with high luminance while the current density is kept low to have long lifetime can be fabricated simply. Furthermore, a light-emitting device with low power consumption can be realized. Such a feature is advantageous in the application to a lighting apparatus.

Further, it is possible to form the organic compound films so as to emit light of different colors. For example, by forming a light-emitting element as illustrated in FIG. 9 such that the emission color of the first organic compound film 103-1 and the emission color of the second organic compound film 103-2 are complementary to each other, the light-emitting element can provide white light emission. Note that "complementary colors" refer to colors that can produce an achromatic color when mixed. In other words, when light emitted from substances that emit light of complementary colors is mixed, white light emission can be obtained. Further, the same can be applied to a light-emitting element having three organic compound films. For example, the light-emitting element can provide white light emission when the emission color of a first organic compound film is red, the emission color of a second organic compound film is green, and the emission color of a third organic compound film is blue.

Note that Embodiment 5 can be combined with any of the other embodiment modes as appropriate.

Embodiment 6

In Embodiment 6, a light-emitting device having a light-emitting element of the embodiment of the present invention will be described.

Figure 10A:
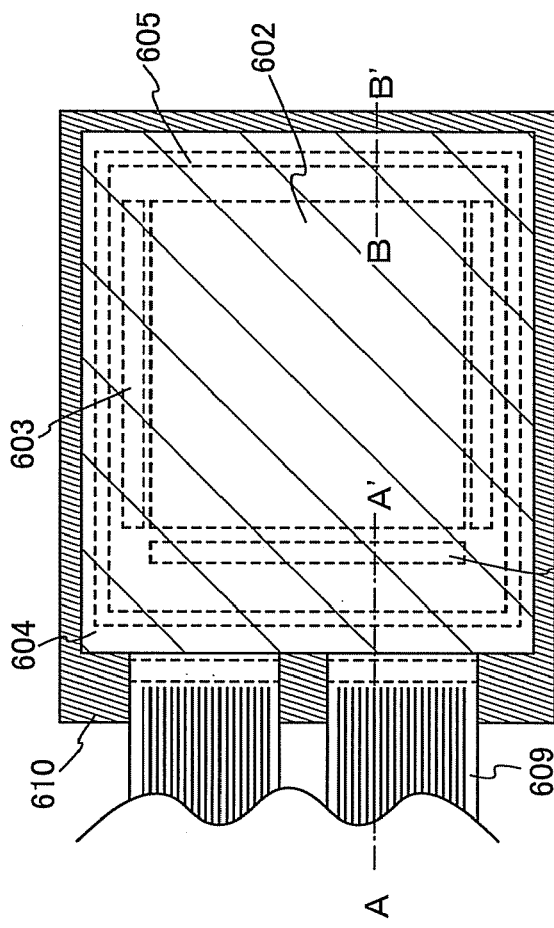
FIGS. 10A and 10B illustrate a light-emitting device according to an embodiment of the present invention.
Figure 10B:
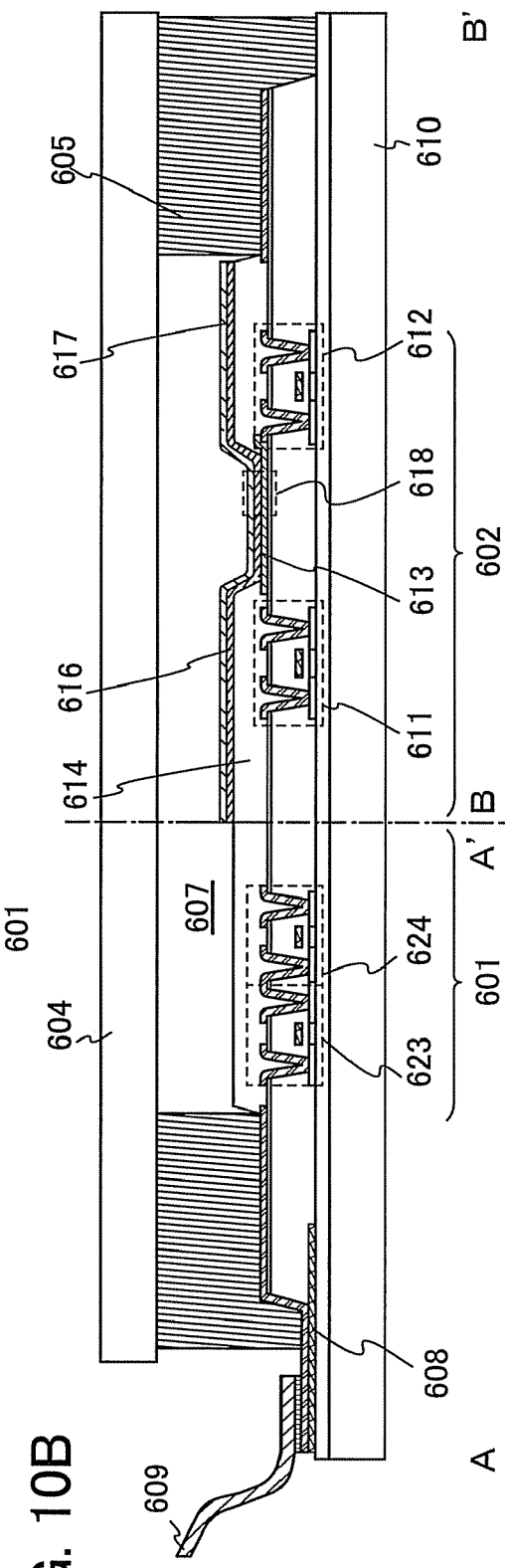

In Embodiment 6, a light-emitting device including a light-emitting element of the embodiments of the present invention in a pixel portion is described with reference to FIGS. 10A and 10B. Note that FIG. 10A is a top view illustrating the light-emitting device and FIG. 10B is a cross-sectional view of FIG. 10A taken along lines A-A' and B-B'. This light-emitting device includes a driver circuit portion (a source side driver circuit) 601, a pixel portion 602, and a driver circuit portion (a gate side driver circuit) 603, which are indicated by dotted lines, in order to control the light emission of the light-emitting element. Further, reference numeral 604 denotes a sealing substrate, reference numeral 605 denotes a sealant, and reference numeral 607 denotes a space surrounded by the sealant 605.

Note that a leading wiring 608 is a wiring for transmitting signals that are input to the source side driver circuit 601 and the gate side driver circuit 603. The leading wiring 608 receives video signals, clock signals, start signals, reset signals, and the like from a flexible printed circuit (FPC) 609 serving as an external input terminal. Note that although only an FPC is illustrated here, this FPC may be provided with a printed wiring board (PWB). The light-emitting device in this specification includes not only a light-emitting device itself but also a light-emitting device to which an FPC or a PWB is attached.

Then, a cross-sectional structure is described using FIG. 10B. The driver circuit portions and the pixel portion are provided over an element substrate 610, but only the source side driver circuit 601 which is the driver circuit portion and one pixel of the pixel portion 602 are illustrated in FIG. 10B.

Note that a CMOS circuit which is a combination of an n-channel TFT 623 and a p-channel TFT 624 is formed in the source side driver circuit 601. However, the driver circuit may be formed using a variety of circuits such as CMOS circuits, PMOS circuits, or NMOS circuits. Furthermore, although a driver-integrated type in which a driver circuit is formed over the substrate provided with the pixel portion is described in Embodiment 6, the embodiment of the present invention is not limited to this type, and the driver circuit can be formed outside the substrate.

The pixel portion 602 includes a plurality of pixels each having a switching TFT 611, a current controlling TFT 612, and a first electrode 613 which is electrically connected to a drain of the current controlling TFT 612. Note that an insulator 614 is formed to cover an end portion of the first electrode 613. Here, a positive photosensitive acrylic resin film is used to form the insulator 614.

In order to improve the coverage, the insulator 614 is provided such that either an upper end portion or a lower end portion of the insulator 614 has a curved surface with a curvature. For example, when positive photosensitive acrylic is used as a material for the insulator 614, it is preferable that only an upper end portion of the insulator 614 have a curved surface with a radius of curvature (0.2 to 3 μm). Alternatively, the insulator 614 can be formed using either a negative type that becomes insoluble in an etchant by light irradiation or a positive type that becomes soluble in an etchant by light irradiation.

Over the first electrode 613, an organic compound film 616 and a second electrode 617 are formed. Here, for a material used for the first electrode 613, any of a variety of metals, alloys, electrically conductive compounds, or mixtures thereof can be used. Among such materials, a metal, an alloy, an electrically conductive compound, a mixture thereof, or the like having a high work function (preferably, a work function of 4.0 eV or more) is preferably used when the first electrode is used as an anode. For example, it is possible to use a single-layer film of an indium oxide-tin oxide film containing silicon, an indium oxide-zinc oxide film, a titanium nitride film, a chromium film, a tungsten film, a Zn film, a Pt film, or the like, or a stack of a titanium nitride film and a film containing aluminum as the main component; or a three-layer structure of a titanium nitride film, a film containing aluminum as the main component, and a titanium nitride film. Note that with a stack structure, the first electrode 613 has low resistance as a wiring, forms a favorable ohmic contact, and can function as an anode.

Further, the organic compound film 616 is formed by various methods such as an evaporation method using an evaporation mask, an inkjet method, a spin coating method, or the like. The organic compound film 616 has any of the structures described in Embodiments 1 to 5. Further, as a material contained in the organic compound film 616, any of low molecular compounds, high molecular compounds, oligomers, or dendrimers may be used. The material used for the organic compound film is not limited to an organic compound and may be an inorganic compound.

As the material used for the second electrode 617, any of a variety of metals, alloys, electrically conductive compounds, mixtures thereof, or the like can be used. Among such materials, a metal, an alloy, an electrically conductive compound, a mixture thereof, or the like having a low work function (preferably, a work function of 3.8 eV or less) is preferably used when the second electrode is used as a cathode. For example, there are elements belonging to Group 1 and Group 2 of the periodic table, that is, alkali metals such as lithium (Li) and cesium (Cs), alkaline earth metals such as magnesium (Mg), calcium (Ca), and strontium (Sr), alloys thereof (e.g., MgAg, AlLi), and the like. Note that when light from the organic compound film 616 is transmitted through the second electrode 617, the second electrode 617 can be formed using a stack of a thin metal film with a small thickness and a transparent conductive film (indium oxide-tin oxide (ITO), indium oxide-tin oxide containing silicon or silicon oxide, indium oxide-zinc oxide (IZO), indium oxide containing tungsten oxide and zinc oxide (IWZO), or the like).

By attaching the sealing substrate 604 and the element substrate 610 to each other with the sealant 605, a light-emitting element 618 is provided in the space 607 surrounded by the element substrate 610, the sealing substrate 604, and the sealant 605. Note that the space 607 may be filled with a filler. There are also the case where the space 607 is filled with an inert gas (such as nitrogen or argon) and the case where the space 607 is filled with the sealant 605.

Note that as the sealant 605, an epoxy-based resin is preferably used. In addition, it is preferable that such a material allows as little moisture or oxygen as possible to permeate. Further, as the sealing substrate 604, a plastic substrate formed using fiberglass-reinforced plastics (FRP), poly(vinyl fluoride) (PVF), polyester, acrylic, or the like can be used instead of a glass substrate or a quartz substrate.

As described above, the light-emitting device including a light-emitting element of the embodiment of the present invention can be obtained.

The light-emitting device of the embodiment of the present invention includes any of the light-emitting elements described in Embodiments 1 to 5. Since these light-emitting elements have high emission efficiency and can be obtained by a simple procedure, a light-emitting device with low power consumption can be readily obtained.

Further, the light-emitting elements described in Embodiments 1 to 5 have long lifetime. Accordingly, a light-emitting device having long lifetime can be obtained.

Figure 11A:
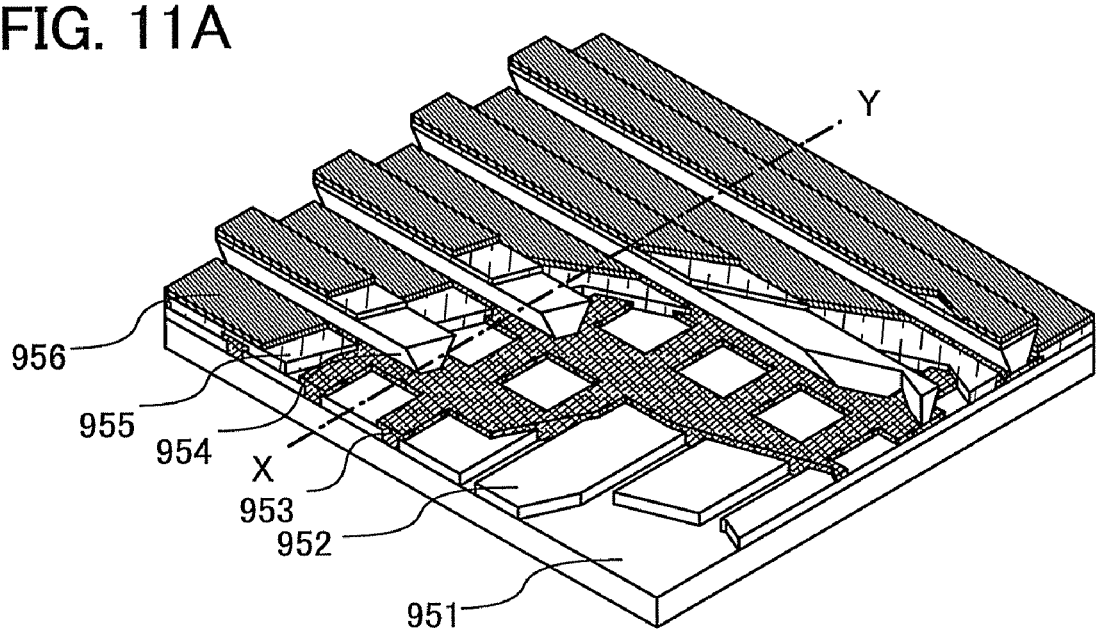
FIGS. 11A and 11B illustrate a light-emitting device according to an embodiment of the present invention.
Figure 11B:
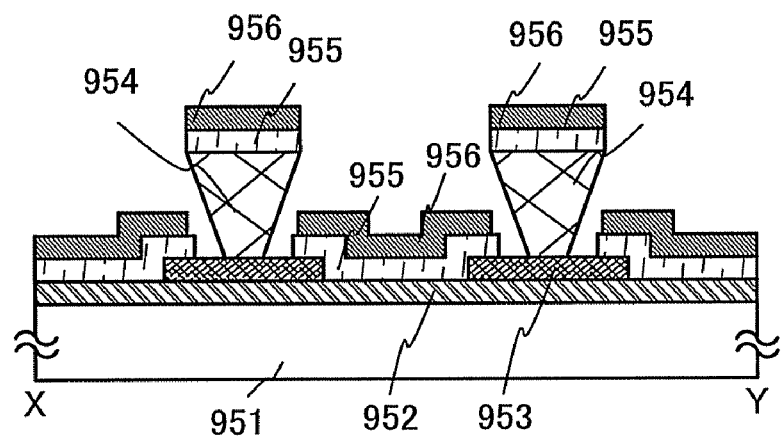

Although an active matrix light-emitting device which controls driving of a light-emitting element with a transistor is described in Embodiment 6, as described above, the light-emitting device of the embodiment of the present invention may be a passive matrix light-emitting device. FIGS. 11A and 11B illustrate a passive matrix light-emitting device fabricated according to the embodiments of the present invention. Note that FIG. 11A is a perspective view of the light-emitting device and FIG. 11B is a cross-sectional view of FIG. 11A taken along a line X-Y. In FIGS. 11A and 11B, an organic compound film 955 is provided between an electrode 952 and an electrode 956 over a substrate 951. An end portion of the electrode 952 is covered with an insulating layer 953. In addition, a partition layer 954 is provided over the insulating layer 953. The sidewalls of the partition layer 954 slope so that the distance between one sidewall and the other sidewall gradually decreases toward the surface of the substrate. In other words, a cross section taken along the direction of the short side of the partition layer 954 is trapezoidal, and the lower side (a side in contact with the insulating layer 953 which is one of a pair of parallel sides of the trapezoidal cross section) is shorter than the upper side (a side not in contact with the insulating layer 953 which is the other of the pair of parallel sides). Providing the partition layer 954 in this manner enables patterning of the cathode. In addition, also with a passive matrix light-emitting device, by including a light-emitting element with high emission efficiency according to the embodiment of the present invention, a light-emitting device with low power consumption and long lifetime can be obtained.

Note that Embodiment 6 can be combined with any of the other embodiment modes as appropriate.

Embodiment 7

Figure 12:
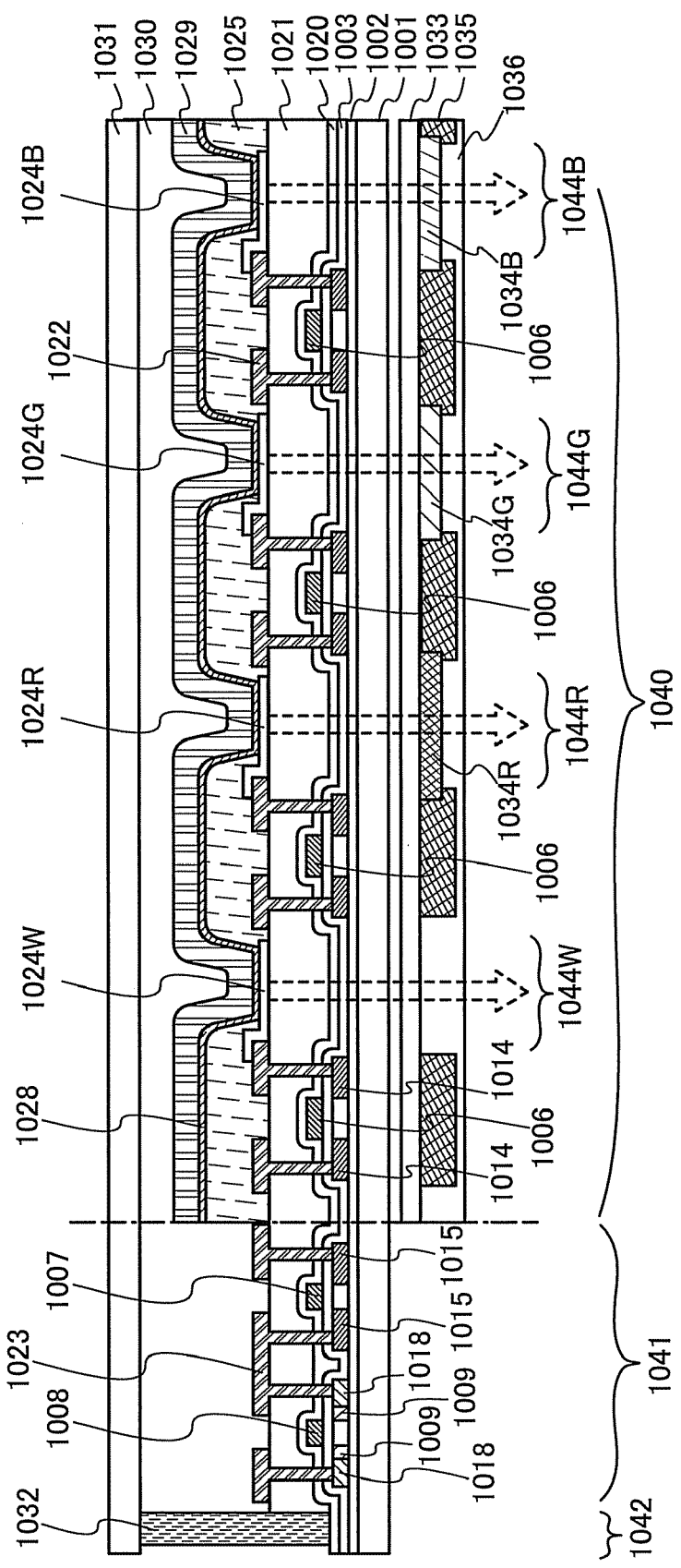
FIG. 12 illustrates a light-emitting device according to an embodiment of the present invention.

Here, an example of a process of fabricating an active matrix display device will be described using FIG. 12.

First, a base insulating film 1002 is formed over a substrate 1001. In order to describe an example in which light emission is extracted using the substrate 1001 side as a display surface, here, a glass substrate or a quartz substrate having a light-transmitting property is used for the substrate 1001. Alternatively, a plastic substrate with a light-transmitting property which has heat resistance to the process temperature may be used.

As the base insulating film 1002, a base film including an insulating film such as a silicon oxide film, a silicon nitride film, or a silicon oxynitride film is formed. Although an example in which a two-layer structure is used for the base film is described here, the base film may have a single-layer structure or a structure in which two or more layers are stacked. Note that the base insulating film is not necessarily formed.

Next, a semiconductor layer is formed over the base insulating film. The semiconductor layer is formed as follows: a semiconductor film having an amorphous structure is formed by a known means (a sputtering method, an LPCVD method, a plasma CVD method, or the like), which may be followed by crystallization by a known crystallization process (a laser crystallization method, a thermal crystallization method, a thermal crystallization method using a catalyst such as nickel, or the like) to obtain a crystalline semiconductor film. The amorphous or crystalline semiconductor film is patterned into a desired shape using a first photomask. This semiconductor layer is formed to a thickness of 25 to 80 nm (preferably, 30 to 70 nm). Although in this Embodiment, crystallization of the semiconductor film is performed, the crystallization is not necessarily conducted. Although there is no limitation on the material of the semiconductor film, silicon or a silicon-germanium (SiGe) alloy is preferably used.

Alternatively, for the crystallization process of the semiconductor film having an amorphous structure, a continuous wave laser may be used. In order to obtain a crystal having a large grain size in the crystallization of the amorphous semiconductor film, it is preferable to use any of second to fourth harmonics of a fundamental wave emitted from a continuous wave solid-state laser. Typically, the second harmonics (532 nm) or the third harmonics (355 nm) of a $Nd:YVO_4$ laser (fundamental wave 1064 nm) may be used. With a continuous wave laser, a laser beam emitted from a continuous wave $YVO_4$ laser whose output is 10 W is converted into a harmonic by a non-linear optical element. Alternatively, there is a method by which a $YVO_4$ crystal and a non-linear optical element are put in a resonator and a harmonic is emitted. Preferably, the laser beam is then shaped into a rectangular or elliptical laser beam on an irradiated surface through an optical system, and is delivered onto an object. The energy density of the laser beam at this time is necessary to range from about 0.01 to 100 $MW/cm^2$ (preferably, 0.1 to 10 $MW/cm^2$). Then, the semiconductor film may be moved at a rate of about 10 to 2000 cm/s relatively to the laser beam during the irradiation.

Alternatively, the laser crystallization may be performed by using a pulsed laser beam with a repetition rate of 0.5 MHz or more which is very much higher than lasers having a repetition rate of several tens to several hundreds of hertz which are generally used. It is said that it takes several tens to several hundreds of nanoseconds to completely solidify a semiconductor film after the semiconductor film is melted by irradiation with a pulsed laser beam. Therefore, by using the pulsed laser having the above-described repetition rate, the semiconductor film can be irradiated with a laser beam before the semiconductor film melted by the previous laser beam is solidified. Accordingly, a solid-liquid interface can be continuously moved in the semiconductor film so that a semiconductor film having crystal grains which have continuously grown in a scanning direction is formed. Specifically, it is possible to form an aggregation of crystal grains each having a width of about 10 to 30 μm in the scanning direction and a width of about 1 to 5 μm in a direction perpendicular to the scanning direction. It is also possible to form a semiconductor film having almost no crystal grain boundaries at least in a channel direction of the thin film transistor by forming a crystal grain of a single crystal that is extended along the scanning direction.

The amorphous semiconductor film may be crystallized by the combination of heat treatment and laser beam irradiation, or one of heat treatment and laser beam irradiation may be performed a plurality of times.

Next, after a resist mask is removed, a gate insulating film 1003 covering the semiconductor layer is formed. The gate insulating film 1003 is formed to a thickness of 1 to 200 nm by a plasma CVD method or a sputtering method.

Next, a conductive film is formed to a thickness of 100 to 600 nm over the gate insulating film 1003. Here, the conductive film is formed using a stack of a titanium nitride film and a tungsten film by a sputtering method. Note that an example in which the conductive film that is a stack of a titanium nitride film and a tungsten film is described here, there is no limitation on this example. The conductive film may be a single layer formed using an element selected from Ta, W, Ti, Mo, Al, and Cu, or an alloy or a compound containing any of these elements as the main component, or a stack of these layers. Alternatively, a semiconductor film typified by a polycrystalline silicon film doped with an impurity element such as phosphorus may be used.

Next, a resist mask is formed using a second photomask. Etching is then conducted by a dry etching method or a wet etching method. Through this etching step, the conductive film is etched to form conductive layers 1006 to 1008. Note that these conductive layers each serve as a gate electrode of a TFT.

Next, after the resist mask is removed, a resist mask is newly formed using a third photomask. In order to form an n-channel TFT of a driver circuit, a first doping step of doping the semiconductor with an impurity element imparting n-type conductivity (typically, phosphorus or As) at low concentration is performed. A region serving as a p-channel TFT and a vicinity of the conductive layer are covered with the resist mask. This first doping step is conducted through the gate insulating film 1003 to form low concentration-impurity regions 1009. Although one individual light-emitting element is driven with a plurality of TFTs, the above doping step is not necessarily conducted when the light-emitting element is driven just with a p-channel TFT or when a pixel and a driver circuit are not formed over the same substrate.

Next, after the resist mask is removed, a resist mask is newly formed using a fourth photomask. A second doping step of doping the semiconductor with an impurity element imparting p-type conductivity (typically, boron) at high concentration is performed. This second doping step is conducted through the gate insulating film 1003 to form p-type high concentration-impurity regions 1014 and 1015.

Next, a resist mask is newly formed using a fifth photomask. In order to form an n-channel TFT of a driver circuit, a third doping step of doping the semiconductor with an impurity element imparting n-type conductivity (typically, phosphorus or As) at high concentration is performed. Conditions of an ion doping method in the third doping step are that the dose is $1\times10^{13}$ to $5\times10^{15}/cm^2$ and the acceleration voltage is 60 to 100 keV. The region serving as a p-channel TFT and the vicinity of the conductive layer are covered with the resist mask. This third doping step is conducted through the gate insulating film 1003 to form n-type high concentration impurity regions 1018.

After that, the resist mask is removed, and a first interlayer insulating film 1020 including hydrogen is formed. Then, the impurity elements added to the semiconductor layer are activated and hydrogenated. As the first interlayer insulating film 1020 including hydrogen, a silicon nitride oxide film (a SiNO film) obtained by a PCVD method is used. In addition, when the semiconductor film is crystallized using a metal element that promotes crystallization, such as nickel, gettering for reducing nickel concentration in a channel formation region can be performed at the same time as the activation.

Next, a second interlayer insulating film 1021 for planarization is formed to obtain a flat surface over the TFTs. As the second interlayer insulating film 1021, an insulating film in which a skeleton structure is composed of a bond of silicon (Si) and oxygen (O) which is obtained by a coating method is used. Alternatively, as the second interlayer insulating film 1021, an organic resin film having a light-transmitting property can be used. Further alternatively, as the second interlayer insulating film, an insulating film including an organic material, an inorganic material, or the like may be used.

Next, the second interlayer insulating film 1021 is etched using a sixth mask to form contact holes. At the same time, the second interlayer insulating film 1021 in a peripheral portion 1042 is removed.

Next, by etching successively using the sixth mask as a mask, the gate insulating film 1003 and the first interlayer insulating film 1020 which are exposed are removed.

Next, the sixth mask is removed, and then a conductive film having a three-layer structure which is in contact with the semiconductor layer in the contact holes is formed. Note that it is preferable to form these three layers successively in the same sputtering apparatus so that a surface of each layer is not oxidized. However, the conductive film may have two layers or a single layer without limitation to the three-layer structure, and may be formed using an element selected from Ta, W, Ti, Mo, Al, and Cu, or an alloy material or a compound material including any of these elements as the main component.

Then, the conductive film is etched using a seventh mask to form a wiring or an electrode. As the wiring or electrode, a connection electrode 1022 in a pixel portion 1040 which connects a TFT and an anode of the light-emitting element is illustrated, and a connection electrode 1023 in a driver circuit portion 1041 which electrically connects an n-channel TFT and a p-channel TFT is illustrated.

Next, a transparent conductive film is formed in contact with the above wiring or electrode having the three-layer structure. Then, the transparent conductive film is etched using an eighth mask to form first electrodes 1024W, 1024R, 1024G, and 1024B of the light-emitting elements, i.e., anodes (or cathodes) of organic light-emitting elements or inorganic light-emitting elements.

As the material of the anode of the light-emitting element, which is detailed in Embodiments 1 and 2, ITO (indium tin oxide) or ITSO (indium tin oxide containing silicon oxide obtained using a target in which 2 to 10 wt % silicon oxide is added to ITO by a sputtering method) is used. As an alternative to ITSO, a transparent conductive film such as a light-transmitting conductive oxide film (IZO) containing silicon oxide in which 2 to 20 wt % zinc oxide (ZnO) is mixed into indium oxide may be used. Alternatively, a transparent conductive film of antimony tin oxide (ATO) may be used.

Note that when ITO is used for the first electrodes 1024W, 1024R, 1024G, and 1024B, baking for crystallization is performed to lower electric resistivity. Unlike ITO, in contrast, ITSO and IZO are not crystallized and remain in the amorphous state even after baking is performed.

Next, using the eighth mask, an insulator 1025 (referred to as a bank, a partition, a barrier, an embankment, or the like) covering edge portions of the first electrodes 1024W, 1024R, 1024G, and 1024B are formed. For the insulator 1025, a tantalum oxide film or a titanium oxide ($TiO_2$) film obtained by a sputtering method, or an organic resin film obtained by a coating method, with a thickness in the range of 0.8 to 1 μm, is used.

Next, an organic compound film 1028 is formed over the first electrodes 1024W, 1024R, 1024G, and 1024B and the insulator 1025. Although the organic compound film 1028 can be formed as a structure and by a method as described in Embodiments 1 to 5, the structure for white light emission is employed in Embodiment 7 (see Embodiment 1 or Embodiment 5). Note that in order to improve reliability of the light-emitting element, vacuum heating is preferably performed for deaeration before the organic compound film 1028 is formed. For example, before an organic compound material is evaporated, heat treatment at 200 to 300° C. is preferably performed in a reduced pressure atmosphere or an inert atmosphere in order to remove a gas contained in the substrate.

Next, a second electrode 1029 of the light-emitting elements is formed over the entire surface of the pixel portion 1040. The second electrode 1029 serves as a cathode. As the material that can be used for the cathode of the light-emitting element, which is detailed in Embodiments 1 and 2, here, a 200-nm-thick aluminum film is formed as the second electrode 1029 by a vacuum evaporation method. In Embodiment 7, in order to extract light emission from the substrate 1001 side, the first electrodes 1024 which are the anodes of the light-emitting elements are transparent electrodes. Of the pair of electrodes of the light-emitting element, when the electrode on the TFT side serves as the cathode, the TFT that is directly connected to the light-emitting element is formed as an n-channel TFT.

Next, a sealing substrate 1031 is used for sealing. As a material of the sealing substrate 1031, a metal material, a ceramic material, a glass substrate, or the like can be used. The sealing substrate 1031 is attached with a sealant 1032 at the peripheral portion 1042 of the substrate 1001. Note that a spacer material or a filler may be used to keep a constant gap between the substrates. Further, a gap 1030 between the pair of substrates is preferably filled with an inert gas.

Further, for full color display, color layers (a red color layer 1034R, a green color layer 1034G, and a blue color layer 1034B) are provided on a transparent base material 1033 so as to overlap with light paths for extracting light emission from the light-emitting elements to the outside of the light-emitting device. Further, a black layer (black matrix) 1035 may be provided. The transparent base material 1033 provided with the color layers and the black layer are aligned and fixed to the substrate 1001. Note that the color layers and the black layer are covered with an overcoat layer 1036. Further, the active matrix display device in Embodiment 7 has a light-emitting layer light from which is extracted out without being transmitted through any color layer and light-emitting layers light from which is transmitted through the color layers and extracted out. Light that is not transmitted through any color layer is white light 1044W, and light that is transmitted through the color layers become red light 1044R, blue light 1044B, and green light 1044G. Accordingly, an image can be expressed with pixels of four colors.

Figure 13:
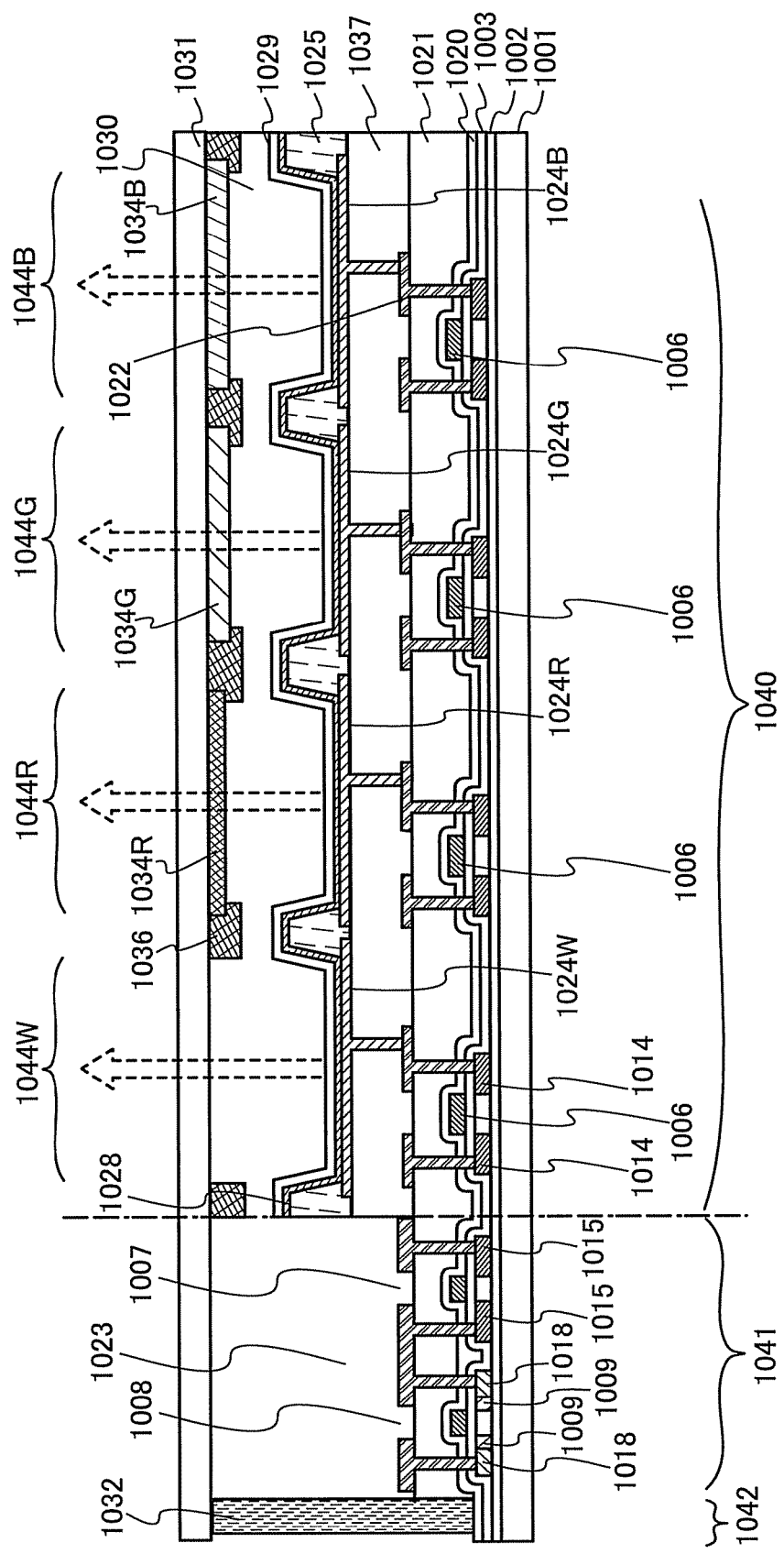
FIG. 13 illustrates a light-emitting device according to an embodiment of the present invention.

The above-described light-emitting device is a light-emitting device having a structure in which light is extracted from the substrate 1001 side where the TFTs are formed (a bottom emission structure), but may be a light-emitting device having a structure in which light is extracted from the sealing substrate 1031 side (a top emission structure). FIG. 13 is a cross-sectional view illustrating a light-emitting device of a top emission structure. In this case, as the substrate 1001, a substrate that does not transmit light can be used. The process up to the step of forming of the connection electrode 1022 which connects the TFT and the anode of the light-emitting element is performed in a manner similar to that of the light-emitting device of a bottom emission structure. Then, a third interlayer insulating film 1037 is formed to cover the connection electrode 1022. This insulating film may function for planarization. The third interlayer insulating film 1037 can be formed using a material similar to that of the second interlayer insulating film, and can alternatively be formed using any other known material.

Next, the first electrodes 1024W, 1024R, 1024G, and 1024B of the light-emitting elements are formed. The first electrodes 1024W, 1024R, 1024G, and 1024B each serve as an anode here, but may serve as a cathode. Further, in the case of a light-emitting device of a top emission structure, the first electrodes are preferably reflective electrodes.

Then, the organic compound film 1028 is formed to cover exposed parts of the first electrodes 1024W, 1024R, 1024G, and 1024B and the third interlayer insulating film. Although the organic compound film 1028 is formed as a structure as described in Embodiments 1 to 5, the structure for white light emission is employed in Embodiment 7 (see Embodiment 1 or Embodiment 5). Next, the second electrode 1029 of the light-emitting elements is formed so as to transmit light from the light-emitting elements.

Then, sealing is performed with the sealing substrate 1031 provided with the color layers (the red color layer 1034R, the green color layer 1034G, and the blue color layer 1034B) in the light path through which light from the light-emitting elements is extracted out; thus, the light-emitting device of a top emission structure can be fabricated. The black layer (black matrix) 1035 may be provided on the sealing substrate 1031 so as to be located between the pixels. The color layers (the red color layer 1034R, the green color layer 1034G, and the blue color layer 1034B) and the black layer (black matrix) 1035 may be covered with the overcoat layer 1036 (not shown). Note that as the sealing substrate 1031, a substrate having a light-transmitting property is used.

By application of a voltage between the pair of electrodes of the thus obtained light-emitting elements, a white light-emitting region 1044W can be obtained. Further, by using the color layers in combination, a red light-emitting region 1044R, a blue light-emitting region 1044B, and a green light-emitting region 1044G can be obtained. Since the white light-emitting element is used in Embodiment 7, there is no necessity to form light-emitting elements of different colors corresponding to emission colors of the pixels; accordingly, a full color light-emitting device can be simply obtained at low costs.

Although a top gate TFT having polysilicon as an active layer is used here, there is no limitation on the TFT as long as it can serve as a switching element, and a bottom gate (inverted staggered) TFT or a staggered TFT can be used. Alternatively, a TFT having an amorphous silicon film or a ZnO film as an active layer may be used. Further, the embodiment of the present invention is not limited to a TFT having a single gate structure or a double gate structure, and a multi-gate TFT having three or more channel formation regions may be employed.

Furthermore, although an example in which full-color display is performed by driving with four colors of red, green, blue, and white is described here, there is no limitation thereto. Full color display may be performed by driving with three colors of red, green, and blue.

Note that Embodiment 7 can be combined with any other embodiment mode as appropriate.

Embodiment 8

In Embodiment 8, electronic devices of an embodiment of the present invention, which includes the light-emitting device described in Embodiment 6 will be described. Electronic devices of the embodiment of the present invention each include a display portion that includes any of the light-emitting elements described in Embodiments 1 to 5 and has low power consumption and long lifetime.

As examples of the electronic devices manufactured using the light-emitting device of the embodiment of the present invention, there are cameras such as video cameras and digital cameras, goggle type displays, navigation systems, audio replay devices (e.g., car audio systems and audio systems), computers, game machines, portable information terminals (e.g., mobile computers, cellular phones, portable game machines, and electronic book readers), image replay devices in which a recording medium is provided (specifically, devices that are capable of replaying recording media such as digital versatile discs (DVDs) and equipped with a display device that can display an image), and the like. Specific examples of these electronic devices are illustrated in FIGS. 14A to 14D.

Figure 14A:
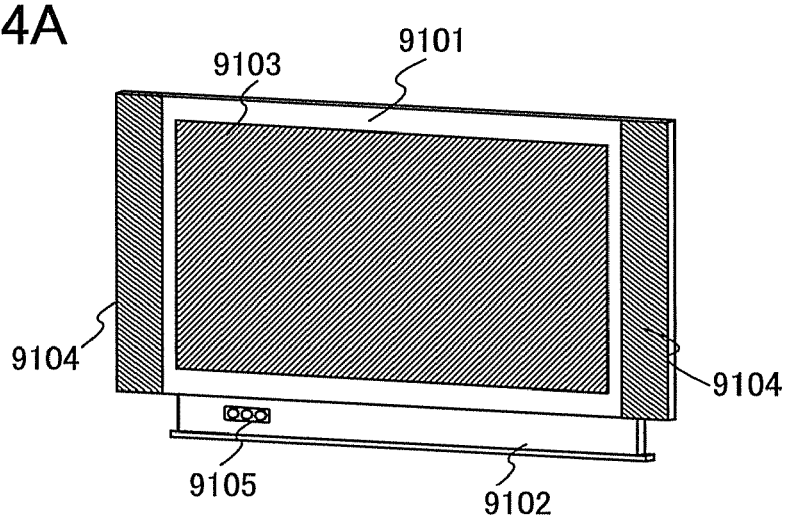
FIGS. 14A to 14D illustrate electronic devices according to an embodiment of the present invention.

FIG. 14A illustrates a television set of Embodiment 8, which includes a housing 9101, a supporting base 9102, a display portion 9103, speaker portions 9104, a video input terminal 9105, and the like. In the display portion 9103 of this television set, light-emitting elements similar to those described in Embodiments 1 to 5 are arranged in matrix. The features of the light-emitting elements are high emission efficiency, low power consumption, and long lifetime. The display portion 9103 including the light-emitting elements also has features similar to those of the light-emitting elements. Accordingly, in this television set, the amount of image display deterioration is small, and power consumption is reduced. With such features, functional circuitry for deterioration compensation or power supply circuits in the television set can be greatly reduced or downsized; accordingly, a reduction in the size and weight of the housing 9101 and the supporting base 9102 can be achieved. In the television set of Embodiment 8, low power consumption, high image quality, and the reduction in size and weight are achieved; thus, a product that is suitable for living environment can be provided.

Figure 14B:
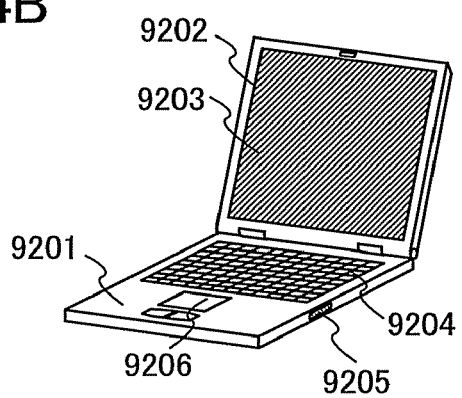

FIG. 14B illustrates a computer of Embodiment 8, which includes a main body 9201, a housing 9202, a display portion 9203, a keyboard 9204, an external connection port 9205, a pointing device 9206, and the like. In the display portion 9203 of this computer, light-emitting elements similar to those described in Embodiments 1 to 5 are arranged in matrix. The features of the light-emitting element are high emission efficiency, low power consumption, and long lifetime. The display portion 9203 including the light-emitting elements also has features similar to those of the light-emitting elements. Accordingly, in this computer, the amount of image display deterioration is small, and power consumption is reduced. With such features, functional circuitry for deterioration compensation or power supply circuits in the computer can be greatly reduced or downsized; accordingly, a reduction in the size and weight of the main body 9201 and the housing 9202 can be achieved. In the computer of Embodiment 8, low power consumption, high image quality, and the reduction in size and weight are achieved; thus, a product that is suitable for environment can be provided.

Figure 14C:
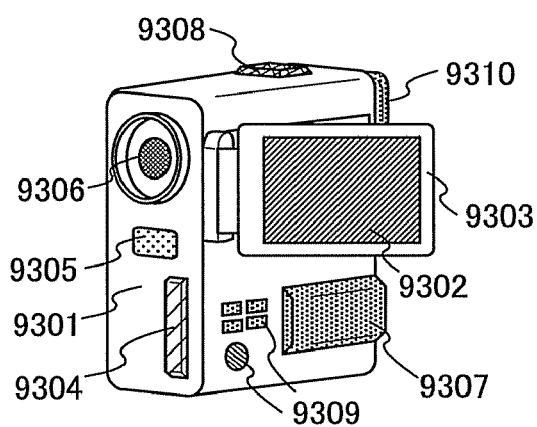

FIG. 14C illustrates a camera of Embodiment 8, which includes a main body 9301, a display portion 9302, a housing 9303, an external connection port 9304, a remote control receiving portion 9305, an image receiving portion 9306, a battery 9307, an audio input portion 9308, operation keys 9309, an eyepiece portion 9310, and the like. In the display portion 9302 of this camera, light-emitting elements similar to those described in Embodiments 1 to 5 are arranged in matrix. The feature of the light-emitting elements is long lifetime. The display portion 9302 including the light-emitting elements also has features similar to those of the light-emitting elements. Accordingly, in this camera, the amount of image display deterioration is small, and power consumption is reduced. With such features, functional circuitry for deterioration compensation or power supply circuits in the camera can be greatly reduced or downsized; accordingly, a reduction in the size and weight of the main body 9301 can be achieved.

In the camera of Embodiment 8, low power consumption, high image quality, and the reduction in size and weight are achieved; thus, a product that is suitable for being carried can be provided.

Figure 14D:
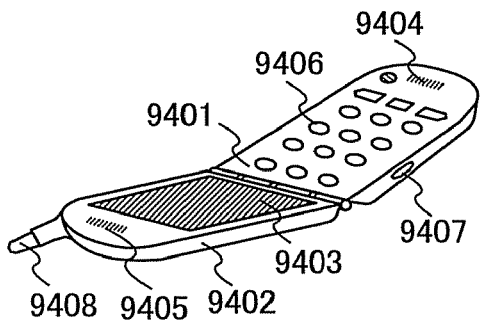

FIG. 14D illustrates a cellular phone of Embodiment 8, which includes a main body 9401, a housing 9402, a display portion 9403, an audio input portion 9404, an audio output portion 9405, operation keys 9406, an external connection port 9407, an antenna 9408, and the like. In the display portion 9403 of this cellular phone, light-emitting elements similar to those described in Embodiments 1 to 5 are arranged in matrix. The features of the light-emitting elements are high emission efficiency, low power consumption, and long lifetime. The display portion 9403 including the light-emitting elements also has features similar to those of the light-emitting elements. Accordingly, in this cellular phone, the amount of image display deterioration is small, and power consumption is reduced. With such features, functional circuitry for deterioration compensation or power supply circuits in the cellular phone can be greatly reduced or downsized; accordingly, a reduction in the size and weight of the main body 9401 and the housing 9402 can be achieved. In the cellular phone of Embodiment 8, low power consumption, high image quality, and the reduction in size and weight are achieved; thus, a product that is suitable for being carried can be provided.

Figure 15:
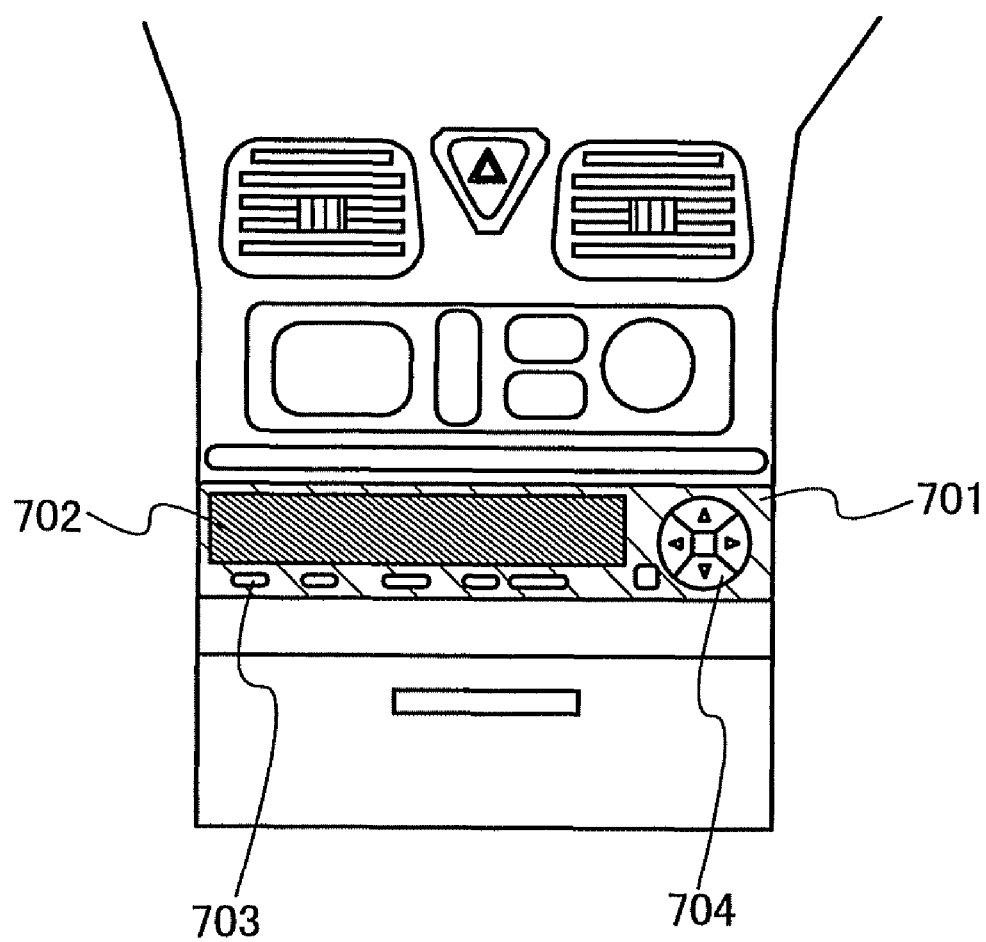
FIG. 15 illustrates an electronic device according to an embodiment of the present invention.

FIG. 15 illustrates an audio replay device, specifically, a car audio system which includes a main body 701, a display portion 702, and operation switches 703 and 704. The display portion 702 can be formed by using the light-emitting device (passive matrix type or active matrix type) described in Embodiment 6. Further, this display portion 702 may be formed using a segment type light-emitting device. In any case, by using the light-emitting element according to the embodiment of the present invention, a display portion having low power consumption and high brightness can be formed with the use of a vehicle power source (12 to 42 V). Furthermore, although Embodiment 8 describes an in-car audio system, the light-emitting device according to the embodiment of the present invention may also be used in portable audio systems or audio systems for home use.

Figure 16:
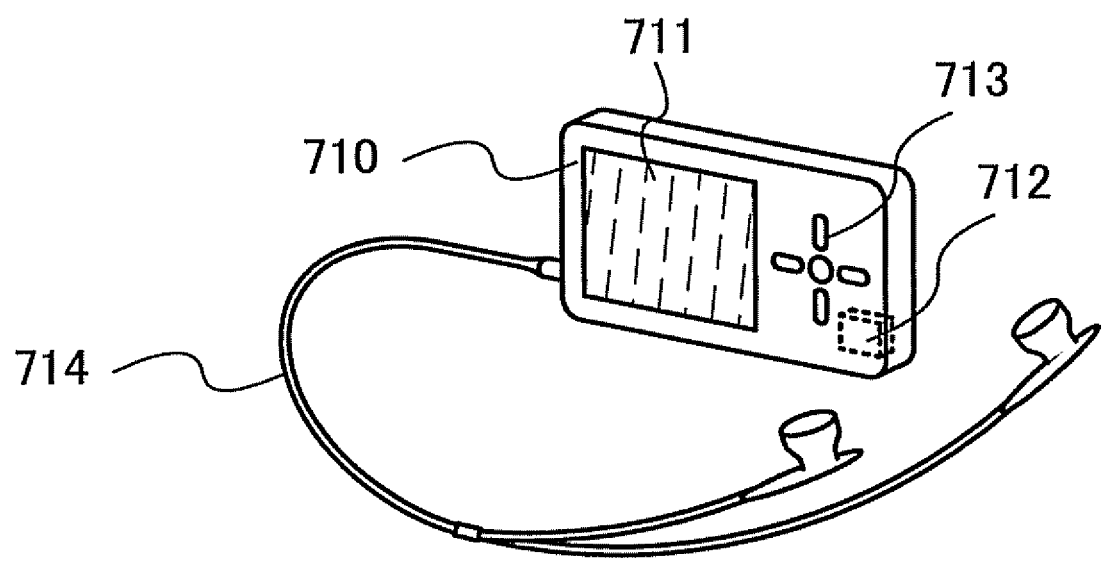
FIG. 16 illustrates an electronic device according to an embodiment of the present invention.

FIG. 16 illustrates a digital player as an example of an audio replay system. The digital player illustrated in FIG. 16 includes a main body 710, a display portion 711, a memory portion 712, an operation portion 713, a pair of earphones 714, and the like. Note that a pair of headphones or wireless earphones can be used instead of the pair of earphones 714. The display portion 711 can be formed by using the light-emitting device (passive matrix type or active matrix type) described in Embodiment 6. Further, the display portion 711 may be formed using a segment type light-emitting device. In any case, the use of a light-emitting element of the embodiment of present invention makes it possible to form a display portion having low power consumption and high brightness, which can display images even when using a secondary battery (e.g., a nickel-hydrogen battery). As the memory portion 712, a hard disk or a nonvolatile memory is used. For example, by using a NAND-type nonvolatile memory with a recording capacity of 20 to 200 gigabytes (GB) and by operating the operating portion 713, an image or a sound (music) can be recorded and replayed. Note that in the display portion 702 and the display portion 711, white characters are displayed against a black background, and accordingly power consumption can be reduced. This is particularly effective for portable audio systems.

As described above, the applicable range of the light-emitting device manufactured by applying the embodiment of the present invention is wide so that the light-emitting device can be applied to electronic devices in a wide variety of fields. By applying the embodiment of the present invention, an electronic device that has a display portion with low power consumption and long lifetime can be manufactured.

A light-emitting device to which the embodiment of the present invention is applied has high emission efficiency and can also be used as a lighting apparatus. One mode of using a light-emitting element to which the embodiment of the present invention is applied as a lighting apparatus is described using FIG. 17.

Figure 17:
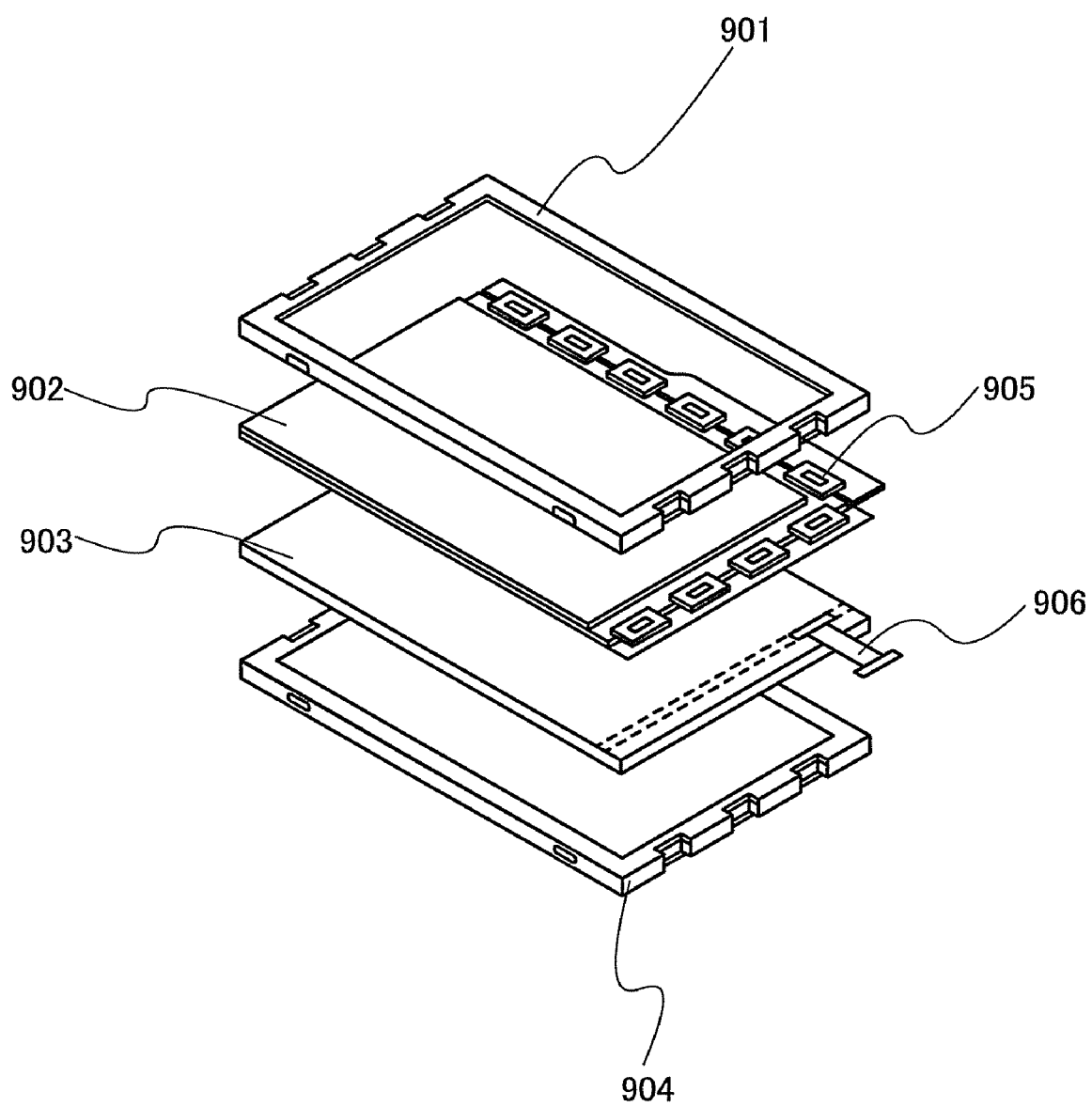
FIG. 17 illustrates an electronic device according to an embodiment of the present invention.

FIG. 17 illustrates a liquid crystal display device using the light-emitting device to which the embodiment of the present invention is applied as a backlight, as an example of the electronic device using a light-emitting device according to the embodiment of the present invention as a lighting apparatus. The liquid crystal display device illustrated in FIG. 17 includes a housing 901, a liquid crystal layer 902, a backlight 903, and a housing 904, and the liquid crystal layer 902 is connected to a driver IC 905. Further, the light-emitting device to which the embodiment of the present invention is applied is used as the backlight 903, and a current is supplied through a terminal 906.

Because the light-emitting device according to the embodiment of the present invention is thin and has low power consumption, the thickness and power consumption of a liquid crystal display device can be reduced by using a light-emitting device according to the embodiment of the present invention as a backlight of the liquid crystal display device. Moreover, a light-emitting device according to the embodiment of the present invention is a plane emission type lighting apparatus and can have a large area. Thus, the backlight can have a large area, and a liquid crystal display device having a large area can also be obtained.

Figure 18:
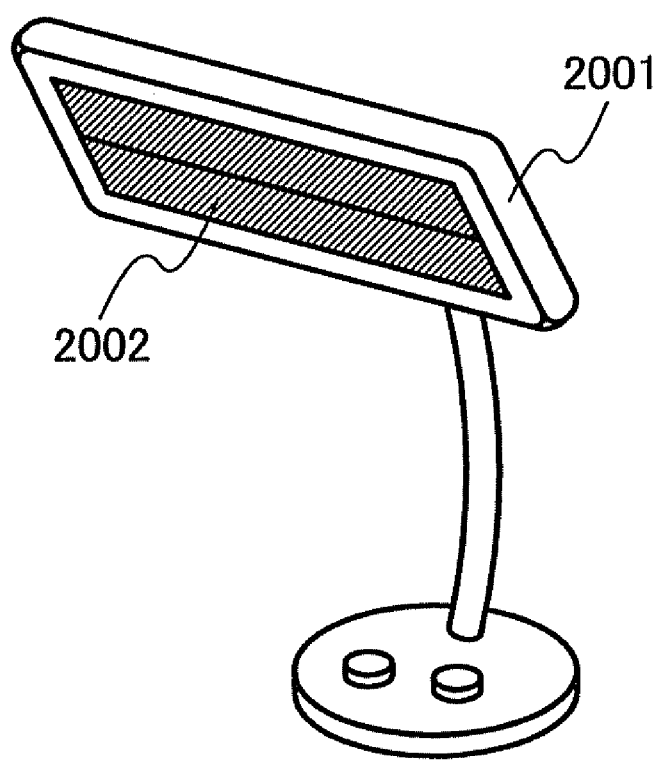
FIG. 18 illustrates a lighting apparatus according to an embodiment of the present invention.

FIG. 18 illustrates an example in which a light-emitting device according to the embodiment of the present invention is used as a desk lamp, which is one of lighting apparatuses. The desk lamp illustrated in FIG. 18 includes a housing 2001 and a light source 2002, and a light-emitting device according to the embodiment of the present invention is used as the light source 2002. Because a light-emitting device of the embodiment of the present invention has low power consumption, the desk lamp also has low power consumption.

Figure 19:
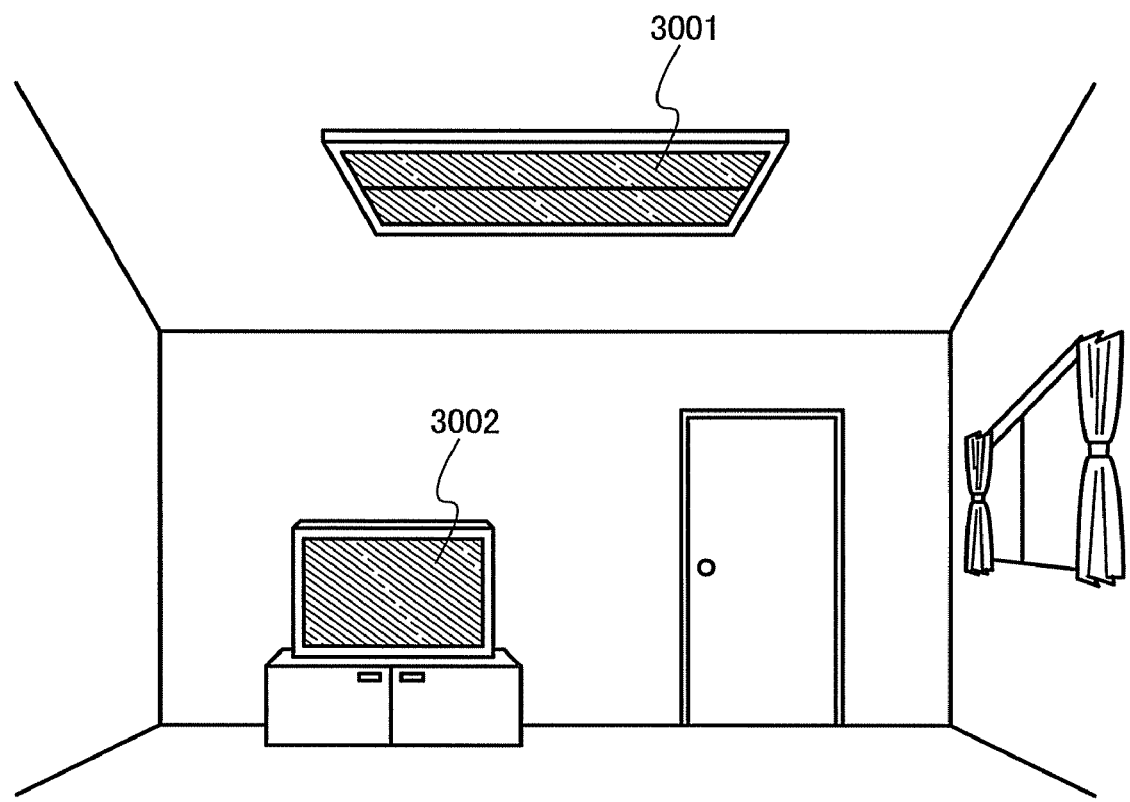
FIG. 19 illustrates a lighting apparatus and an electronic device according to an embodiment of the present invention.

FIG. 19 illustrates an example in which a light-emitting device to which the embodiment of the present invention is applied is used as an interior lighting apparatus 3001. Because a light-emitting device according to the embodiment of the present invention can have a large area, a light-emitting device according to the embodiment of the present invention can be used as a lighting apparatus having a large area. Moreover, because a light-emitting device according to the embodiment of the present invention has low power consumption, a light-emitting device according to the embodiment of the present invention can be used as a lighting apparatus that has low power consumption. In a room where a light-emitting device to which the embodiment of the present invention is applied is thus used as the interior lighting apparatus 3001, a television set 3002 according to the embodiment of the present invention as illustrated in FIG. 14A may be placed, so that public broadcasting or movies can be watched there. In such a case, since both devices have low power consumption, environmental load can be reduced.

Note that Embodiment 8 can be combined with any of the other embodiments as appropriate.

Example 1

In Example 1, an example of fabricating a light-emitting element of the present invention will be specifically described. Structural formulae of materials used in Example 1 are illustrated below.

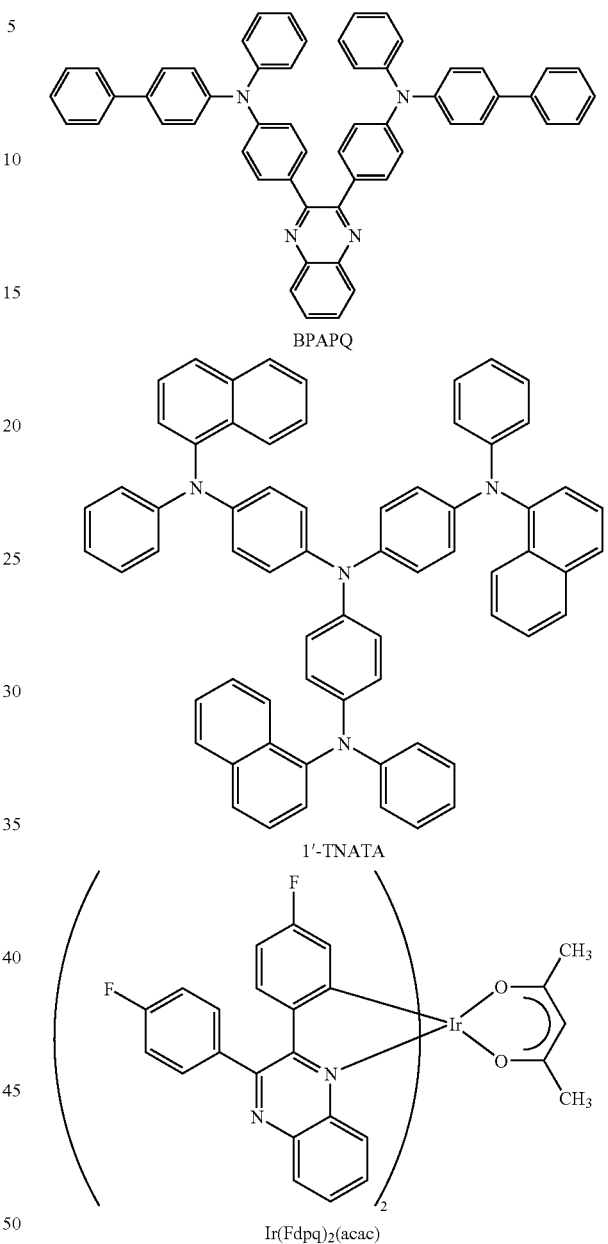

BPAPQ

1'-TNATA

Ir(Fdpq)$_2$(acac)

Hereinafter, specific methods of fabricating light-emitting elements of Example 1 are described.

(Light-Emitting Element 1)

First, a glass substrate on which a 110-nm-thick indium tin silicon oxide (ITSO) film was formed as an anode was prepared. The periphery of a surface of the ITSO film was covered with a polyimide film so that a 2 mm square portion of the surface was exposed. The electrode area was set to 2 mm×2 mm. As a pretreatment for forming the light-emitting element over this substrate, the surface of the substrate was washed with water and baked at 200° C. for one hour, and then a UV ozone treatment was performed for 370 seconds. Then, the substrate was transferred into a vacuum evaporation apparatus where the pressure was reduced to about $10^{-5}$ Pa. In a heating chamber of the vacuum evaporation apparatus, baking was performed at 170° C. for 30 minutes in vacuum. After that, the substrate was cooled down for about 30 minutes.

Next, the glass substrate provided with the anode was fixed to a substrate holder provided in a film formation chamber of the vacuum evaporation apparatus such that the surface on which the anode was formed faced downward.

Then, first of all, N,N'-(quinoxaline-2,3-diyldi-4,1-phenylene)bis(N-phenyl-1,1'-biphenyl-4-amine) (abbreviation: BPAPQ) and molybdenum(VI) oxide were co-evaporated on the anode, whereby a hole-inject region to which molybdenum oxide, which was an electron-accepting substance, was added was formed. Resistance heating was used for the evaporation. The thickness of the hole-inject region was set to 50 nm, and the evaporation rate was adjusted such that the weight ratio of BPAPQ to molybdenum oxide was 1:0.5 (=BPAPQ:molybdenum oxide). Note that the co-evaporation method refers to an evaporation method by which evaporation of a plurality of material is conducted from a plurality of evaporation sources at the same time in one treatment chamber.

Successively, by an evaporation method using resistance heating, a 10-nm film was formed using only BPAPQ and then BPAPQ and 4,4',4"-tris[N-(1-naphthyl)-N-phenylamino]triphenylamine (abbreviation: 1'-TNATA) were co-evaporated, whereby a hole-transport region to which 1'-TNATA, which was a hole-trapping substance, was added was formed. The thickness of the hole-transport region was set to 10 nm, and the evaporation rate was adjusted such that the weight ratio of BPAPQ to 1'-TNATA was 1:0.01 (=BPAPQ:1'-TNATA).

Next, BPAPQ and (acetylacetonato)bis[2,3-bis(4-fluorophenyl)quinoxalinato]iridium(III) (abbreviation: Ir(Fdpq)$_2$(acac)) were co-evaporated, whereby a light-emitting region to which Ir(Fdpq)$_2$(acac), which was a light-emitting substance, was added was formed. The thickness of the light-emitting region was set to 30 nm, and the evaporation rate was adjusted such that the weight ratio of BPAPQ to Ir(Fdpq)$_2$(acac) was 1:0.08 (=BPAPQ:Ir(Fdpq)$_2$(acac)).

Furthermore, a 10-nm film was formed using only BPAPQ, and then BPAPQ and lithium (Li) were co-evaporated, whereby an electron-inject region to which lithium, which was an electron-donating substance, was added was formed. The thickness of the electron-inject region was set to 50 nm, and the evaporation rate was adjusted such that the weight ratio of BPAPQ to lithium was 1:0.01 (=BPAPQ:lithium).

Lastly, a 200-nm-thick aluminum film was formed on the electron-inject region by an evaporation method using resistance heating, whereby a cathode was formed. Thus, the light-emitting element 1 was fabricated.

(Comparative Light-Emitting Element 2)

For a comparative light-emitting element 2, the same kind of substrate as the light-emitting element 1 was used, and the hole-transport region to which the hole-trapping substance was added was not provided. That is, the comparative light-emitting element 2 was fabricated in a manner similar to that of the light-emitting element 1 except that 1'-TNATA was not added.

The thus obtained light-emitting element 1 and comparative light-emitting element 2 were sealed in a glove box containing a nitrogen atmosphere so as not to be exposed to air. Then, operation characteristics of these light-emitting elements were measured. Note that the measurement was carried out at room temperature (in the atmosphere kept at 25° C.).

Figure 20A:
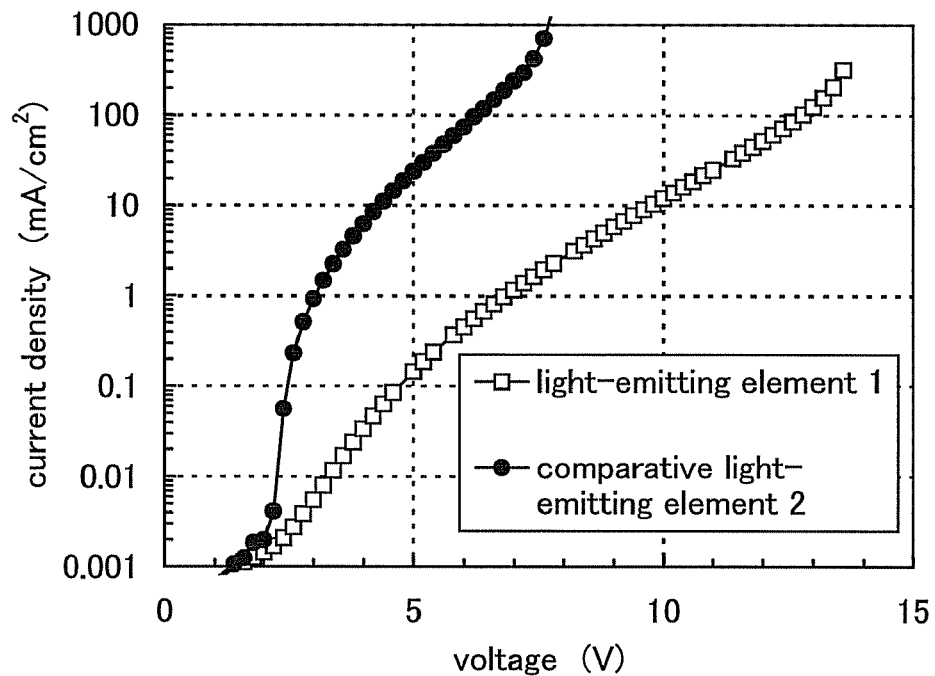
FIGS. 20A and 20B show characteristics of light-emitting elements of Example 1.
Figure 20B:
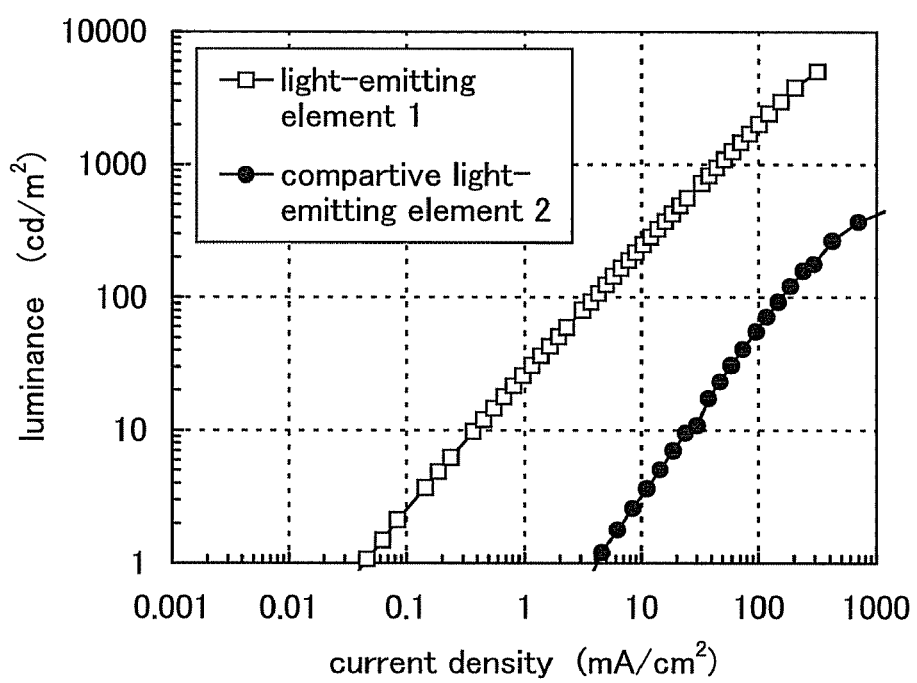
Figure 21A:
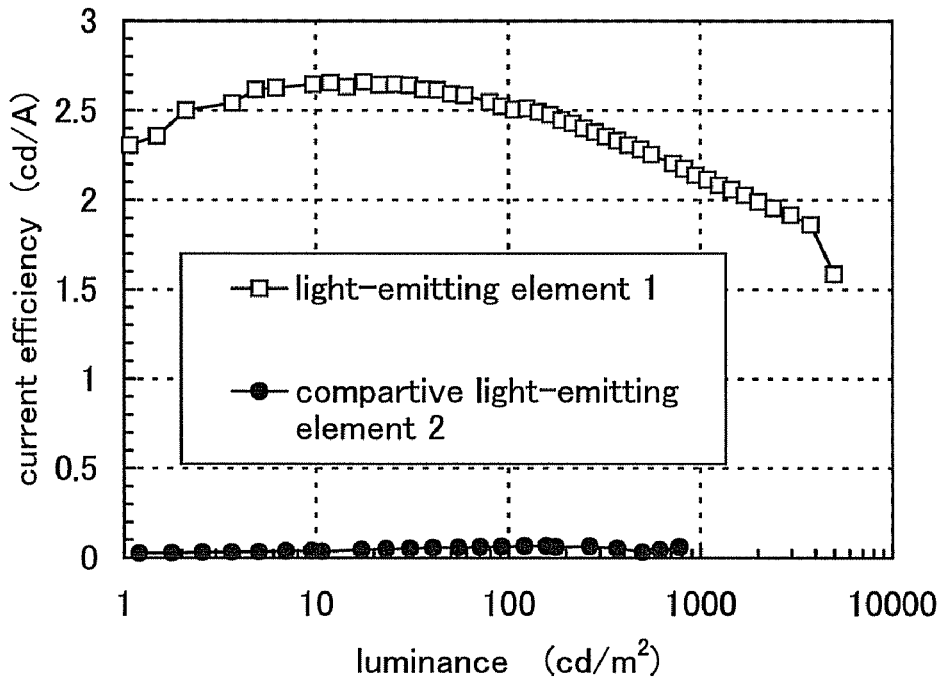
FIGS. 21A and 21B show characteristics of the light-emitting elements of Example 1.
Figure 21B:
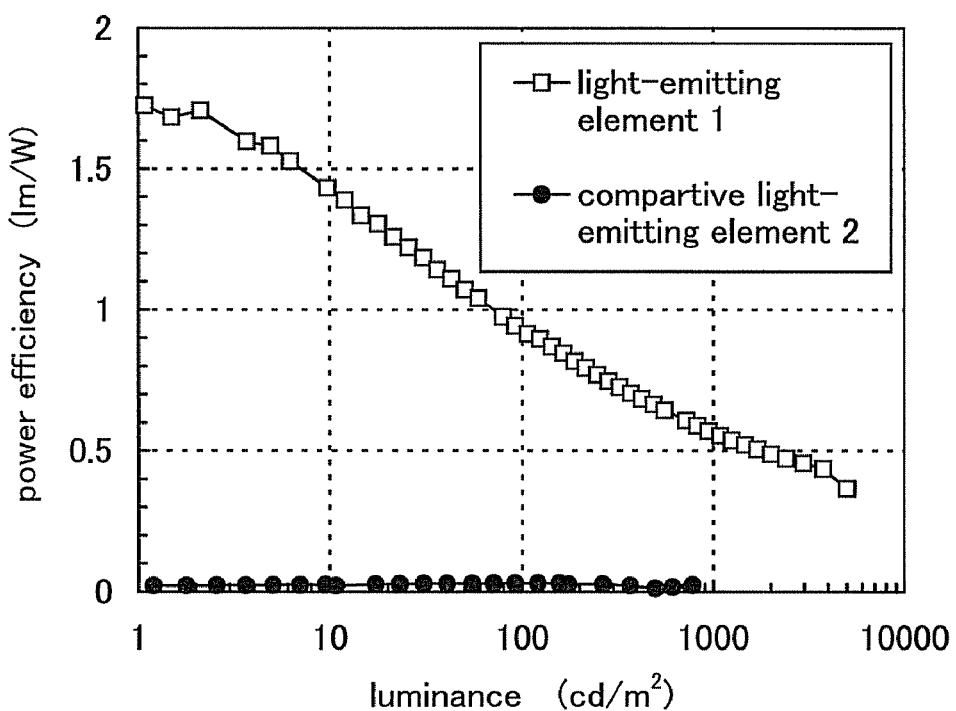
Figure 22A:
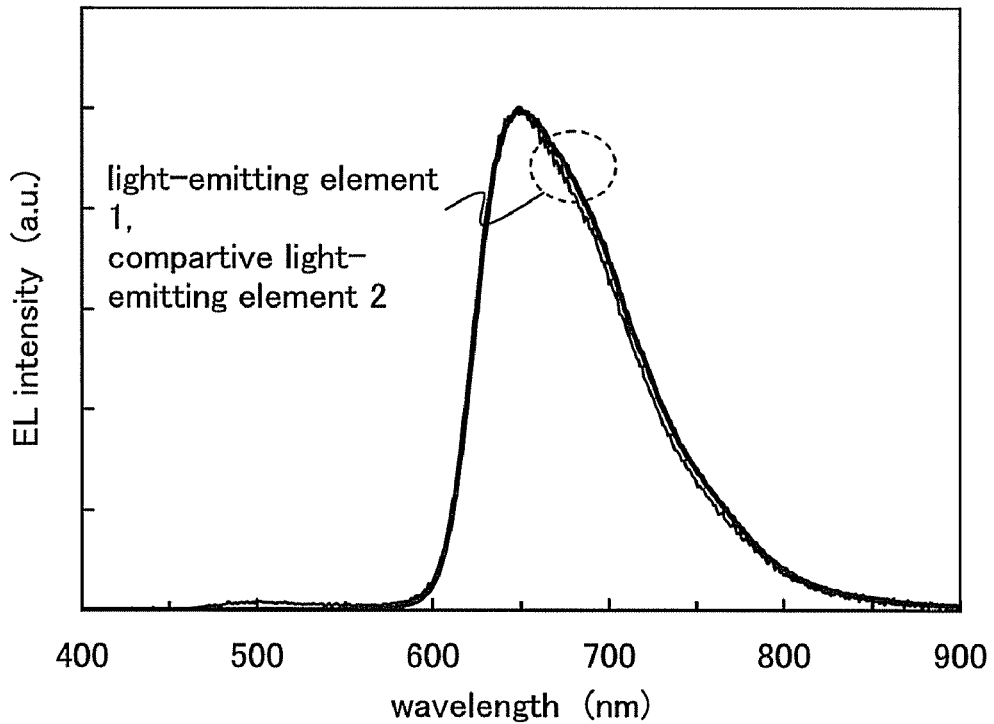
FIGS. 22A and 22B show characteristics of the light-emitting elements of Example 1.
Figure 22B:
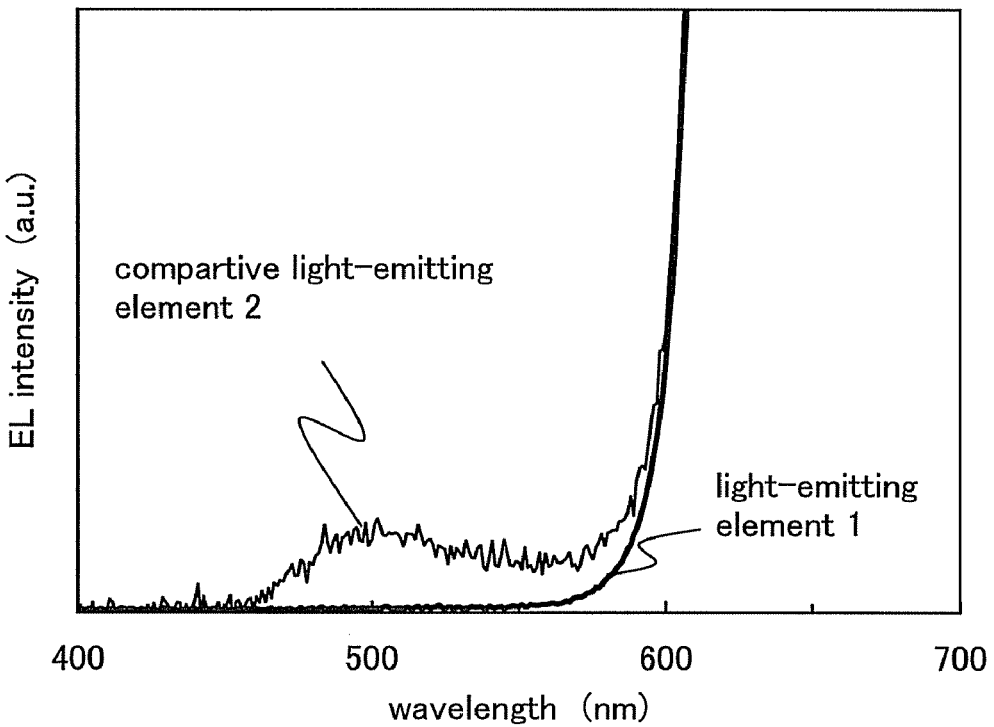

FIG. 20A shows the voltage vs. current density characteristics of the light-emitting element 1 and the comparative light-emitting element 2, and FIG. 20B shows the current density vs. luminance characteristics thereof. FIG. 21A shows the luminance vs. current efficiency characteristics of the light-emitting element 1 and the comparative light-emitting element 2, and FIG. 21B shows the luminance vs. power efficiency characteristics thereof. FIG. 22A shows the emission spectra when the light-emitting element 1 and the comparative light-emitting element 2 were emitted by a current at a current density of 25 mA/cm$^2$. FIG. 22B is an enlarged view of FIG. 22A. As apparent from FIGS. 22A and 22B, each light-emitting element exhibits red light emission (an emission peak wavelength of 650 nm) from Ir(Fdpq)$_2$(acac), which is the light-emitting substance.

However, as apparent from FIGS. 20A and 20B, although a large amount of current flows through the comparative light-emitting element 2, the luminance thereof is low, in comparison with the light-emitting element 1. Thus, as also can be seen from FIG. 21A, there is an extremely significant difference in current efficiency. The light-emitting element 1 of the embodiment of the present invention can achieve a high current efficiency, whereas the current efficiency of the comparative light-emitting element 2 is drastically low. For example, at a luminance of 500 cd/m$^2$, the current efficiency of the light-emitting element 1 is 2.2 cd/A while the current efficiency of the comparative light-emitting element 2 is about 0.05 cd/A. In other words, just by adding a slight amount of the hole-trapping substance, the current efficiency of the light-emitting element 1 of the embodiment of the present invention is improved by almost 50-fold. It is found that, as a result, at a luminance of 500 cd/m$^2$, the power efficiency is improved from about 0.02 lm/W to 0.66 lm/W and thus the power consumption is reduced to one-thirtieth or less.

Explanation for this will be given below. Table 1 below shows the HOMO levels and LUMO levels of BPAPQ and Ir(Fdpq)$_2$(acac) and also the HOMO level of 1'-TNATA. Note that the HOMO levels and LUMO levels were calculated by cyclic voltammetry (CV) measurement (see Example 4).

TABLE 1

| Substance Name | HOMO (eV) | LUMO (eV) |
|---|---|---|
| BPAPQ | −5.58 | −2.97 |
| Ir(Fdpq)$_2$(acac) | −5.80 | −3.41 |
| 1'-TNATA | −4.98 | — |

As can be seen from Table 1, in the light-emitting region obtained by adding Ir(Fdpq)$_2$(acac) to BPAPQ to, Ir(Fdpq)$_2$(acac) has a strong tendency to trap electrons but scarcely traps holes. Thus, the light-emitting region tends to allow holes to be transported to the cathode without giving sufficient opportunity to undergo recombination. Indeed, in FIG. 22B, unnecessary light emission from the comparative light-emitting element 2 was observed at around 500 nm. This is probably due to a phenomenon in which holes passing through the light-emitting region recombine with electrons in the layer containing only BPAPQ between the light-emitting region and the electron-inject to allow BPAPQ to emit light. Besides, it is plausible that in the light-emitting element 1 of Example 1, holes which easily pass through the light-emitting region are trapped by the added 1'-TNATA so that the recombination efficiency is increased; thus, the emission efficiency is significantly improved without light emission from BPAPQ.

From the above-described results, it is understood that, by applying the element structure of a light-emitting element of the embodiment of the present invention, although it is a simple element structure, the emission efficiency can be significantly increased.

Figure 36:
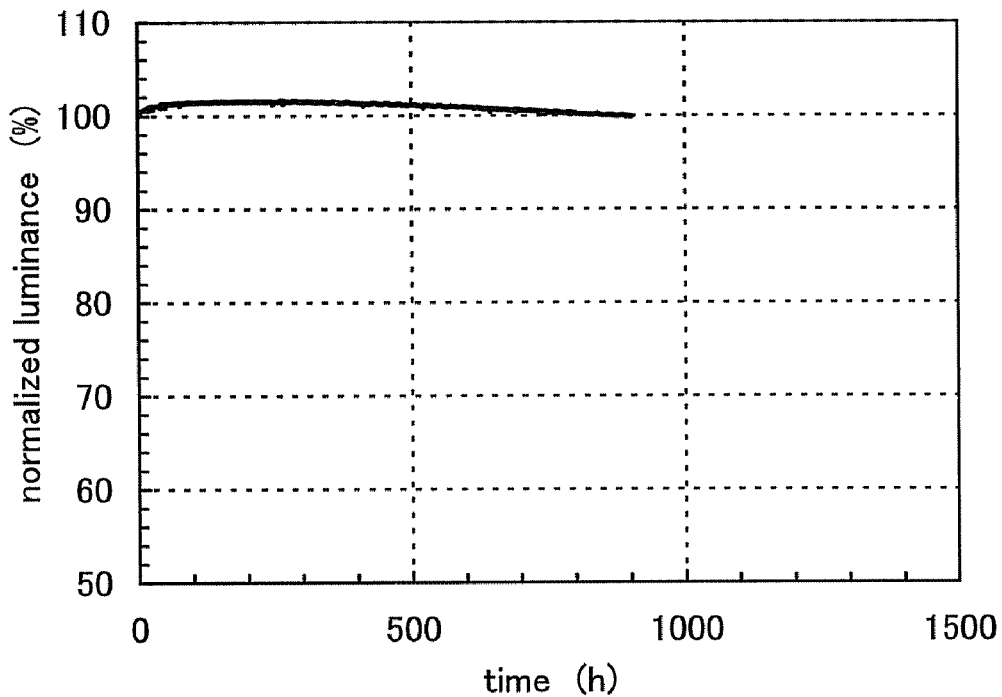
FIG. 36 shows characteristics of the light-emitting element of Example 1.
Figure 37:
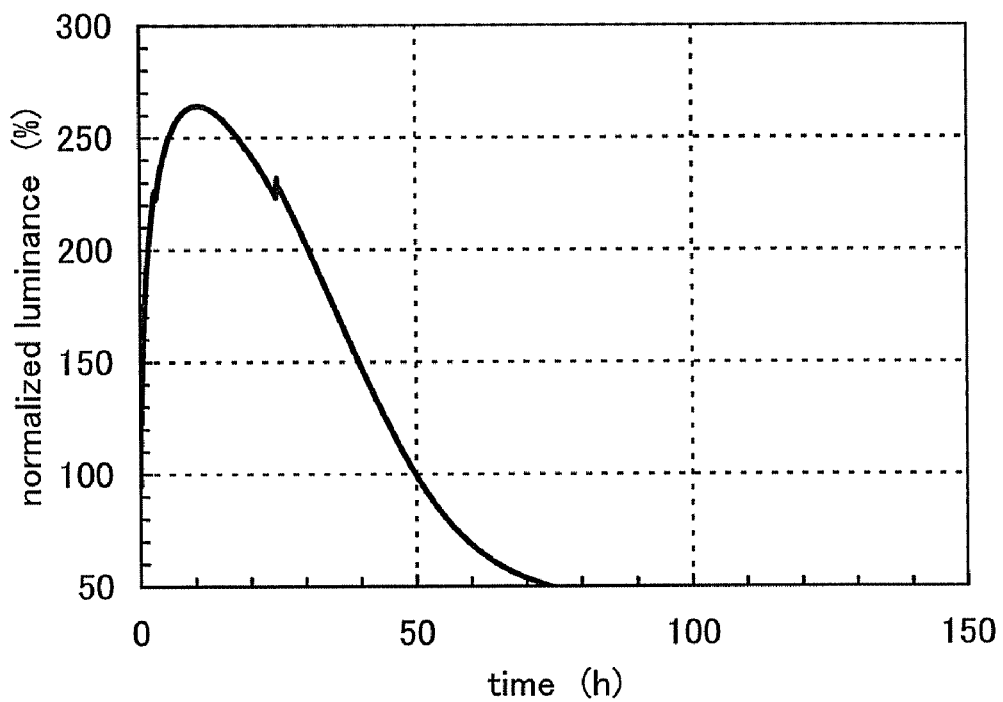
FIG. 37 shows characteristics of the light-emitting element of Example 1.

Furthermore, tests were performed in which the light-emitting element 1 and the comparative light-emitting element 2 were continuously lit by constant current driving with the initial luminance thereof set to 500 cd/m². FIG. 36 shows the results of the light-emitting element 1, and FIG. 37 shows the results of the comparative light-emitting element 2. The vertical axis represents normalized luminance under the conditions that the initial luminance was 100%, and the horizontal axis represents driving time.

As can be seen from the comparison of FIG. 36 and FIG. 37, there is a much larger difference in lifetime than in current efficiency. As shown in FIG. 37, with the comparative light-emitting element 2, the luminance is increased by 2.5-fold at the beginning of the driving and then immediately decreased; after 75 hours, it is decreased by half. On the other hand, as shown in FIG. 36, with the light-emitting element 1 of the embodiment of the present invention, the luminance is negligibly increased by about 1% at the beginning of the driving and shows very slight deterioration after that; even after 900 hours, it is found to keep almost 100% of the initial luminance. Thus, the light-emitting element can be obtained which hardly deteriorates and has lifetime that is so long as to make it difficult to estimate its half life-time.

The light-emitting element 1 and the comparative light-emitting element 2 are different just in whether only about 1 wt % hole-trapping substance (1'-TNATA) is added to the hole-transport region. However, such an effect of drastically improving the lifetime is surprising and unpredictable from conventional common technical knowledge, demonstrating that the embodiment of the present invention provides a remarkable effect.

From the above-described results, it is understood that, by applying the element structure of a light-emitting element of the embodiment of the present invention, although it is a simple element structure, a light-emitting element having extremely long lifetime can be fabricated.

Example 2

In Example 2, an example of fabricating a light-emitting element of the embodiment of the present invention will be specifically described. A structural formula of a material used in Example 2 is illustrated below. Note that the structural formulae of the materials used in Example 1 are omitted.

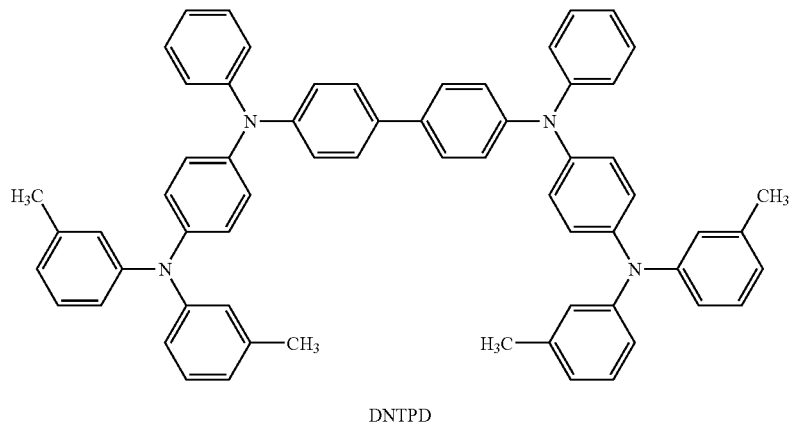

DNTPD (Light-Emitting Element 3)

A light-emitting element 3 was fabricated in a manner similar to that of the light-emitting element 1 except that 4,4'-bis(N-{4-[N'-(3-methylphenyl)-N'-phenylamino]phenyl}-N-phenylamino)biphenyl (abbreviation: DNTPD) was used instead of 1'-TNATA as the hole-trapping substance. Note that in the light-emitting element 3, DNTPD was added with the weight ratio of BPAPQ to DNTPD being 1:0.1.

The thus obtained light-emitting element 3 was sealed in a glove box containing a nitrogen atmosphere so as not to be exposed to air. Then, operation characteristics of this light-emitting element were measured. Note that the measurement was carried out at room temperature (in the atmosphere kept at 25° C.).

Figure 23A:
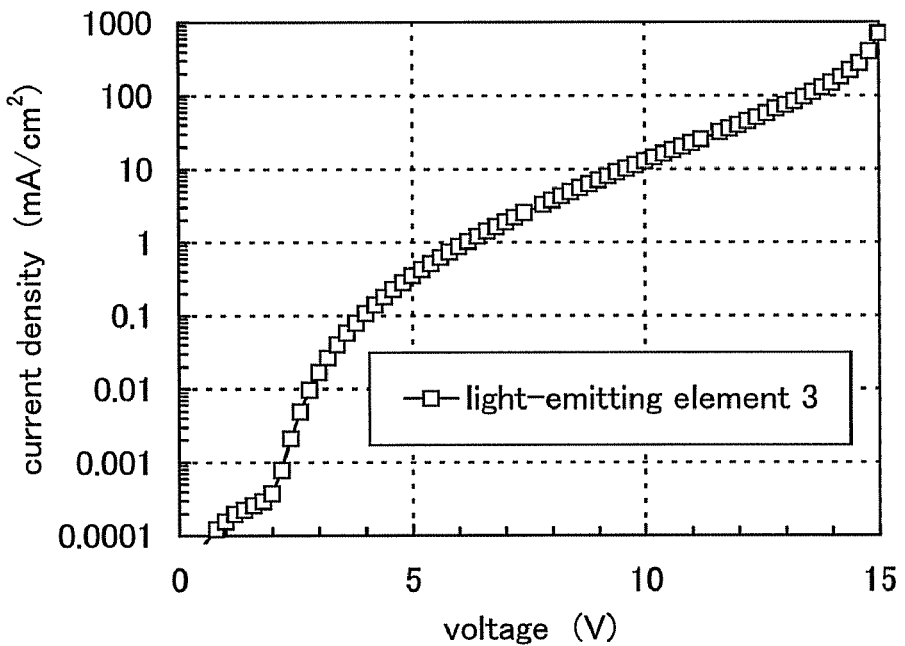
FIGS. 23A and 23B show characteristics of a light-emitting element of Example 2.
Figure 23B:
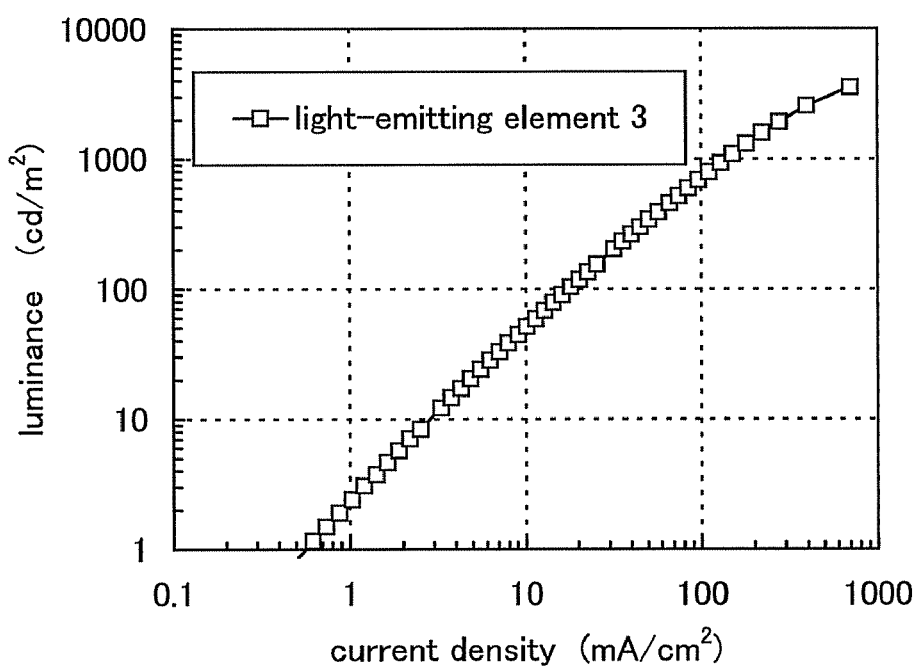
Figure 24A:
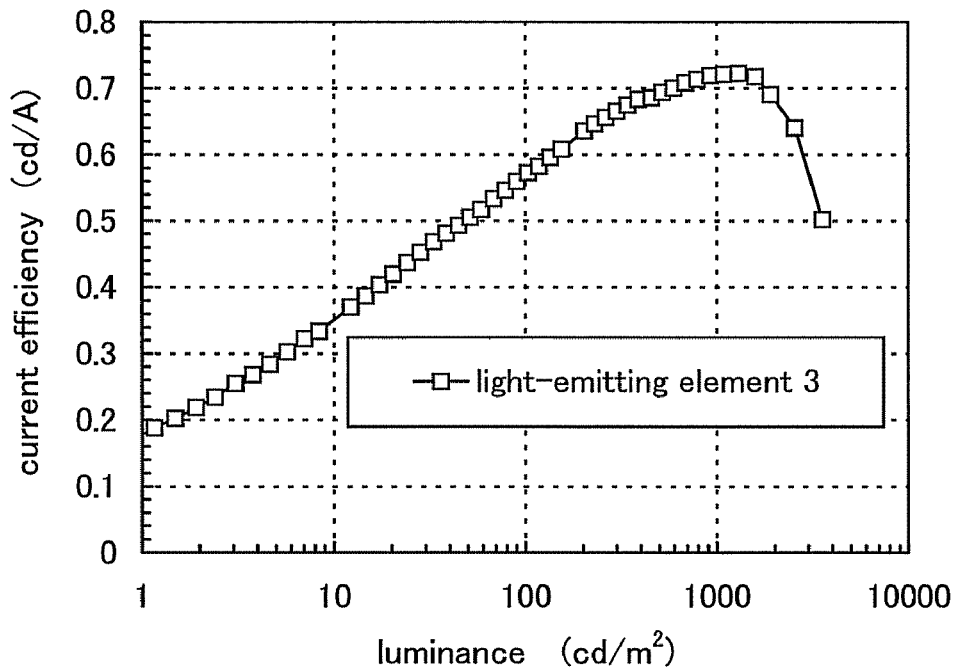
FIGS. 24A and 24B show characteristics of the light-emitting element of Example 2.
Figure 24B:
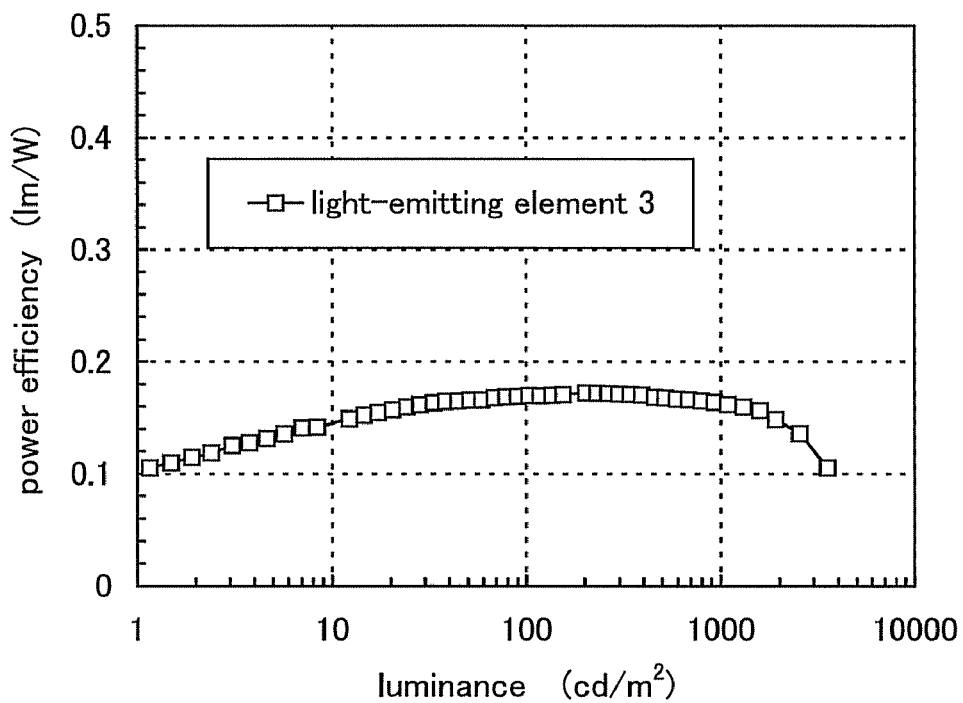
Figure 25:
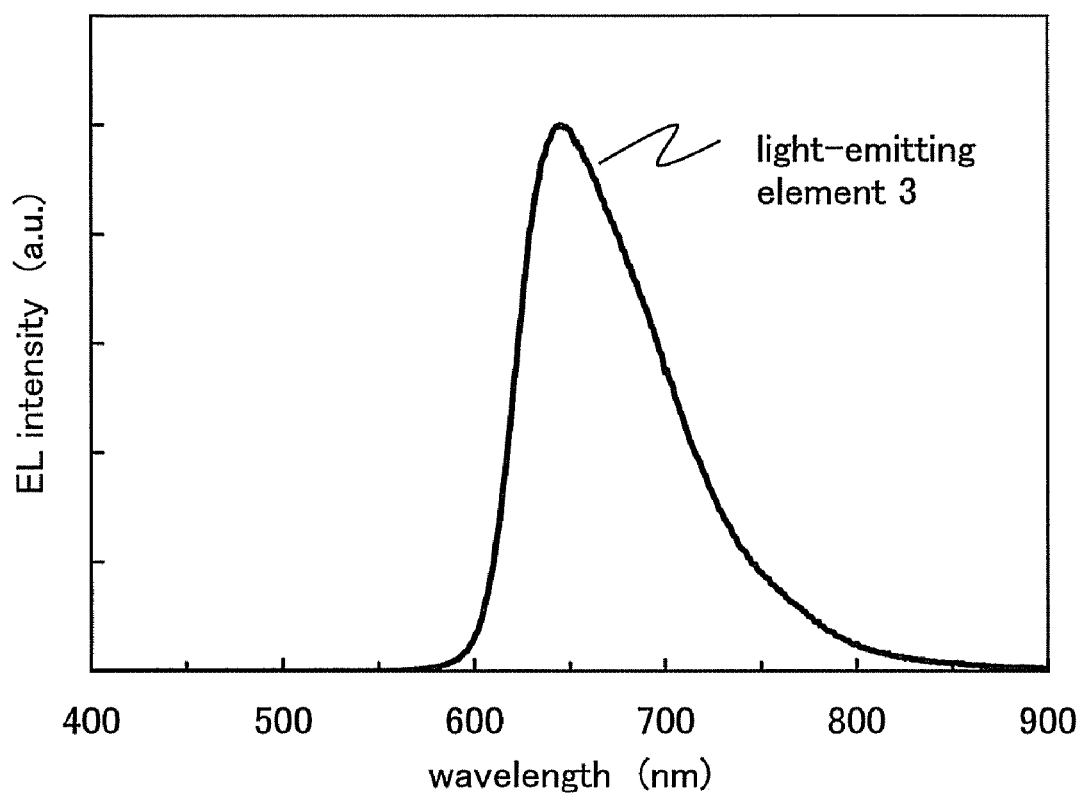
FIG. 25 shows characteristics of the light-emitting element of Example 2.

FIG. 23A shows the voltage vs. current density characteristics of the light-emitting element 3, and FIG. 23B shows the current density vs. luminance characteristics thereof. FIG. 24A shows the luminance vs. current efficiency characteristics of the light-emitting element 3, and FIG. 24B shows the luminance vs. power efficiency characteristics thereof. FIG. 25 shows the emission spectrum when the light-emitting element 3 was emitted by a current at a current density of 25 mA/cm². As apparent from FIG. 25, the light-emitting element 3 exhibits red light emission (an emission peak wavelength of 650 nm) from Ir(Fdpq)$_2$(acac), which is the light-emitting substance.

The current efficiency of the light-emitting element 3 at a luminance of 500 cd/m² is 0.69 cd/A, which is lower than that of the light-emitting element 1 of Example 1 but greater than or equal to 10 times that of the comparative light-emitting element 2 of Example 1. In addition, the power efficiency at a luminance of 500 cd/m² is about 0.17 lm/W, and the power consumption is about one-tenth that of the comparative light-emitting element 2.

Table 2 below shows the HOMO levels and LUMO levels of BPAPQ and Ir(Fdpq)$_2$(acac) and also the HOMO level of DNTPD. Note that the HOMO levels and LUMO levels were calculated by cyclic voltammetry (CV) measurement (see Example 4).

TABLE 2

| Substance Name | HOMO (eV) | LUMO (eV) |
| --- | --- | --- |
| BPAPQ | −5.58 | −2.97 |
| Ir(Fdpq)$_2$(acac) | −5.80 | −3.41 |
| DNTPD | −5.16 | — |

From the results of Table 2, it is plausible that as in Example 1, holes which easily pass through the light-emitting region are trapped by the added DNTPD so that the recombination efficiency is increased; thus, the emission efficiency is significantly improved without light emission from BPAPQ.

From the above-described results, it is understood that, by applying the element structure of a light-emitting element of the embodiment of the present invention, although it is a simple element structure, the emission efficiency can be significantly increased.

Example 3

In Example 3, an example of fabricating a light-emitting element of the embodiment of the present invention will be specifically described. Structural formulae of materials used in Example 3 are illustrated below.

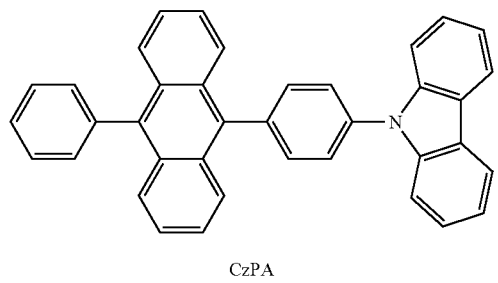

CzPA

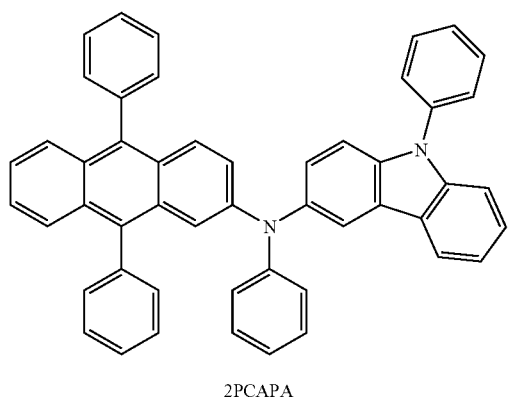

2PCAPA

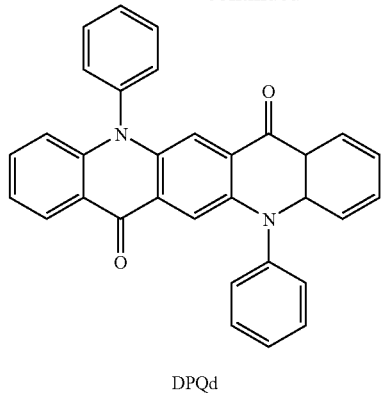

DPQd

Hereinafter, specific methods of fabricating light-emitting elements of Example 3 are described.

(Light-Emitting Element 4)

First, a glass substrate on which a 110-nm-thick indium tin silicon oxide (ITSO) film was formed as an anode was prepared. The periphery of a surface of the ITSO film was covered with a polyimide film so that a 2 mm square portion of the surface was exposed. The electrode area was set to 2 mm×2 mm. As a pretreatment for forming the light-emitting element over this substrate, the surface of the substrate was washed with water and baked at 200° C. for one hour, and then a UV ozone treatment was performed for 370 seconds. Then, the substrate was transferred into a vacuum evaporation apparatus where the pressure was reduced to about $10^{-5}$ Pa. In a heating chamber of the vacuum evaporation apparatus, baking was performed at 170° C. for 30 minutes in vacuum. After that, the substrate was cooled down for about 30 minutes.

Next, the glass substrate provided with the anode was fixed to a substrate holder provided in a film formation chamber of the vacuum evaporation apparatus such that the surface on which the anode was formed faced downward.

Then, first of all, 9-[4-(10-phenyl-9-anthryl)phenyl]-9H-carbazole (abbreviation: CzPA) and molybdenum(VI) oxide were co-evaporated on the anode, whereby a hole-inject region to which molybdenum oxide, which was the electron-accepting substance, was added was formed. Resistance heating was used for the evaporation. The thickness of the hole-inject region was set to 50 nm, and the evaporation rate was adjusted such that the weight ratio of CzPA to molybdenum oxide was 1:0.5 (=CzPA:molybdenum oxide). Note that a co-evaporation method refers to an evaporation method by which evaporation of a plurality of materials is conducted from a plurality of evaporation sources at the same time in one treatment chamber.

Successively, by an evaporation method using resistance heating, a 10-nm film was formed using only CzPA and then CzPA and N,9-diphenyl-N-(9,10-diphenyl-2-anthryl)-9H-carbazol-3-amine (abbreviation: 2PCAPA) were co-evaporated, whereby a light-emitting region to which 2PCAPA, which was a light-emitting substance, was added was formed. The thickness of the light-emitting region was set to 40 nm, and the evaporation rate was adjusted such that the weight ratio of CzPA to 2PCAPA was 1:0.05 (=CzPA:2PCAPA).

Next, CzPA and N,N'-diphenylquinacridone (abbreviation: DPQd) were co-evaporated, whereby an electron-transport region to which DPQd, which was an electron-trapping substance, was added was formed. The thickness of the electron-transport region was set to 10 nm, and the evaporation rate was adjusted such that the weight ratio of CzPA to DPQd was 1:0.005 (=CzPA:DPQd).

Furthermore, CzPA and lithium (Li) were co-evaporated, whereby an electron-inject region to which lithium, which was the electron-donating substance, was added was formed. The thickness of the electron-inject region was set to 20 nm, and the evaporation rate was adjusted such that the weight ratio of CzPA to lithium was 1:0.01 (=CzPA:lithium).

Lastly, a 200-nm-thick aluminum film was formed on the electron-inject region by an evaporation method using resistance heating, whereby the cathode was formed. Thus, the light-emitting element 4 was fabricated.

The thus obtained light-emitting element 4 was sealed in a glove box containing a nitrogen atmosphere so as not to be exposed to air. Then, operation characteristics of this light-emitting element were measured. Note that the measurement was carried out at room temperature (in the atmosphere kept at 25° C.).

Figure 26A:
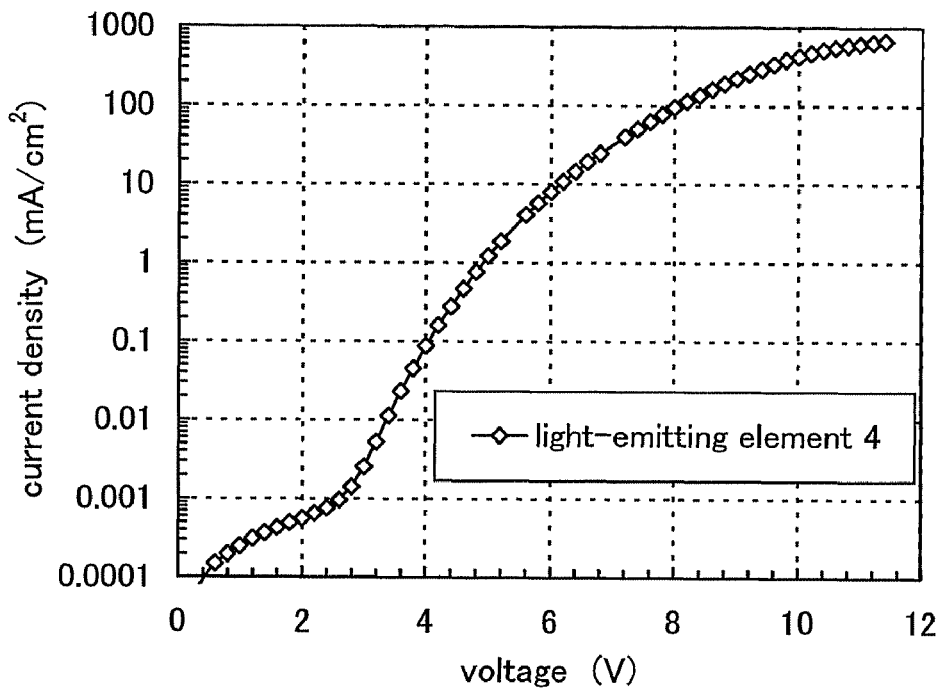
FIGS. 26A and 26B show characteristics of a light-emitting element of Example 3.
Figure 26B:
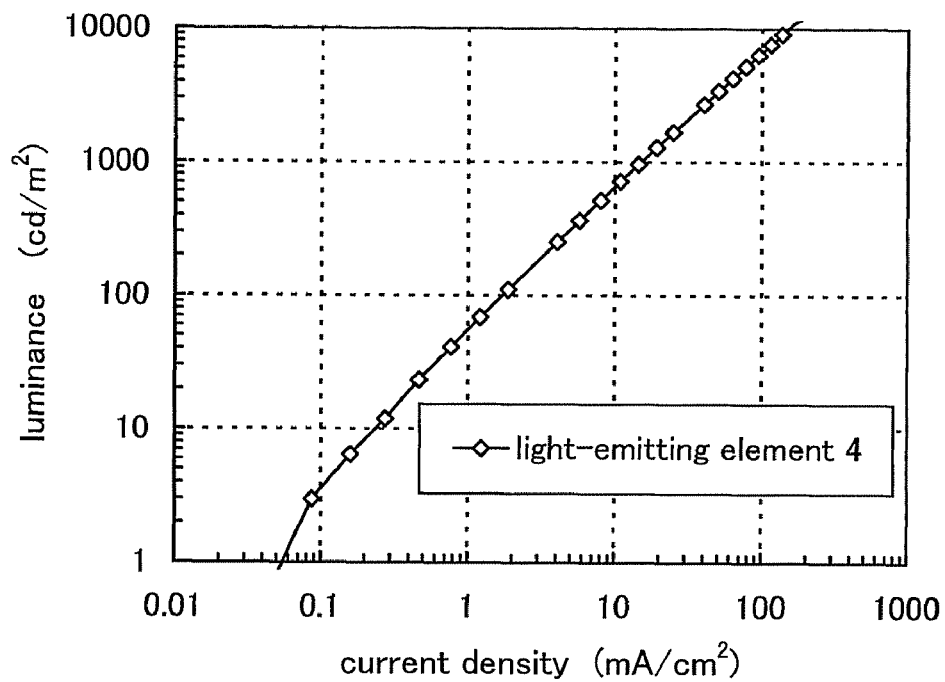
Figure 27A:
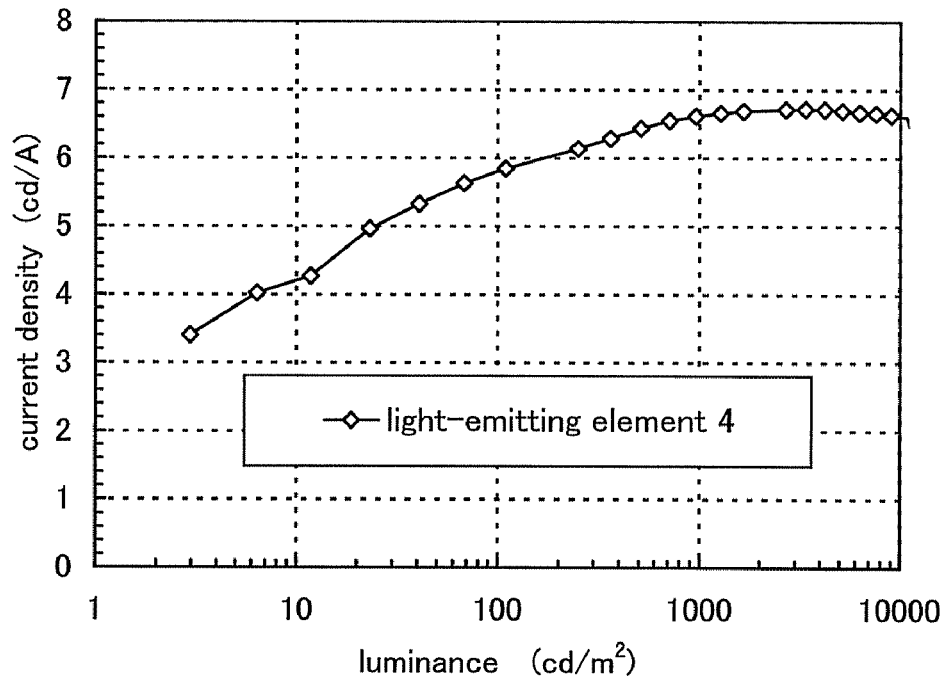
FIGS. 27A and 27B show characteristics of the light-emitting element of Example 3.
Figure 27B:
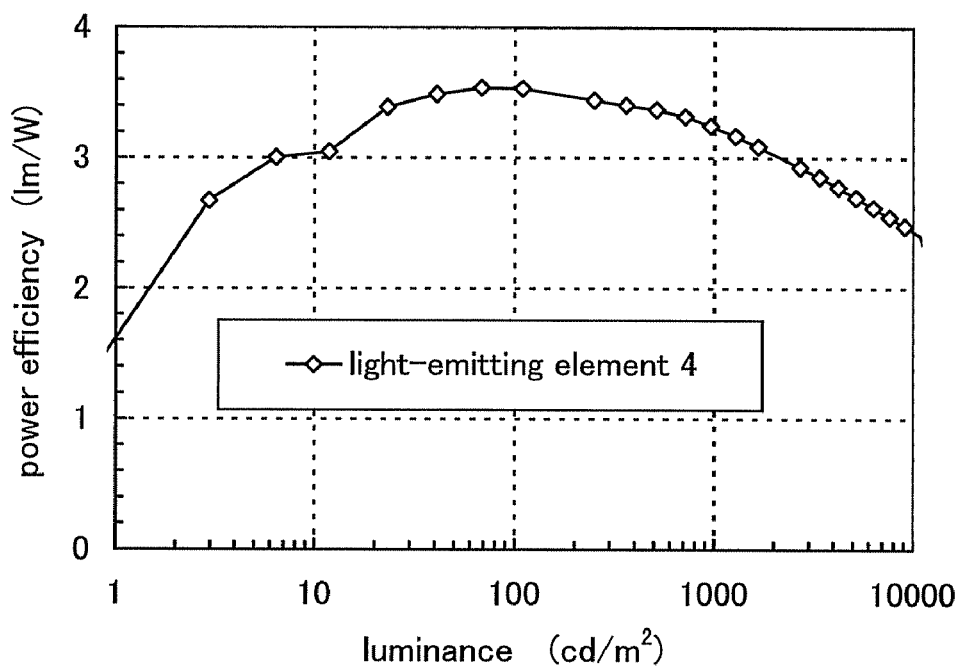
Figure 28:
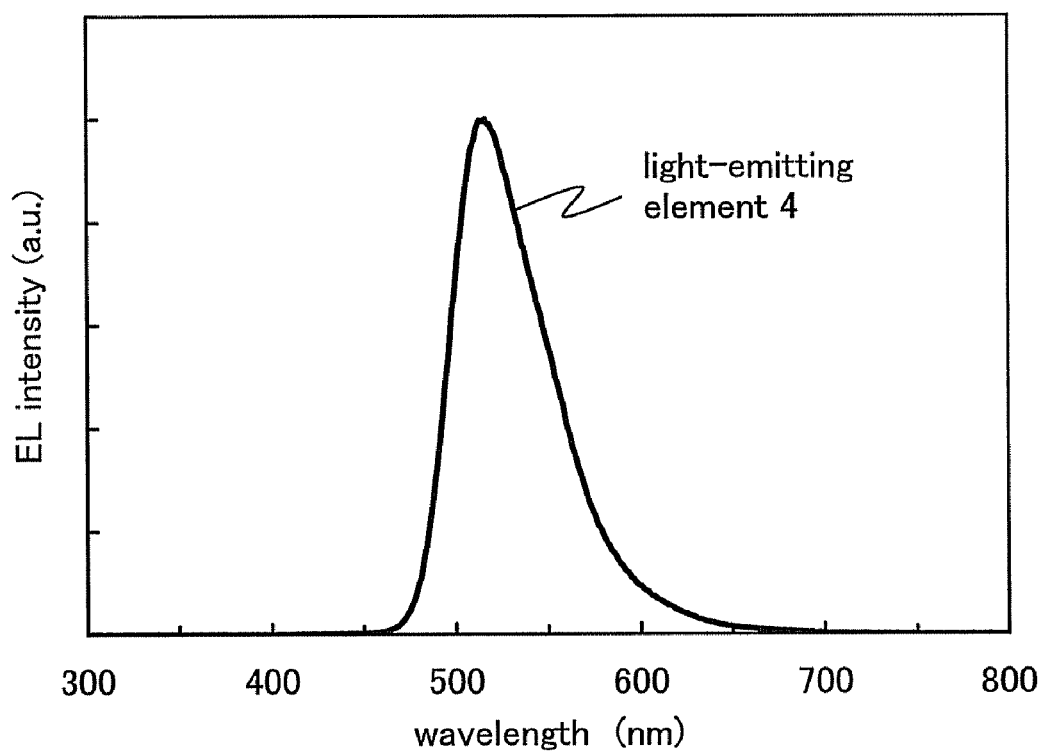
FIG. 28 shows characteristics of the light-emitting element of Example 3.

FIG. 26A shows the voltage vs. current density characteristics of the light-emitting element 4, and FIG. 26B shows the current density vs. luminance characteristics thereof. FIG. 27A shows the luminance vs. current efficiency characteristics of the light-emitting element 4, and FIG. 27B shows the luminance vs. power efficiency characteristics thereof. FIG. 28 shows the emission spectrum when the light-emitting element 4 was emitted by a current at a current density of 25 mA/cm$^2$. As apparent from FIG. 28, the light-emitting element 4 exhibits green light emission (an emission peak wavelength of 520 nm) from 2PCAPA, which is the light-emitting substance.

The current efficiency of the light-emitting element 4 at a luminance of 1000 cd/m$^2$ is 6.6 cd/A, and thus a good current efficiency is achieved. The power efficiency at a luminance of 1000 cd/m$^2$ is about 3.2 lm/W, which can provide sufficiently low power consumption.

Table 3 below shows the HOMO levels and LUMO levels of CzPA and 2PCAPA and also the LUMO level of DPQd. Note that the HOMO levels and LUMO levels were calculated by cyclic voltammetry (CV) measurement (see Example 4)[0260]

TABLE 3

| Substance Name | HOMO (eV) | LUMO (eV) |
|---|---|---|
| CzPA | −5.79 | −2.73 |
| 2PCAPA | −5.29 | −2.70 |
| DPQd | — | −3.28 |

As can be seen from Table 3, in the light-emitting region obtained by adding CzPA to 2PCAPA, 2PCAPA has a strong tendency to trap holes but scarcely traps electrons. Thus, the light-emitting region tends to allow electrons to be transported to the anode without giving sufficient opportunity to undergo recombination. Besides, it is plausible that in the light-emitting element 4 of Example 3, electrons which easily pass through the light-emitting region are trapped by the added DPQd so that the recombination efficiency is increased; thus, the high emission efficiency is obtained.

From the above-described results, it is understood that, by applying the element structure of a light-emitting element of the embodiment of the present invention, although it is a simple element structure, high emission efficiency can be obtained.

Example 4

In Example 4, the oxidation characteristics and reduction characteristics of the materials used for the light-emitting elements 1 to 4 fabricated in Examples 1 to 3 were examined by cyclic voltammetry (CV) measurement. Further, from the measurement, the HOMO level and the LUMO level of each material were determined. Note that an electrochemical analyzer (ALS model 600A or 600C, manufactured by BAS Inc.) was used for the measurement.

As for a solution used for the CV measurement, dehydrated N,N-dimethylformamide (DMF, product of Sigma-Aldrich Inc., 99.8%, catalog No. 22705-6) was used as a solvent, and tetra-n-butylammonium perchlorate (n-Bu$_4$NClO$_4$, product of Tokyo Chemical Industry Co., Ltd., catalog No. T0836), which was a supporting electrolyte, was dissolved in the solvent such that the concentration of tetra-n-butylammonium perchlorate was 100 mmol/L. The object that was to be measured was also dissolved in the solvent such that the concentration thereof was 2 mmol/L. Note that as for a substance having a low solubility, which cannot be dissolved at a concentration of 2 mmol/L, undissolved part of the substance is filtrated off and then a filtrate was used for the measurement. A platinum electrode (manufactured by BAS Inc., PTE platinum electrode) was used as a working electrode, a platinum electrode (manufactured by BAS Inc., Pt counter electrode for VC-3, (5 cm)) was used as an auxiliary electrode, and an Ag/Ag$^+$ electrode (manufactured by BAS Inc., RE-7 reference electrode for nonaqueous solvent) was used as a reference electrode. Note that the measurement was conducted at room temperature (20 to 25° C.). In addition, the scan rate at the CV measurement was set to 0.1 V/sec in all the measurements.

(Calculation of Potential Energy of Reference Electrode with Respect to Vacuum Level)

First, the potential energy (unit is eV) of the reference electrode (Ag/Ag$^+$ electrode), which was used in Example 4, with respect to the vacuum level was calculated. That is, the Fermi level of the Ag/Ag$^+$ electrode was calculated. It is known that the oxidation-reduction potential of ferrocene in methanol is +0.610 [V vs. SHE] with respect to a standard hydrogen electrode (Reference: C. R. Goldsmith, et al., *J. Am. Chem. Soc.*, Vol. 124, No. 1, pp. 83-96, 2002). On the other hand, using the reference electrode used in Example 4, the oxidation-reduction potential of ferrocene in methanol was calculated to be +0.11 V [vs. Ag/Ag$^+$]. Thus, it is found that the potential energy of the reference electrode used in Example 4 was lower than that of the standard hydrogen electrode by 0.50 [eV].

Here, it is known that the potential energy of the standard hydrogen electrode with respect to the vacuum level is −4.44 eV (Reference: T. Ohnishi and T. Koyama, *High Molecular EL Material*, Kyoritsu Shuppan, pp. 64-67). Accordingly, the potential energy of the reference electrode used in Example 4 with respect to the vacuum level is able to be calculated as follows:

$$-4.44-0.50=-4.94 \text{ [eV]}.$$

Measurement Example 1

BPAPQ

Figure 29A:
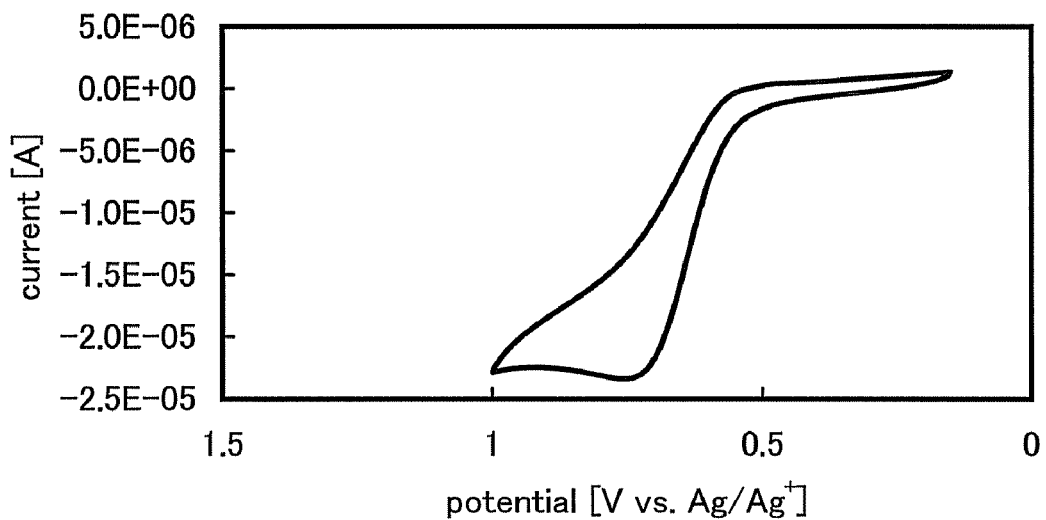
FIGS. 29A and 29B show CV characteristics of BPAPQ.
Figure 29B:
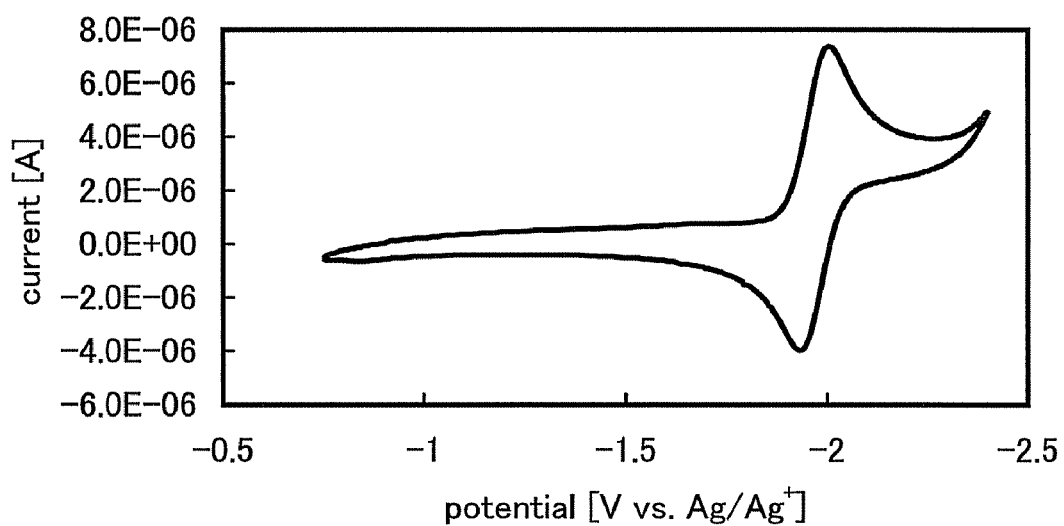

In Measurement Example 1, the oxidation characteristic and reduction characteristic of BPAPQ were examined by cyclic voltammetry (CV) measurement. FIGS. 29A and 29B show the measurement results. FIG. 29A shows the oxidation characteristic, and FIG. 29B shows the reduction characteristic. Note that for the measurement of the oxidation characteristic, the potential of the working electrode with respect to the reference electrode was scanned from 0.15 V to 1.00 V and then from 1.00 V to 0.15 V. Further, for the measurement of the reduction reaction characteristic, the potential of the working electrode with respect to the reference electrode was scanned from −0.75 V to −2.40 V and then from −2.40 V to −0.75 V.

As shown in FIG. 29A, an oxidation peak potential $E_{pa}$ was 0.53 V and a reduction peak potential $E_{pc}$ was 0.75 V. Therefore, a half-wave potential (an intermediate potential between $E_{pc}$ and $E_{pa}$) can be calculated to be 0.64 V. This demonstrates that BPAPQ is oxidized by an electric energy of 0.64 [V vs. Ag/Ag$^+$], and this energy corresponds to the HOMO level. Here, as described above, the potential energy of the reference electrode used in Example 4 with respect to the vacuum level is −4.94 [eV]. Therefore, it is found that the HOMO level of BPAPQ is calculated as follows:

$$-4.94-(0.64)=-5.58 \text{ [eV]}.$$

Further, as shown in FIG. 29B, a reduction peak potential $E_{pc}$ was −2.00 V and an oxidation peak potential $E_{pa}$ was −1.93 V. Therefore, a half-wave potential (an intermediate potential between $E_{pc}$ and $E_{pa}$) can be calculated to be −1.97 V. This demonstrates that BPAPQ is reduced by an electric energy of −1.97 [V vs. Ag/Ag$^+$], and this energy corresponds to the LUMO level. Here, as described above, the potential energy of the reference electrode used in Example 4 with respect to the vacuum level is −4.94 [eV]. Therefore, it is found that the LUMO level of BPAPQ is calculated as follows:

$$-4.94-(-1.97)=-2.97 \text{ [eV]}.$$

Measurement Example 2

Ir(Fdpq)$_2$(acac)

Figure 30A:
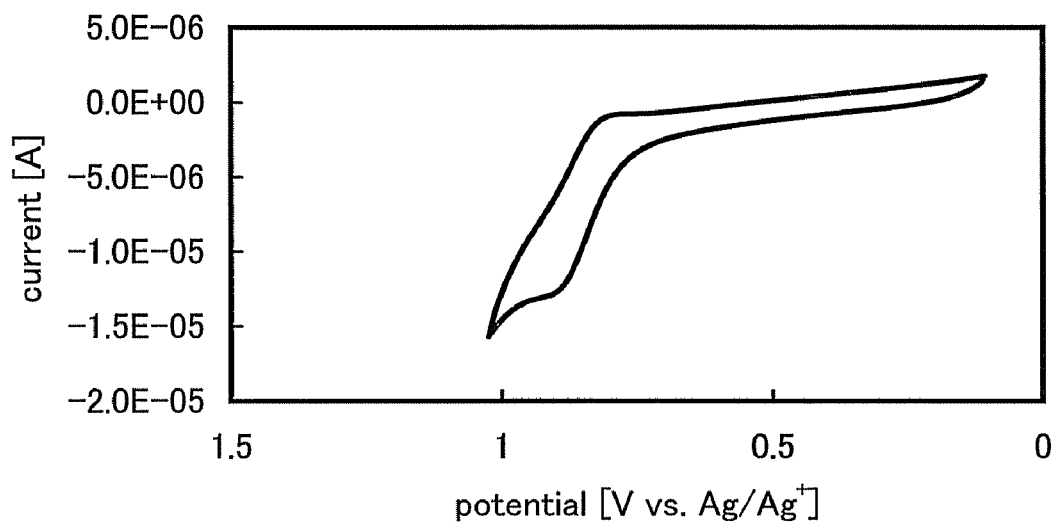
FIGS. 30A and 30B show CV characteristics of Ir(Fdpq)$_2$(acac).
Figure 30B:
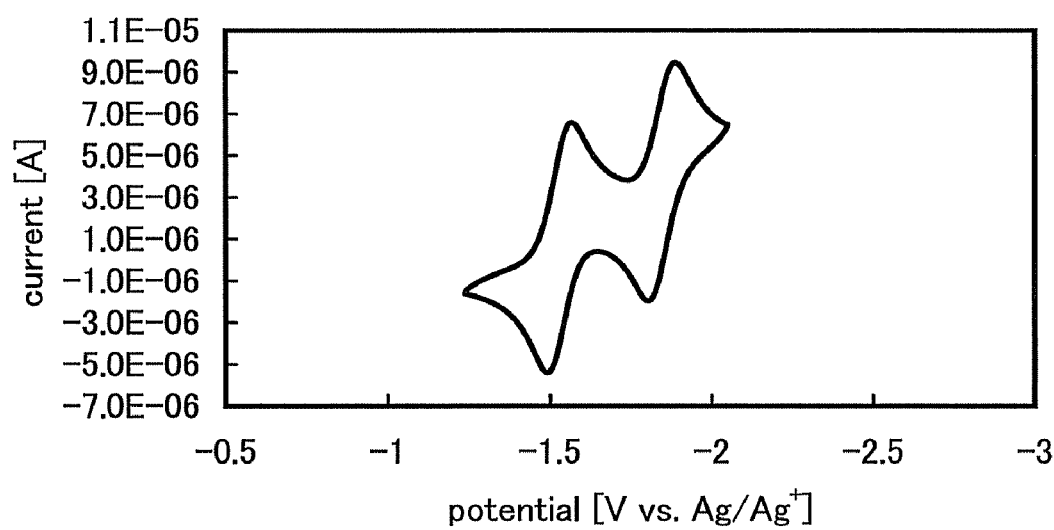

In Measurement Example 2, the oxidation characteristic and reduction characteristic of Ir(Fdpq)$_2$(acac) were examined by cyclic voltammetry (CV) measurement. FIGS. 30A and 30B show the measurement results. FIG. 30A shows the oxidation characteristic, and FIG. 30B shows the reduction characteristic. Note that for the measurement of the oxidation characteristic, the potential of the working electrode with respect to the reference electrode was scanned from 0.10 V to 1.00 V and then from 1.00 V to 0.10 V. Further, for the measurement of the reduction characteristic, the potential of the working electrode with respect to the reference electrode was scanned from −1.20 V to −2.05 V and then from −2.05 V to −1.20 V.

As shown in FIG. 30A, an oxidation peak potential $E_{pa}$ was 0.92 V and a reduction peak potential $E_{pc}$ was 0.79 V. Therefore, a half-wave potential (an intermediate potential between $E_{pc}$ and $E_{pa}$) can be calculated to be 0.86 V. This demonstrates that Ir(Fdpq)$_2$(acac) is oxidized by an electric energy of 0.86 [V vs. Ag/Ag$^+$], and this energy corresponds to the HOMO level. Here, as described above, the potential energy of the reference electrode used in Example 4 with respect to the vacuum level is −4.94 [eV]. Therefore, it is found that the HOMO level of Ir(Fdpq)$_2$(acac) is calculated as follows:

$$-4.94-(0.86)=-5.80 \text{ [eV]}.$$

Further, as shown in FIG. 30B, a reduction peak potential $E_{pc}$ was −1.56 V and an oxidation peak potential $E_{pa}$ was −1.49 V. Therefore, a half-wave potential (an intermediate potential between $E_{pc}$ and $E_{pa}$) can be calculated to be −1.53 V. This demonstrates that Ir(Fdpq)$_2$(acac) is reduced by an electric energy of −1.53 [V vs. Ag/Ag$^+$], and this energy corresponds to the LUMO level. Here, as described above, the potential energy of the reference electrode used in Example 4 with respect to the vacuum level is −4.94 [eV]. Therefore, it is found that the LUMO level of Ir(Fdpq)$_2$(acac) is calculated as follows:

$$-4.94-(-1.53)=-3.41 \text{ [eV]}.$$

Measurement Example 3

1'-TNATA

Figure 31:
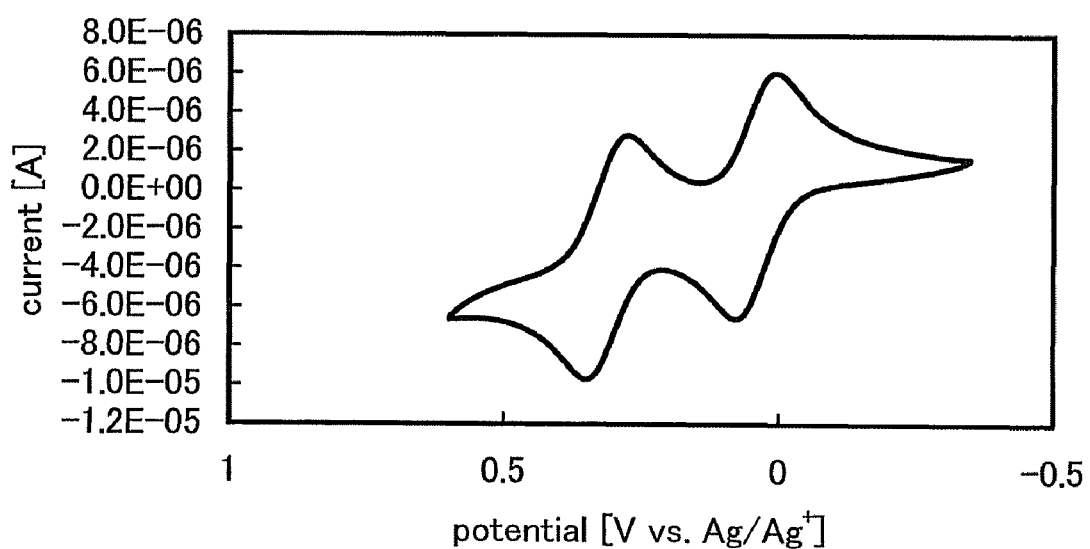
FIG. 31 shows a CV characteristic of 1'-TNATA.

In Measurement Example 3, the oxidation characteristic of 1'-TNATA was examined by cyclic voltammetry (CV) measurement. FIG. 31 shows the measurement results. FIG. 31 shows the oxidation characteristic. Note that for the measurement of the oxidation characteristic, the potential of the working electrode with respect to the reference electrode was scanned from −0.35 V to 0.60 V and then from 0.60 V to −0.35 V.

As shown in FIG. 31, an oxidation peak potential $E_{pa}$ was 0.08 V and a reduction peak potential $E_{pc}$ was 0.01 V. Therefore, a half-wave potential (an intermediate potential between $E_{pc}$ and $E_{pa}$) can be calculated to be 0.04 V. This demonstrates that 1'-TNATA was oxidized by an electric energy of 0.04 [V vs. Ag/Ag$^+$], and this energy corresponds to the HOMO level. Here, as described above, the potential energy of the reference electrode used in Example 4 with respect to the vacuum level is −4.94 [eV]. Therefore, it is found that the HOMO level of 1'-TNATA is calculated as follows:

$$-4.94-(0.04)=-4.98 \text{ [eV]}.$$

Measurement Example 4

DNTPD

Figure 32:
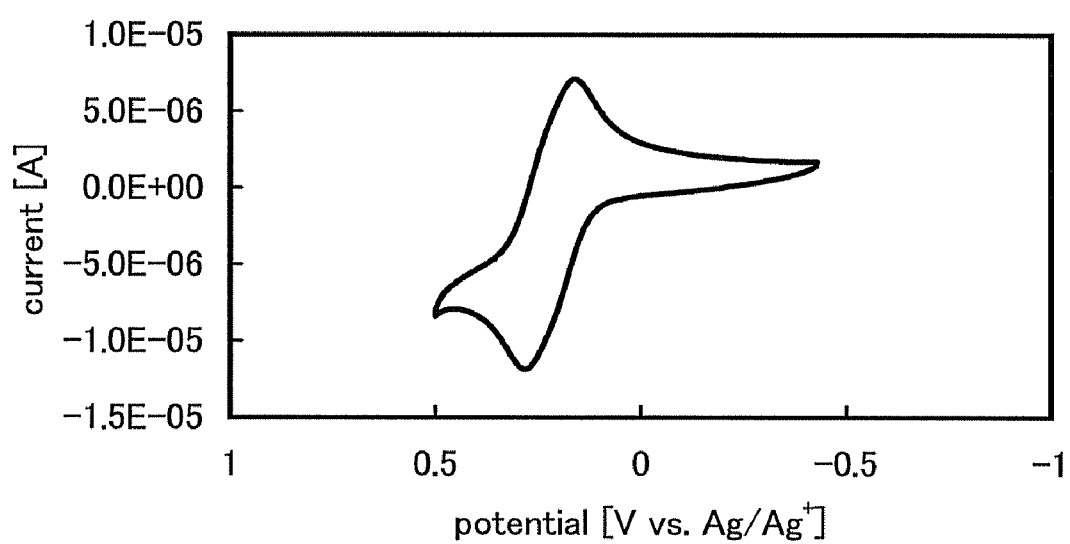
FIG. 32 shows a CV characteristic of DNTPD.

In Measurement Example 4, the oxidation characteristic of DNTPD were examined by cyclic voltammetry (CV) measurement. FIG. 32 shows the measurement results. FIG. 32 shows the oxidation characteristic. Note that for the measurement of the oxidation characteristic, the potential of the working electrode with respect to the reference electrode was scanned from −0.43 V to 0.50 V and then from 0.50 V to −0.43 V.

As shown in FIG. 32, an oxidation peak potential $E_{pa}$ was 0.28 V and a reduction peak potential $E_{pc}$ was 0.16 V. Therefore, a half-wave potential (an intermediate potential between $E_{pc}$ and $E_{pa}$) can be calculated to be 0.22 V. This demonstrates that DNTPD is oxidized by an electric energy of 0.22 [V vs. Ag/Ag$^+$], and this energy corresponds to the HOMO level. Here, as described above, the potential energy of the reference electrode used in Example 4 with respect to the vacuum level is −4.94 [eV]. Therefore, it is found that the HOMO level of DNTPD is calculated as follows:

$$-4.94-(0.22)=-5.16 \text{ [eV]}.$$

Measurement Example 5

CzPA

Figure 33A:
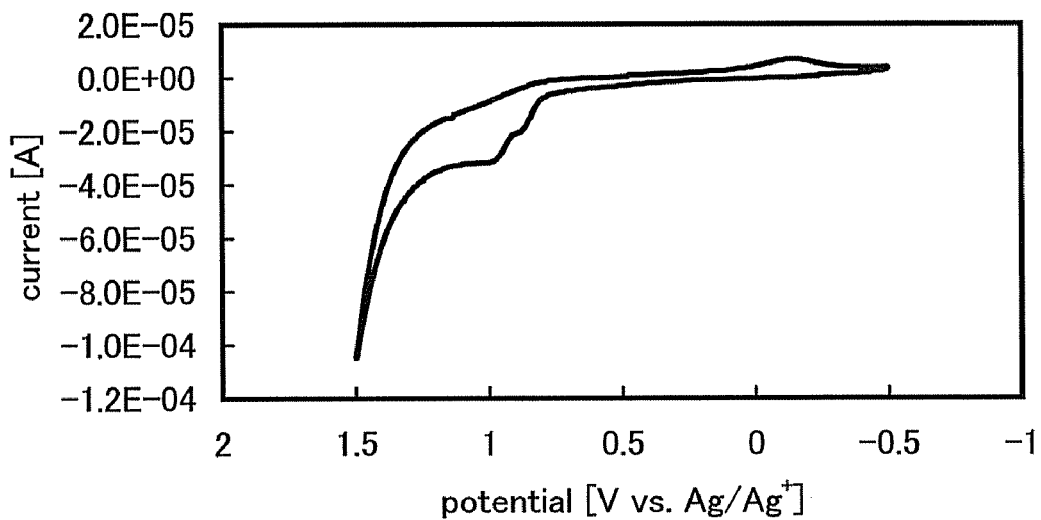
FIGS. 33A and 33B show CV characteristics of CzPA.
Figure 33B:
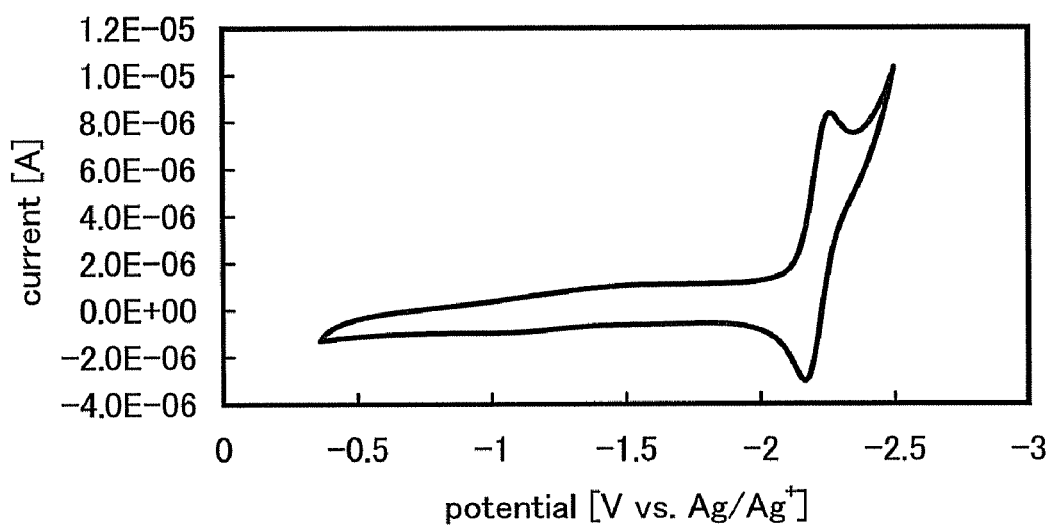

In Measurement Example 1, the oxidation characteristic and reduction characteristic of CzPA were examined by cyclic voltammetry (CV) measurement. FIGS. 33A and 33B show the measurement results. FIG. 33A shows the oxidation characteristic, and FIG. 33B shows the reduction characteristic. Note that for the measurement of the oxidation characteristic, the potential of the working electrode with respect to the reference electrode was scanned from 0.50 V to 1.50 V and then from 1.50 V to 0.50 V. Further, for the measurement of the reduction characteristic, the potential of the working electrode with respect to the reference electrode was scanned from −0.36 V to −2.50 V and then from −2.50 V to −0.36 V.

As shown in FIG. 33A, an oxidation peak potential $E_{pa}$ was 0.92 V and a reduction peak potential $E_{pc}$ was 0.79 V. Therefore, a half-wave potential (an intermediate potential between $E_{pc}$ and $E_{pa}$) can be calculated to be 0.85 V. This demonstrates that CzPA is oxidized by an electric energy of 0.85 [V vs. Ag/Ag$^+$], and this energy corresponds to the HOMO level. Here, as described above, the potential energy of the reference electrode used in Example 4 with respect to the vacuum level is −4.94 [eV]. Therefore, it is found that the HOMO level of CzPA is calculated as follows:

$$-4.94-(0.85)=-5.79\ [\text{eV}].$$

Further, as shown in FIG. 33B, a reduction peak potential $E_{pc}$ was −2.26 V and an oxidation peak potential $E_{pa}$ was −2.17 V. Therefore, a half-wave potential (an intermediate potential between $E_{pc}$ and $E_{pa}$) can be calculated to be −2.21 V. This demonstrates that CzPA is reduced by an electric energy of −2.73 [V vs. Ag/Ag$^+$], and this energy corresponds to the LUMO level. Here, as described above, the potential energy of the reference electrode used in Example 4 with respect to the vacuum level is −4.94 [eV]. Therefore, it is found that the LUMO level of CzPA is calculated as follows:

$$-4.94-(-2.21)=-2.73\ [\text{eV}].$$

Measurement Example 6

2PCAPA

Figure 34A:
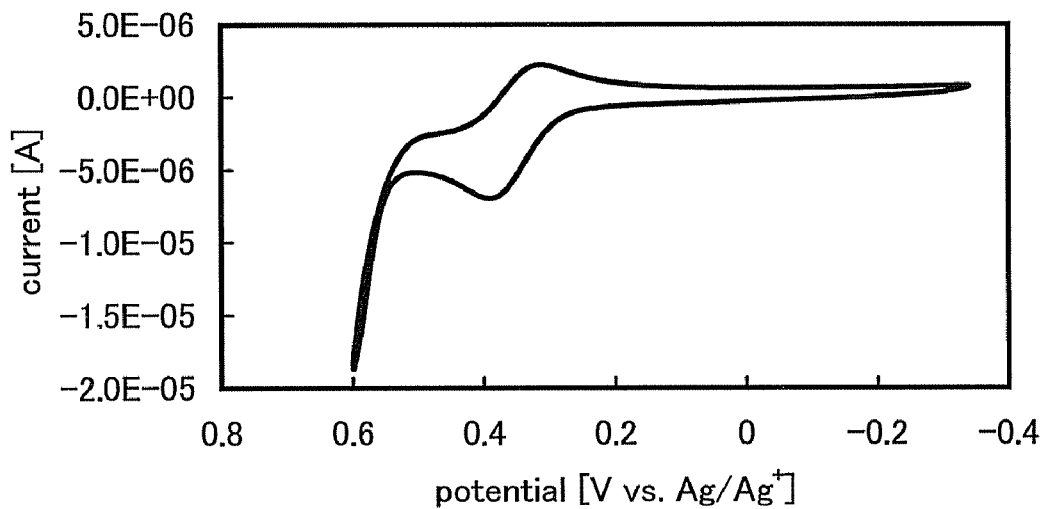
FIGS. 34A and 34B show CV characteristics of 2PCAPA.
Figure 34B:
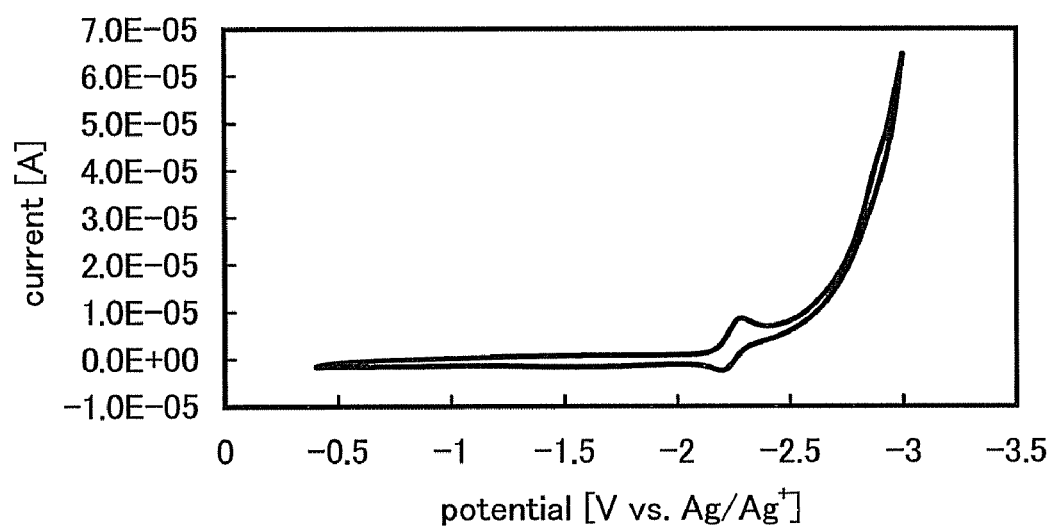

In Measurement Example 6, the oxidation characteristic and reduction characteristic of 2PCAPA were examined by cyclic voltammetry (CV) measurement. FIGS. 34A and 34B show the measurement results. FIG. 34A shows the oxidation characteristic, and FIG. 34B shows the reduction characteristic. Note that for the measurement of the oxidation characteristic, the potential of the working electrode with respect to the reference electrode was scanned from 0.34 V to 0.60 V and then from 0.60 V to 0.34 V. Further, for the measurement of the reduction characteristic, the potential of the working electrode with respect to the reference electrode was scanned from −0.43 V to −3.00 V and then from −3.00 V to −0.43 V.

As shown in FIG. 34A, an oxidation peak potential $E_{pa}$ was 0.39 V and a reduction peak potential $E_{pc}$ was 0.31 V. Therefore, a half-wave potential (an intermediate potential between $E_{pc}$ and $E_{pa}$) can be calculated to be 0.35 V. This demonstrates that 2PCAPA is oxidized by an electric energy of 0.35 [V vs. Ag/Ag$^+$], and this energy corresponds to the HOMO level. Here, as described above, the potential energy of the reference electrode used in Example 4 with respect to the vacuum level is −4.94 [eV]. Therefore, it is found that the HOMO level of 2PCAPA is calculated as follows:

$$-4.94-(0.35)=-5.34\ [\text{eV}].$$

Further, as shown in FIG. 34B, a reduction peak potential $E_{pc}$ was −2.29 V and an oxidation peak potential $E_{pa}$ was −2.20 V. Therefore, a half-wave potential (an intermediate potential between $E_{pc}$ and $E_{pa}$) can be calculated to be −2.24 V. This demonstrates that 2PCAPA is reduced by an electric energy of −2.24 [V vs. Ag/Ag$^+$], and this energy corresponds to the LUMO level. Here, as described above, the potential energy of the reference electrode used in Example 4 with respect to the vacuum level is −4.94 [eV]. Therefore, it is found that the LUMO level of 2PCAPA is calculated as follows:

$$-4.94-(-2.24)=-2.70\ [\text{eV}].$$

Measurement Example 7

DPQd

Figure 35:
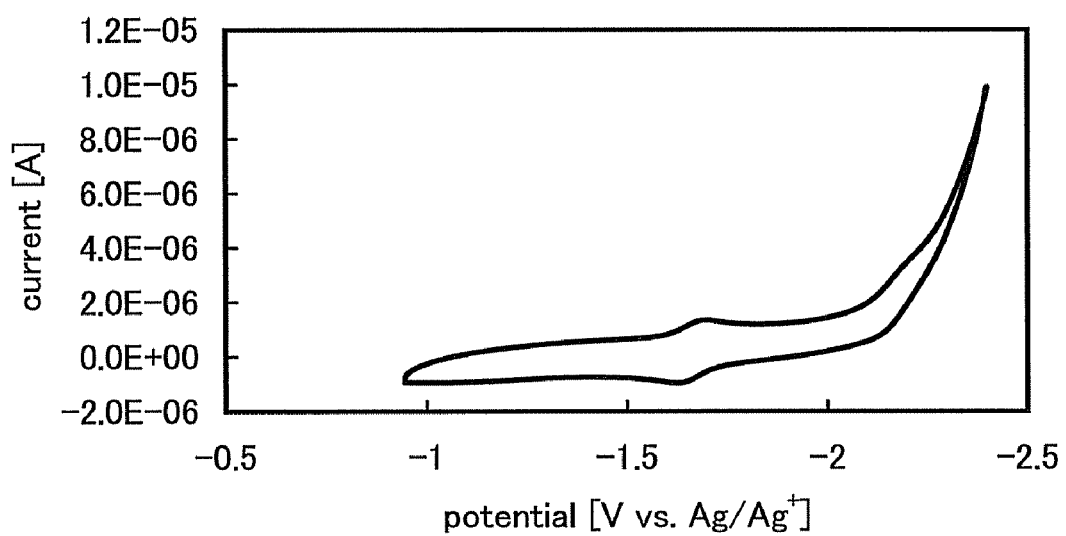
FIG. 35 shows a CV characteristic of DPQd.

In Measurement Example 7, the reduction characteristic of DPQd was examined by cyclic voltammetry (CV) measurement. FIG. 35 shows the measurement results. FIG. 35 shows the reduction characteristic. Note that for the measurement of the reduction characteristic, the potential of the working electrode with respect to the reference electrode was scanned from −0.94 V to −2.40 V and then from −2.40 V to −0.94 V.

Further, as shown in FIG. 35, a reduction peak potential $E_{pc}$ was −1.70 V and an oxidation peak potential $E_{pa}$ was −1.62 V. Therefore, a half-wave potential (an intermediate potential between $E_{pc}$ and $E_{pa}$) can be calculated to be −1.66 V. This demonstrates that DPQd is reduced by an electric energy of −1.66 [V vs. Ag/Ag$^+$], and this energy corresponds to the LUMO level. Here, as described above, the potential energy of the reference electrode used in Example 4 with respect to the vacuum level is −4.94 [eV]. Therefore, it is found that the LUMO level of DPQd is calculated as follows:

$$-4.94-(-1.66)=-3.28\ [\text{eV}].$$

Example 5

In Example 5, an example of fabricating a light-emitting element of an embodiment of the present invention will be specifically described. Structural formulae of materials used in Example 5 are illustrated below. Note that the structural formulae of the materials which have already been illustrated in other Examples are omitted.

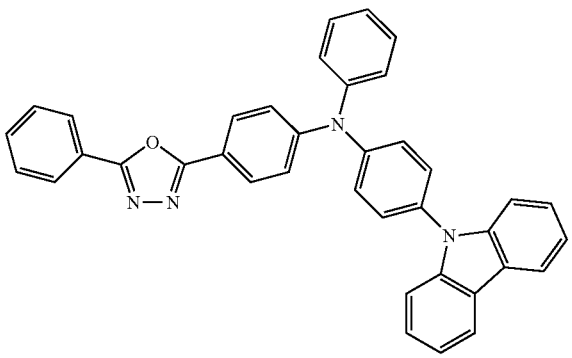

YGAO11

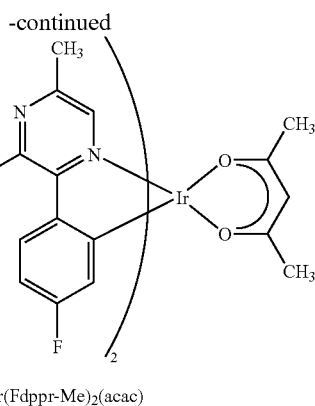

Ir(Fdppr-Me)₂(acac)

Hereinafter, specific methods of fabricating light-emitting elements of Example 5 are described.

(Light-Emitting Element 5)

First, a glass substrate on which a 110-nm-thick indium tin silicon oxide (ITSO) film was formed as an anode was prepared. The periphery of a surface of the ITSO film was covered with a polyimide film so that a 2 mm square portion of the surface was exposed. The electrode area was set to 2 mm×2 mm. As a pretreatment for forming the light-emitting element over this substrate, the surface of the substrate was washed with water and baked at 200° C. for one hour, and then a UV ozone treatment was performed for 370 seconds. Then, the substrate was transferred into a vacuum evaporation apparatus where the pressure was reduced to about $10^{-5}$ Pa. In a heating chamber of the vacuum evaporation apparatus, baking was performed at 170° C. for 30 minutes in vacuum. After that, the substrate was cooled down for about 30 minutes.

Next, the glass substrate provided with the anode was fixed to a substrate holder provided in a film formation chamber of the vacuum evaporation apparatus such that the surface on which the anode was formed faced downward.

Then, first of all, 4-(9H-carbazol-9-yl)-4'-(5-phenyl-1,3,4-oxadiazol-2-yl)triphenylamine (abbreviation: YGAO11) and molybdenum(VI) oxide were co-evaporated on the anode, whereby a hole-inject region to which molybdenum oxide, which is the electron-accepting substance, was added was formed. Resistance heating was used for the evaporation. The thickness of the hole-inject region was set to 50 nm, and the evaporation rate was adjusted such that the weight ratio of YGAO11 to molybdenum oxide was 1:0.5 (=YGAO11 molybdenum oxide). Note that a co-evaporation method refers to an evaporation method by which evaporation of a plurality of materials is conducted from a plurality of evaporation sources at the same time in one treatment chamber.

Successively, by an evaporation method using resistance heating, a 10-nm film was formed using only YGAO11 and then YGAO11 and 4,4',4"-tris[N-(1-naphthyl)-N-phenylamino]triphenylamine (abbreviation: 1'-TNATA) were co-evaporated, whereby a hole-transport region to which 1'-TNATA, which was the hole-trapping substance, was added was formed. The thickness of the hole-transport region was set to 10 nm, and the evaporation rate was adjusted such that the weight ratio of YGAO11 to 1'-TNATA was 1:0.005 (=YGAO11:1'-TNATA).

Next, YGAO11 and (acetylacetonato)bis[2,3-bis(4-fluorophenyl)-5-methylpyrazinato]iridium(III) (abbreviation: Ir(Fdppr-Me)₂(acac)) were co-evaporated, whereby a light-emitting region to which Ir(Fdppr-Me)₂(acac), which is a light-emitting substance, was added was formed. The thickness of the light-emitting region was set to 30 nm, and the evaporation rate was adjusted such that the weight ratio of YGAO11 to Ir(Fdppr-Me)₂(acac) was 1:0.05 (=YGAO11:Ir(Fdppr-Me)₂(acac)).

Furthermore, a 10-nm film was formed using only YGAO11, and then YGAO11 and lithium (Li) were co-evaporated, whereby an electron-inject region to which lithium, which is the electron-donating substance, was added was formed. The thickness of the electron-inject region was set to 40 nm, and the evaporation rate was adjusted such that the weight ratio of YGAO11 to lithium was 1:0.02 (=YGAO11: lithium).

Lastly, a 200-nm-thick aluminum film was formed on the electron-inject region by an evaporation method using resistance heating, whereby the cathode was formed. Thus, the light-emitting element 5 was fabricated.

(Light-Emitting Element 6)

A light-emitting element 6 was fabricated using the same kind of substrate as the light-emitting element 5 with the weight ratio of YGAO11 to 1'-TNATA being 1:0.01 (=YGAO11:1'-TNATA) in the hole-transport region to which the hole-transporting substance was added. The light-emitting element 6 was fabricated in a manner similar to that of the light-emitting element 5 except the hole-transport region to which the hole-trapping substance was added.

(Comparative Light-Emitting Element 7)

For a comparative light-emitting element 7, the same kind of substrate as the light-emitting element 5 was used, and the hole-transport region to which the hole-trapping substance was added was not provided. That is, the comparative light-emitting element 7 was fabricated in a manner similar to that of the light-emitting element 5 except that 1'-TNATA was not added.

The thus obtained light-emitting elements 5 and 6 and comparative light-emitting element 7 were sealed in a glove box containing a nitrogen atmosphere so as not to be exposed to air. Then, operation characteristics of these light-emitting elements were measured. Note that the measurement was carried out at room temperature (in the atmosphere kept at 25° C.).

Figure 38A:
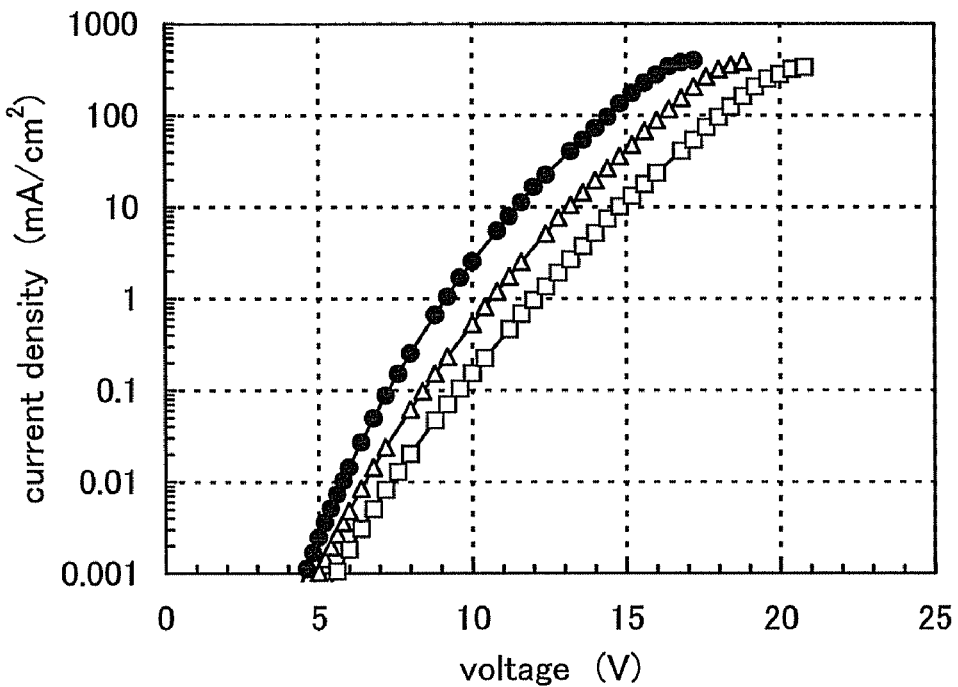
FIGS. 38A and 38B show characteristics of light-emitting elements of Example 5.
Figure 38B:
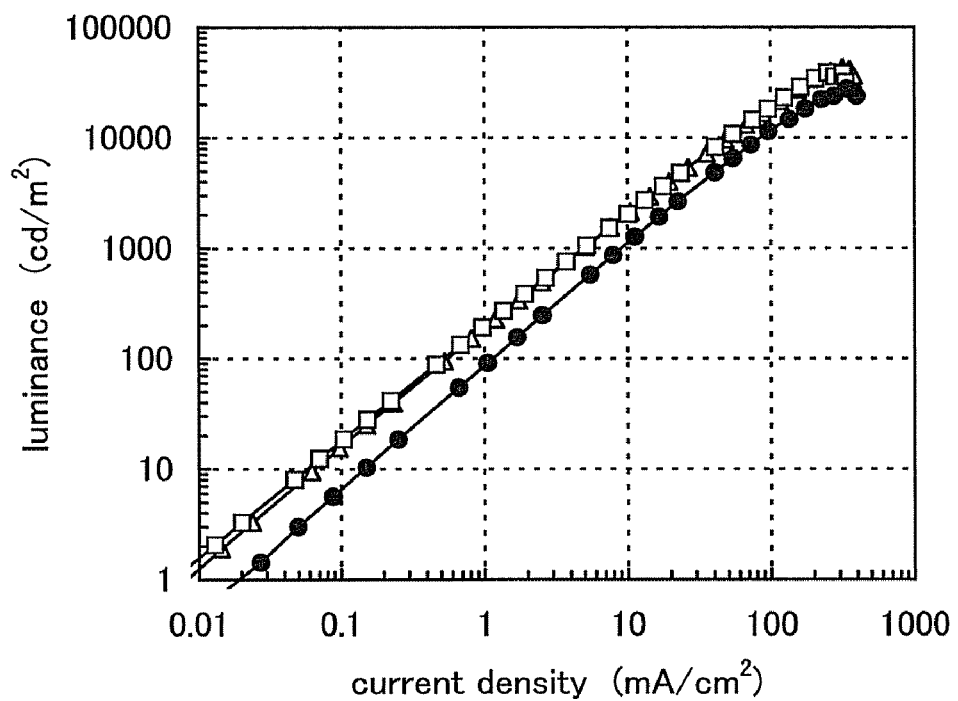
Figure 39A:
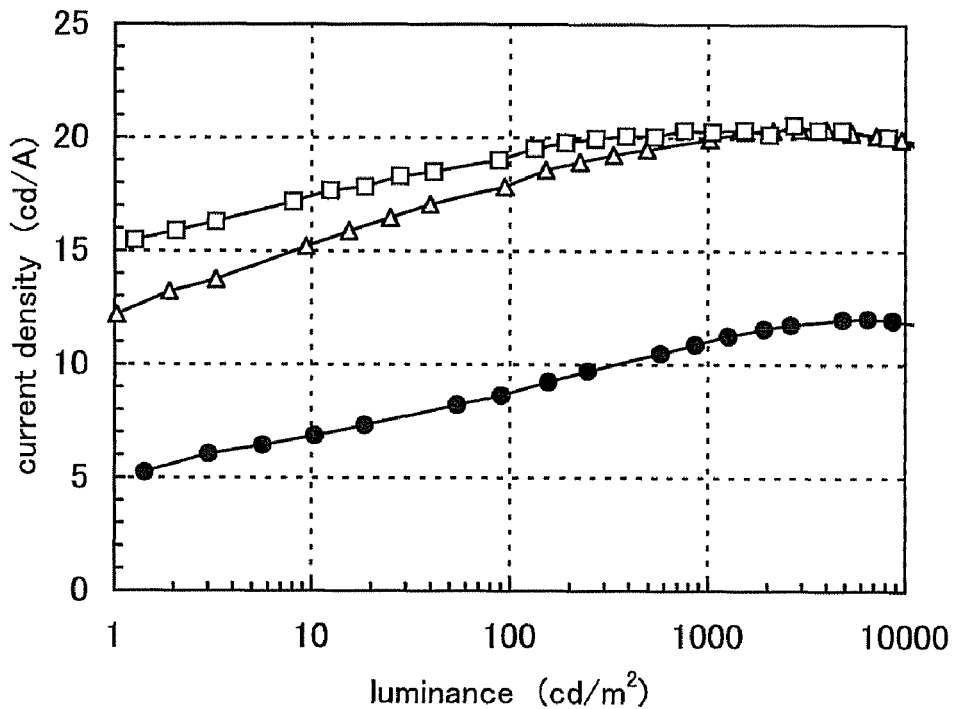
FIGS. 39A and 39B show characteristics of the light-emitting elements of Example 5.
Figure 39B:
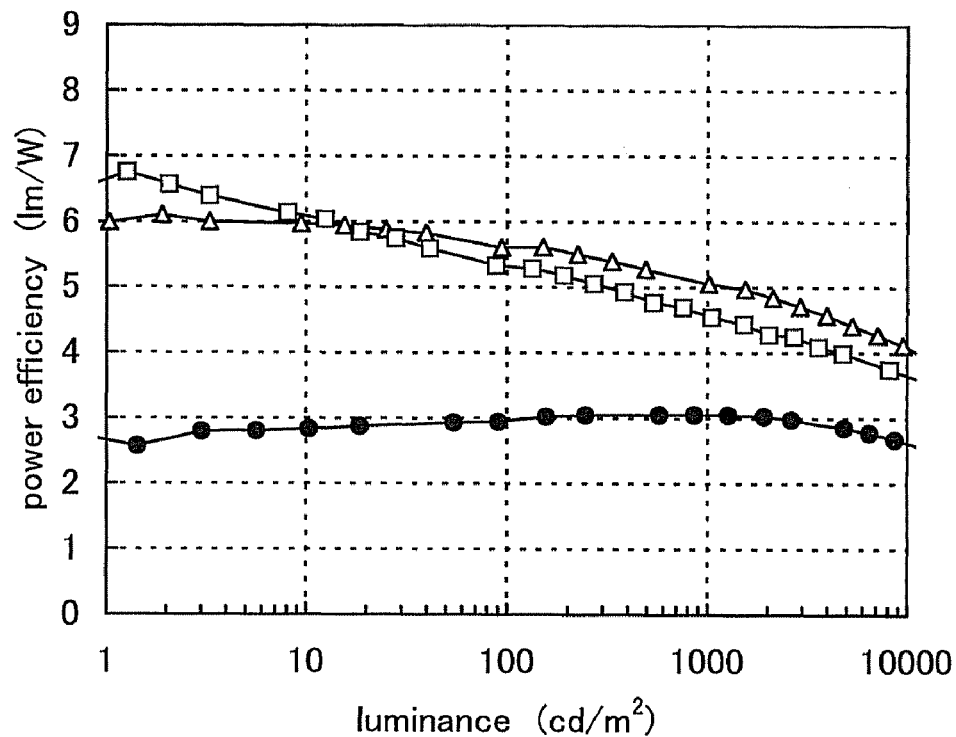
Figure 40:
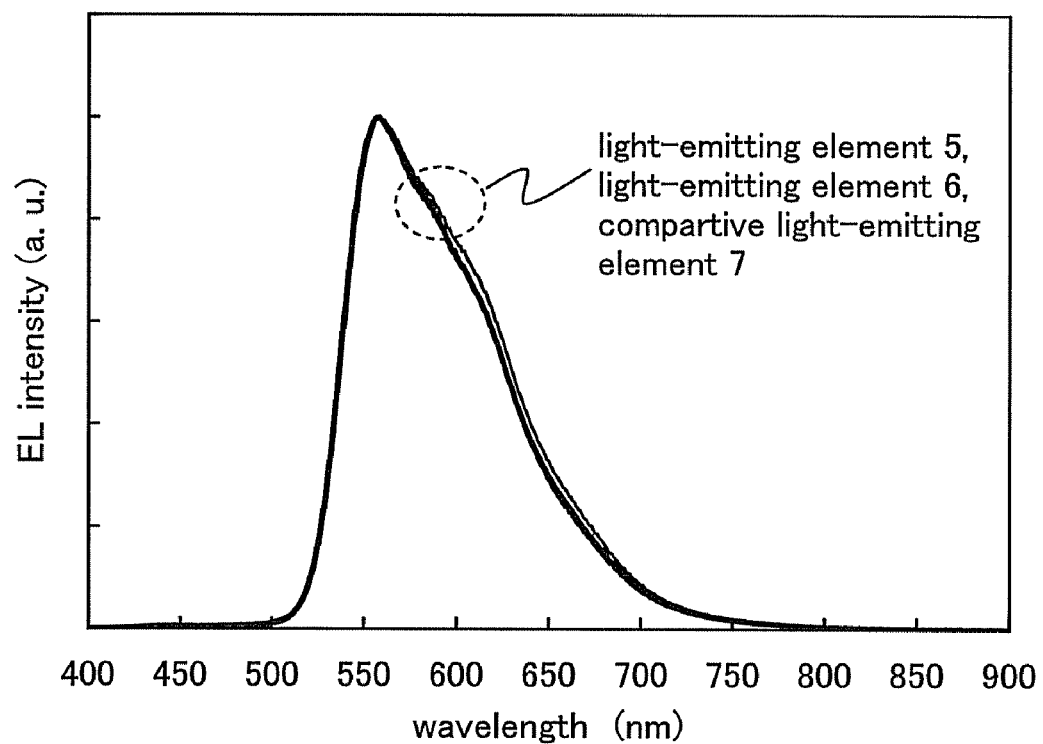
FIG. 40 shows characteristics of the light-emitting elements of Example 5.

FIG. 38A shows the voltage vs. current density characteristics of the light-emitting elements 5 and 6 and the comparative light-emitting element 7, and FIG. 38B shows the current density vs. luminance characteristics thereof. FIG. 39A shows the luminance vs. current efficiency characteristics of the light-emitting elements 5 and 6 and the comparative light-emitting element 7, and FIG. 39B shows the luminance vs. power efficiency characteristics thereof. In FIG. 38A to FIG. 39B, the open triangle (Δ), the open square (□), and the bold circle (●) correspond to the light-emitting element 5, the light-emitting element 6, and the comparative light-emitting element 7, respectively. FIG. 40 shows the emission spectra when the light-emitting elements 5 and 6 and the comparative light-emitting element 7 were emitted by a current at a current density of 25 mA/cm As apparent from FIG. 40, each light-emitting element exhibits yellow light emission (an emission peak wavelength of 560 nm) from Ir(Fdppr-Me)₂(acac), which is the light-emitting substance.

However, as apparent from FIGS. 38A and 38B, although a large amount of current flows through the comparative light-emitting element 7, the luminance thereof is low, in comparison with the light-emitting elements 5 and 6. Thus, as also can be seen from FIG. 39A, there is a large difference in current efficiency. The light-emitting elements 5 and 6 of the embodiment of the present invention each can achieve a high current efficiency, whereas the current efficiency of the comparative light-emitting element 7 is low. For example, at a luminance of 500 cd/m², the current efficiency of each of the elements 5 and 6 is about 20 cd/A while the current efficiency of the comparative light-emitting element 7 is about 10 cd/A. In other words, just by adding a slight amount of the hole-trapping substance, the current efficiency of each of the light-emitting elements 5 and 6 of the present invention is improved by almost two-fold. It is found that, as a result, at a luminance of 500 cd/m$^2$, the power efficiency is improved from about 3.0 lm/W to 5.0 lm/W and thus the power consumption is reduced by about half.

Explanation for these results will be given below. Table 4 below shows the HOMO levels and LUMO levels of YGAO11 and Ir(Fdppr-Me)$_2$(acac) and also the HOMO level of 1'-TNATA. Note that the HOMO levels and LUMO levels were calculated by cyclic voltammetry (CV) measurement (see Example 8).

TABLE 4

| Substance Name | HOMO (eV) | LUMO (eV) |
| --- | --- | --- |
| YGAO11 | −5.58 | −2.49 |
| Ir(Fdppr-Me)$_2$(acac) | −5.59 | −2.85 |
| 1'-TNATA | −4.98 | — |

As can be seen from Table 4, in the light-emitting region obtained by adding YGAO11 to Ir(Fdppr-Me)$_2$(acac), Ir(Fdppr-Me)$_2$(acac) has a strong tendency to trap electrons but scarcely traps holes. Thus, the light-emitting region tends to allow holes to be transported to the cathode. Besides, it is plausible that in each of the light-emitting elements 5 and 6 of the embodiment of the present invention, holes which easily pass through the light-emitting region are trapped by the added 1'-TNATA so that the recombination efficiency is increased, which contributes to the improved emission efficiency.

From the above-described results, it is understood that, by applying the element structure of a light-emitting element of the embodiment of the present invention, although it is a simple element structure, high emission efficiency can be obtained.

Example 6

In Example 6, an example of fabricating a light-emitting element of the embodiment of the present invention will be specifically described. Hereinafter, specific methods of fabricating light-emitting elements of Example 6 are described.
(Light-Emitting Element 8)

First, a glass substrate (the same kind of substrate as the substrate used for fabrication of the light-emitting element 1 and the comparative light-emitting element 2 of Example 1) on which an indium tin silicon oxide (ITSO) film was formed to a thickness of 110 nm as an anode was prepared. The periphery of a surface of the ITSO film was covered with a polyimide film so that a 2 mm square portion of the surface was exposed. The electrode area was set to 2 mm×2 mm. As a pretreatment for forming the light-emitting element over this substrate, the surface of the substrate was washed with water and baked at 200° C. for one hour, and then a UV ozone treatment was performed for 370 seconds. Then, the substrate was transferred into a vacuum evaporation apparatus where the pressure was reduced to about 10$^{-5}$ Pa. In a heating chamber of the vacuum evaporation apparatus, baking was performed at 170° C. for 30 minutes in vacuum. After that, the substrate was cooled down for about 30 minutes.

Next, the glass substrate provided with the anode was fixed to a substrate holder provided in a film formation chamber of the vacuum evaporation apparatus such that the surface on which the anode was formed faced downward.

Then, first of all, N,N'-(quinoxaline-2,3-diyldi-4,1-phenylene)bis(N-phenyl-1,1'-biphenyl-4-amine) (abbreviation: BPAPQ) and molybdenum(VI) oxide were co-evaporated on the anode, whereby the hole-inject region to which molybdenum oxide, which was the electron-accepting substance, was added was formed. Resistance heating was used for the evaporation. The thickness of the hole-inject region was set to 50 nm, and the evaporation rate was adjusted such that the weight ratio of BPAPQ to molybdenum oxide was 1:0.5 (=BPAPQ:molybdenum oxide). Note that a co-evaporation method refers to an evaporation method by which evaporation of a plurality of materials is conducted from a plurality of evaporation sources at the same time in one treatment chamber.

Successively, by an evaporation method using resistance heating, a 10-nm film was formed using only BPAPQ and then BPAPQ and 4,4',4"-tris[N-(1-naphthyl)-N-phenylamino]triphenylamine (abbreviation: 1'-TNATA) were co-evaporated, whereby the hole-transport region to which 1'-TNATA, which was the hole-trapping substance, was added was formed. The thickness of the hole-transport region was set to 10 nm, and the evaporation rate was adjusted such that the weight ratio of BPAPQ to 1'-TNATA was 1:0.05 (=BPAPQ:1'-TNATA).

Next, BPAPQ and (acetylacetonato)bis[2,3-bis(4-fluorophenyl)quinoxalinato]iridium(III) (abbreviation: Ir(Fdpq)$_2$(acac)) were co-evaporated, whereby the light-emitting region to which Ir(Fdpq)$_2$(acac), which is the light-emitting substance, was added was formed. The thickness of the light-emitting region was set to 30 nm, and the evaporation rate was adjusted such that the weight ratio of BPAPQ to Ir(Fdpq)$_2$(acac) was 1:0.08 (=BPAPQ:Ir(Fdpq)$_2$(acac)).

Furthermore, a 10-nm film was formed using only BPAPQ, and then BPAPQ and lithium (Li) were co-evaporated, whereby the electron-inject region to which lithium, which is the electron-donating substance, was added was formed. The thickness of the electron-inject region was set to 50 nm, and the evaporation rate was adjusted such that the weight ratio of BPAPQ to lithium was 1:0.01 (=BPAPQ:lithium).

Lastly, a 200-nm-thick aluminum film was formed on the electron-inject region by an evaporation method using resistance heating, whereby the cathode was formed. Thus, the light-emitting element 8 was fabricated.

The thus obtained light-emitting element 8 was sealed in a glove box containing a nitrogen atmosphere so as not to be exposed to air. Then, operation characteristics of this light-emitting element were measured. Note that the measurement was carried out at room temperature (in the atmosphere kept at 25° C.).

Figure 41A:
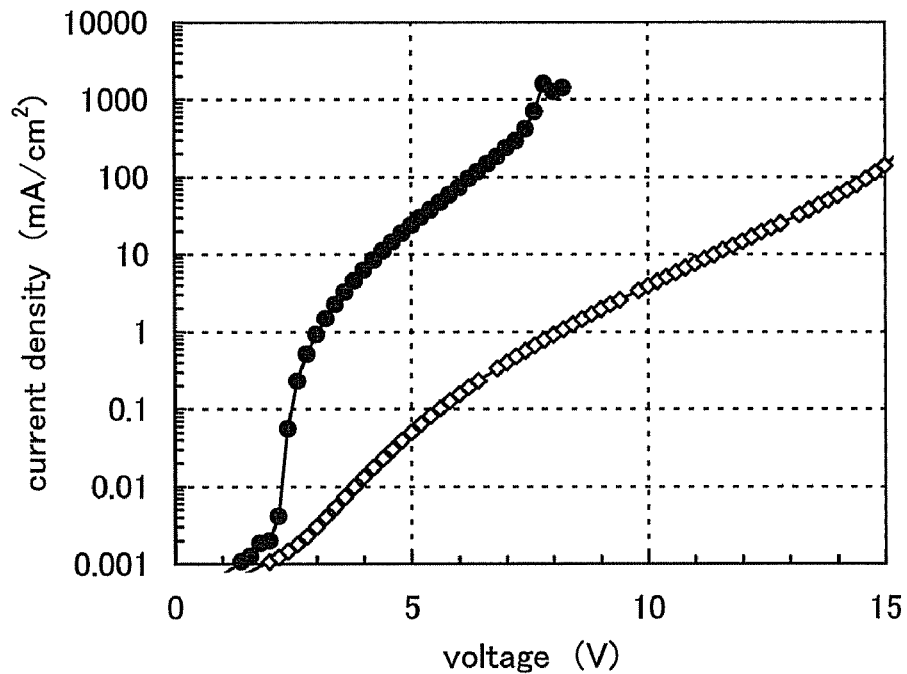
FIGS. 41A and 41B show characteristics of a light-emitting element of Example 6.
Figure 41B:
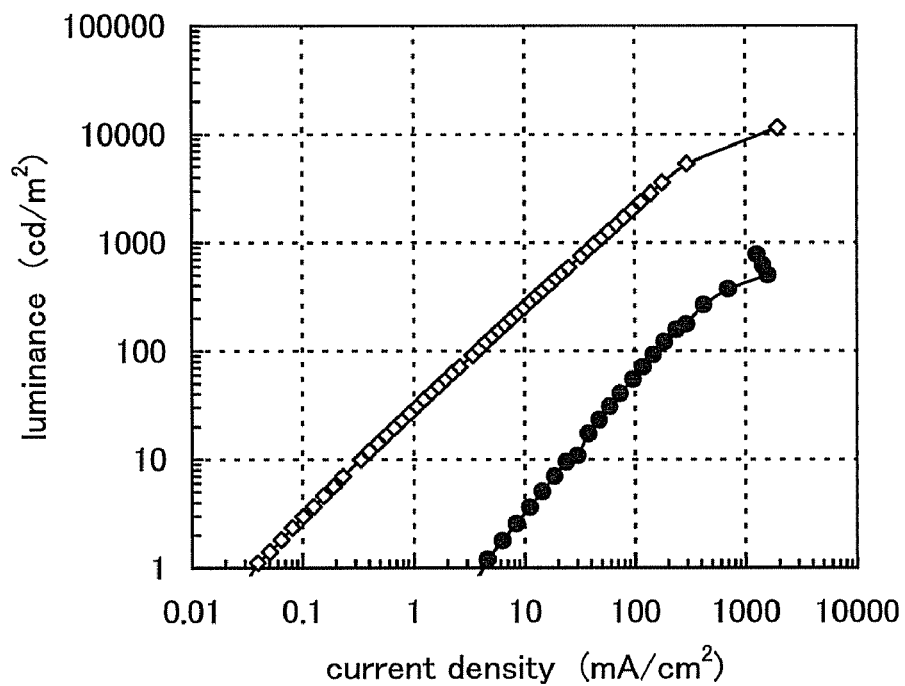
Figure 42A:
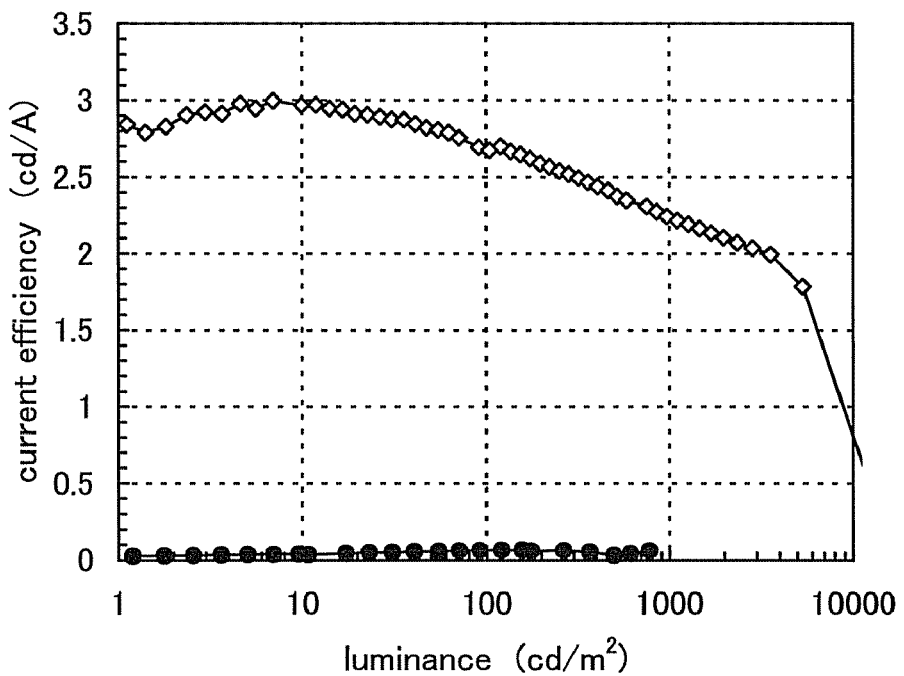
FIGS. 42A and 42B show characteristics of the light-emitting element of Example 6.
Figure 42B:
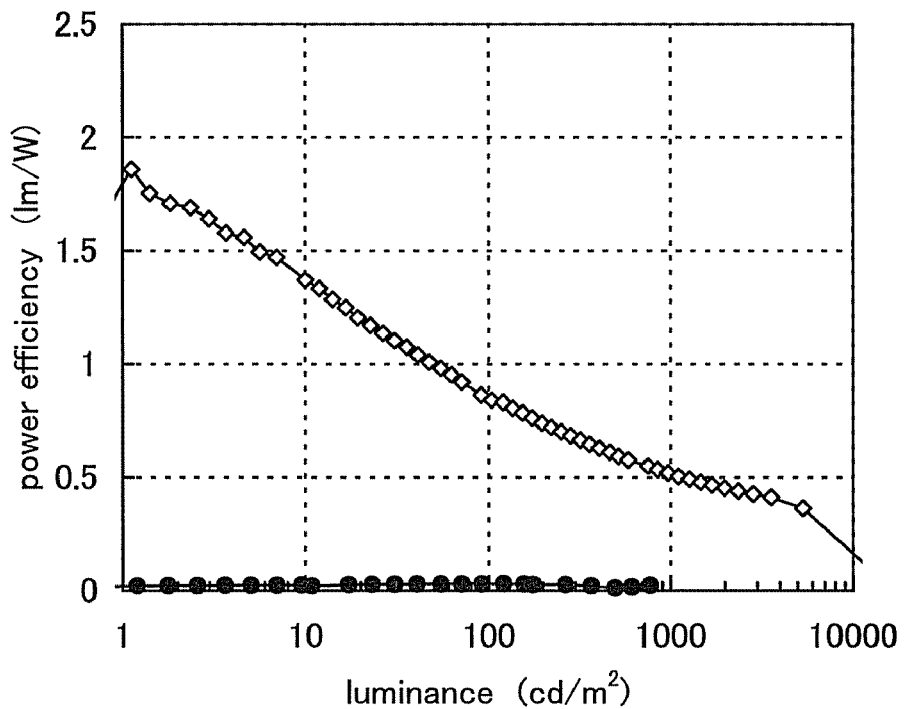
Figure 43A:
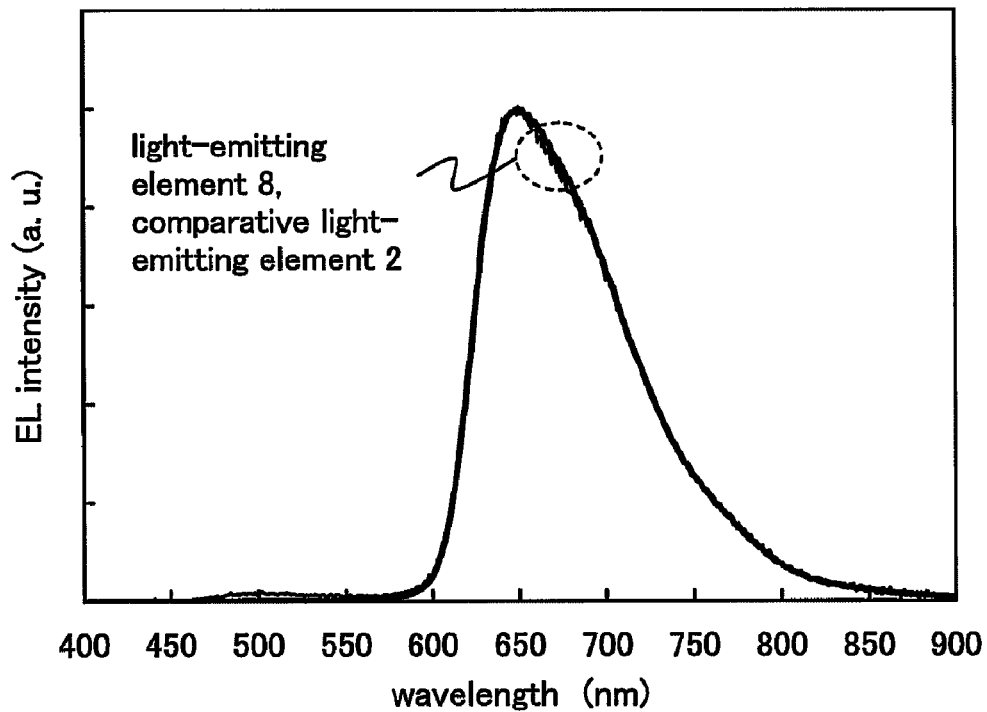
FIGS. 43A and 43B show characteristics of the light-emitting element of Example 6.
Figure 43B:
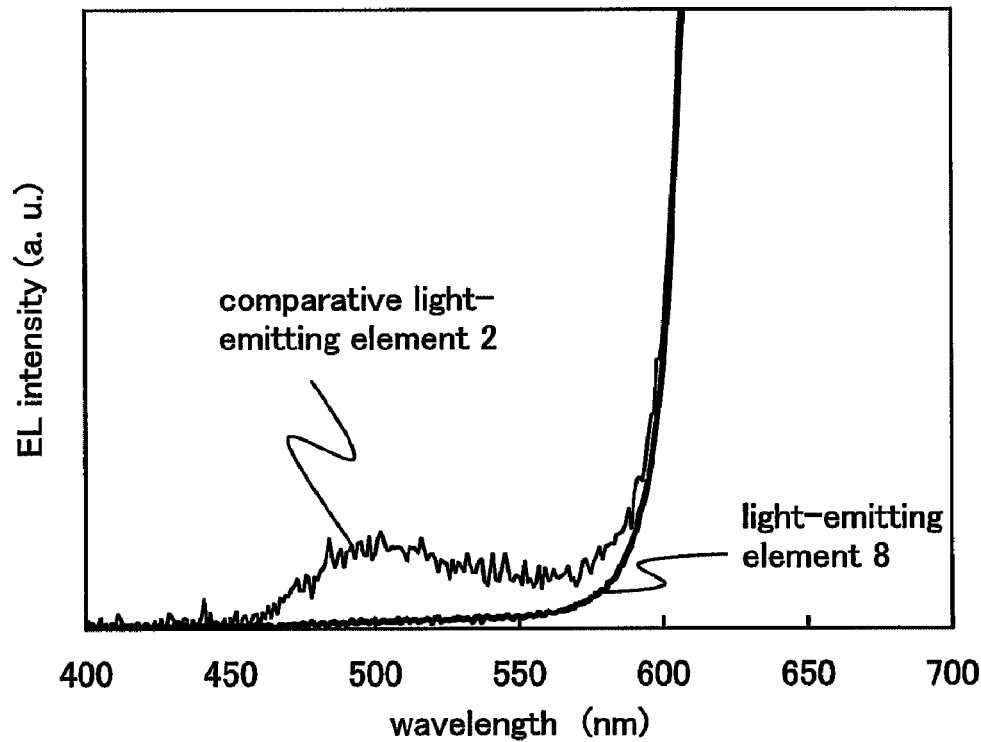

FIG. 41A shows the voltage vs. current density characteristics of the light-emitting element 8, and FIG. 41B shows the current density vs. luminance characteristics thereof. FIG. 42A shows the luminance vs. current efficiency characteristics of the light-emitting element 8, and FIG. 42B shows the luminance vs. power efficiency characteristics thereof. In FIG. 41A to FIG. 42B, the open lozenge (◊) and the bold circle (●) correspond to the light-emitting element 8 and the comparative light-emitting element 2, respectively. FIGS. 43A and 43B show the emission spectrum when the light-emitting element 8 was driven to emit light by a current at a current density of 25 mA/cm$^2$. FIG. 43B is an enlarged view of FIG. 43A. FIGS. 41A and 41B, FIGS. 42A and 42B, and FIGS. 43A and 43B show also the characteristics of the comparative light-emitting element 2 fabricated in Example 1 for comparison. As apparent from FIGS. 43A and 43B, the light-emitting element 8 exhibits red light emission (an emission peak wavelength of 650 nm) from Ir(Fdpq)$_2$(acac) which is the light-emitting substance.

However, as apparent from FIGS. 41A and 41B, although a large amount of current flows through the comparative light-emitting element 2, the luminance thereof is low, in comparison with the light-emitting element 8. Thus, as also can be seen from FIG. 42A, there is an extremely remarkable difference in current efficiency. The light-emitting element 8 of the present invention can achieve a high current efficiency, whereas the current efficiency of the comparative light-emitting element 2 is drastically low. For example, at a luminance of 500 cd/m$^2$, the current efficiency of the light-emitting element 8 is 2.4 cd/A while the current efficiency of the comparative light-emitting element 2 is about 0.05 cd/A. In other words, just by adding a slight amount of the hole-trapping substance, the current efficiency of the light-emitting element 8 of the present invention is improved by almost 50-fold. It is found that, as a result, at a luminance of 500 cd/m$^2$, the power efficiency is improved from about 0.02 lm/W to 0.60 lm/W and thus the power consumption is reduced to one-thirtieth or less.

As described in Example 1, in the light-emitting region obtained by adding BPAPQ to Ir(Fdpq)$_2$(acac), Ir(Fdpq)$_2$(acac) has a strong tendency to trap electrons but scarcely traps holes. Thus, the light-emitting region tends to allow holes to be transported to the cathode. Indeed, in FIG. 43B, unnecessary light emission from the comparative light-emitting element 2 was observed at around 500 nm. This is probably due to a phenomenon in which holes passing through the light-emitting region recombine with electrons in the layer containing only BPAPQ between the light-emitting region and the electron-inject to allow BPAPQ to emit light. Besides, it is plausible that in the light-emitting element 8 of the present invention, holes which easily pass through the light-emitting region are trapped by the added 1'-TNATA so that the recombination efficiency is increased; thus, the emission efficiency is significantly improved without light emission from BPAPQ.

From the above-described results, it is understood that, by applying the element structure of a light-emitting element of the embodiment of the present invention, although it is a simple element structure, the emission efficiency can be significantly increased.

Furthermore, tests were performed in which the light-emitting element 8 was continuously lit by constant current driving. First, the light-emitting element 8 was emitted at a current of 0.8 mA (at a current density of 20 mA/cm$^2$) for 48 hours and subjected to an aging treatment. Although the initial luminance was about 500 cd/m$^2$, the current efficiency was improved by 3.6-fold by the aging treatment. Accordingly, after 48 hours, the luminance was increased to about 1800 d/m$^2$. At this time, the current efficiency was 9.0 cd/A and the external quantum efficiency was 21%. This demonstrates that, for driving of a light-emitting element of the present invention, an aging treatment is effective to stabilize the current efficiency.

Figure 44:
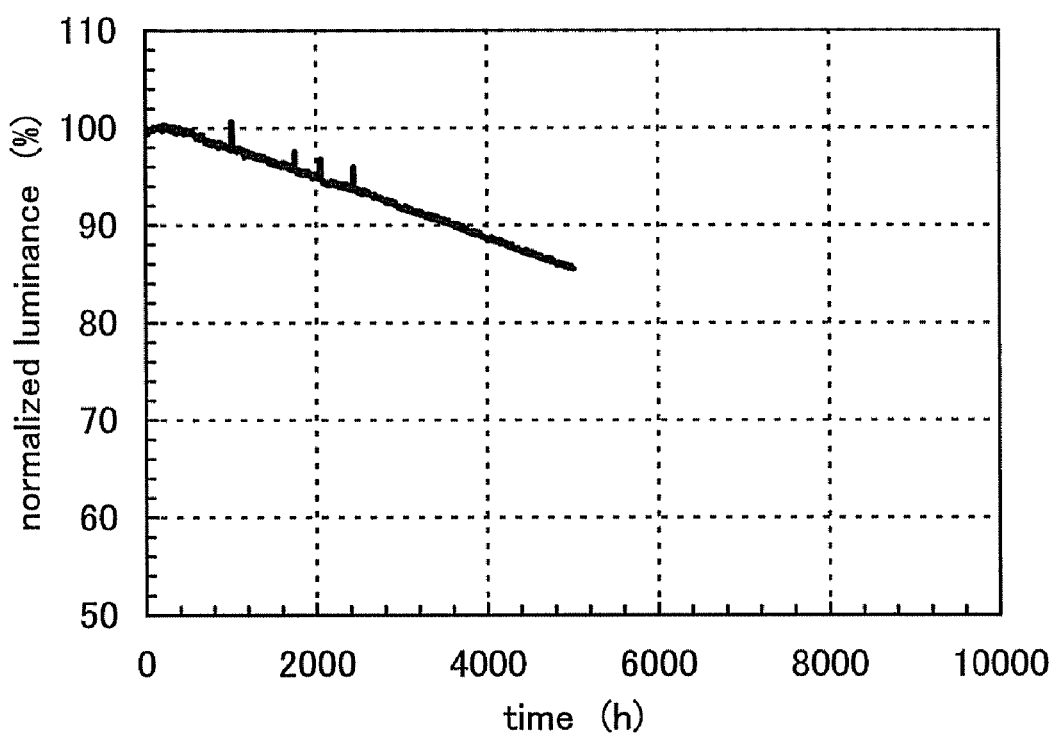
FIG. 44 shows characteristics of the light-emitting element of Example 6.

After the aging treatment, a luminance of 1800 d/m$^2$ was set to be the initial luminance, and the light-emitting element 8 was continuously lit by constant current driving. FIG. 44 shows the results. The vertical axis represents normalized luminance on condition that the initial luminance was 100%, and the horizontal axis represents driving time.

As shown in FIG. 44, the light-emitting element 8 of the present invention shows slight deterioration and keeps 89% of the initial luminance even after 4000 hours; thus, the element is found to have very long lifetime. Further, extremely high efficiency is achieved after the aging treatment. That is, by an aging treatment, the current efficiency of a light-emitting element of the present invention is stabilized, and long lifetime can be realized in the subsequent driving.

From the above-described results, it is understood that, by applying the element structure of a light-emitting element of the present invention, although it is a simple element structure, a light-emitting element having extremely long lifetime can be fabricated.

The light-emitting element 8 and the comparative light-emitting element 2 are different from each other just in whether only about 5 wt % hole-trapping substance (1'-TNATA) is added to the hole-transport region. However, such an effect of drastically improving the emission efficiency and lifetime is surprising and unpredictable from conventional common technical knowledge, demonstrating that the present invention provides a remarkable effect.

Example 7

In Example 7, an example of fabricating a light-emitting element of the present invention will be specifically described. Hereinafter, specific methods of fabricating light-emitting elements of Example 7 are described.
(Light-Emitting Element 9)

First, a glass substrate on which a 110-nm-thick indium tin silicon oxide (ITSO) film was formed as an anode was prepared. The periphery of a surface of the ITSO film was covered with a polyimide film so that a 2 mm square portion of the surface was exposed. The electrode area was set to 2 mm×2 mm. As a pretreatment for forming the light-emitting element over this substrate, the surface of the substrate was washed with water and baked at 200° C. for one hour, and then a UV ozone treatment was performed for 370 seconds. Then, the substrate was transferred into a vacuum evaporation apparatus where the pressure was reduced to about 10$^{-5}$ Pa. In a heating chamber of the vacuum evaporation apparatus, baking was performed at 170° C. for 30 minutes in vacuum. After that, the substrate was cooled down for about 30 minutes.

Next, the glass substrate provided with the anode was fixed to a substrate holder provided in a film formation chamber of the vacuum evaporation apparatus such that the surface on which the anode was formed faced downward.

Then, first of all, 9-[4-(10-phenyl-9-anthryl)phenyl]-9H-carbazole (abbreviation: CzPA) and molybdenum(VI) oxide were co-evaporated on the anode, whereby the hole-inject region to which molybdenum oxide, which was the electron-accepting substance, was added was formed. Resistance heating was used for the evaporation. The thickness of the hole-inject region was set to 50 nm, and the evaporation rate was adjusted such that the weight ratio of CzPA to molybdenum oxide was 1:0.5 (=CzPA:molybdenum oxide). Note that a co-evaporation method refers to an evaporation method by which evaporation is conducted from a plurality of evaporation sources at the same time in one treatment chamber.

Successively, CzPA and N,9-diphenyl-N-(9,10-diphenyl-2-anthryl)-9H-carbazol-3-amine (abbreviation: 2PCAPA) were co-evaporated by an evaporation method using resistance heating to form a 10-nm-thick film. The evaporation rate was adjusted such that the weight ratio of CzPA to 2PCAPA was 1:0.5 (=CzPA:2PCAPA).

Next, a 10-nm film was formed using only CzPA, and then CzPA and 2PCAPA were co-evaporated, whereby the light-emitting region to which 2PCAPA, which was the light-emitting substance, was added was formed. The thickness of the light-emitting region was set to 30 nm, and the evaporation rate was adjusted such that the weight ratio of CzPA to 2PCAPA was 1:0.05 (=CzPA:2PCAPA).

Next, CzPA and N,N'-diphenylquinacridone (abbreviation: DPQd) were co-evaporated, whereby the electron-transport region to which DPQd, which was the electron-trapping substance, was added was formed. The thickness of the electron-transport region was set to 10 nm, and the evaporation rate was adjusted such that the weight ratio of CzPA to DPQd was 1:0.005 (=CzPA:DPQd).

Furthermore, CzPA and lithium (Li) were co-evaporated, whereby the electron-inject region to which lithium, which was the electron-donating substance, was added was formed. The thickness of the electron-inject region was set to 20 nm, and the evaporation rate was adjusted such that the weight ratio of CzPA to lithium was 1:0.02 (=CzPA:lithium).

Lastly, a 200-nm-thick aluminum film was formed on the electron-inject region by an evaporation method using resistance heating, whereby the cathode was formed. Thus, the light-emitting element 9 was fabricated.

The thus obtained light-emitting element 9 was sealed in a glove box containing a nitrogen atmosphere so as not to be exposed to air. Then, operation characteristics of this light-emitting element were measured. Note that the measurement was carried out at room temperature (in the atmosphere kept at 25° C.).

Figure 45A:
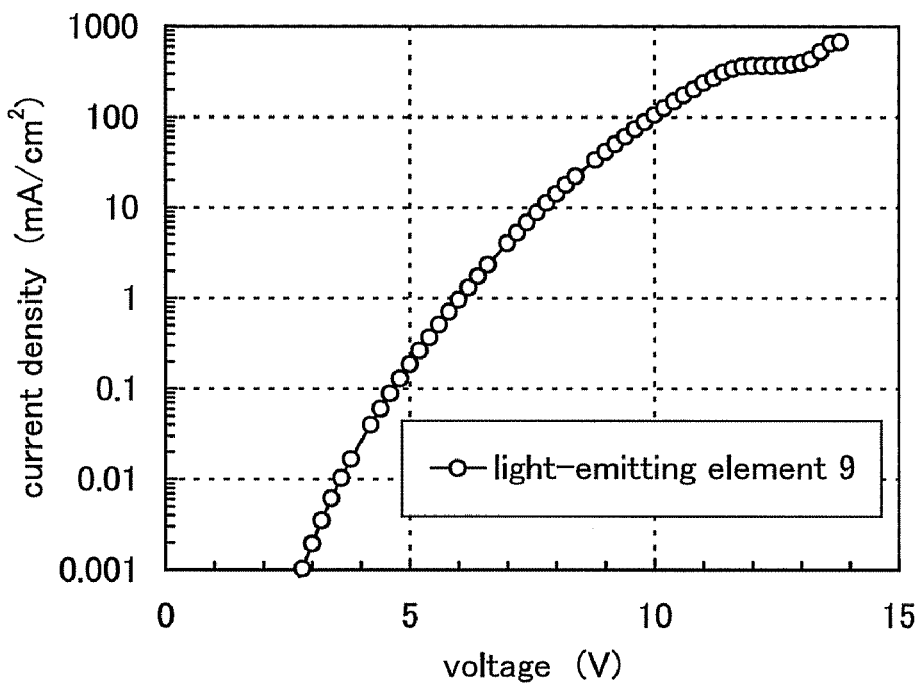
FIGS. 45A and 45B show characteristics of a light-emitting element of Example 7.
Figure 45B:
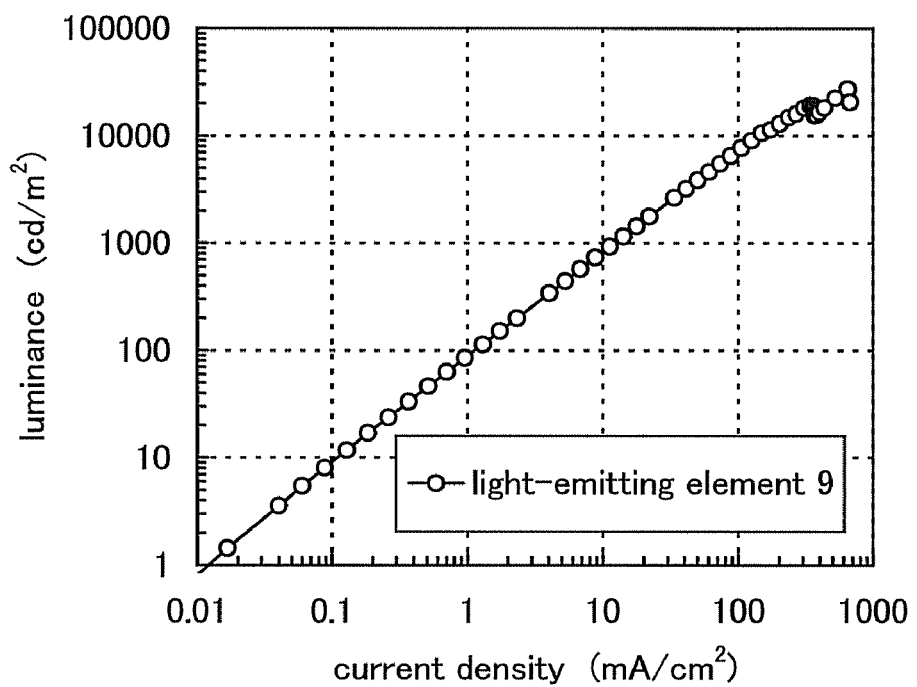
Figure 46A:
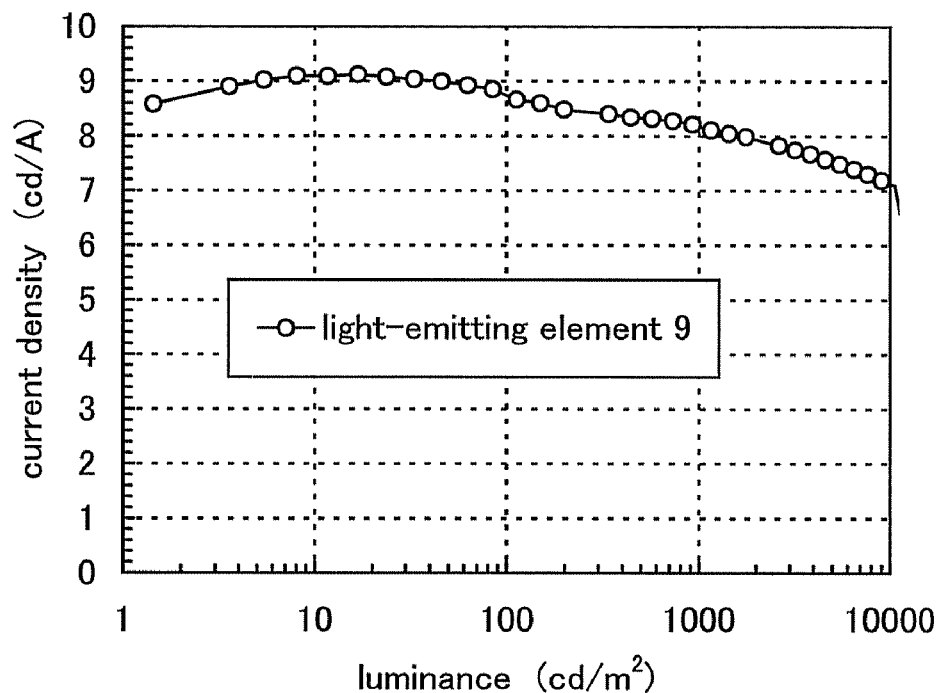
FIGS. 46A and 46B show characteristics of the light-emitting element of Example 7.
Figure 46B:
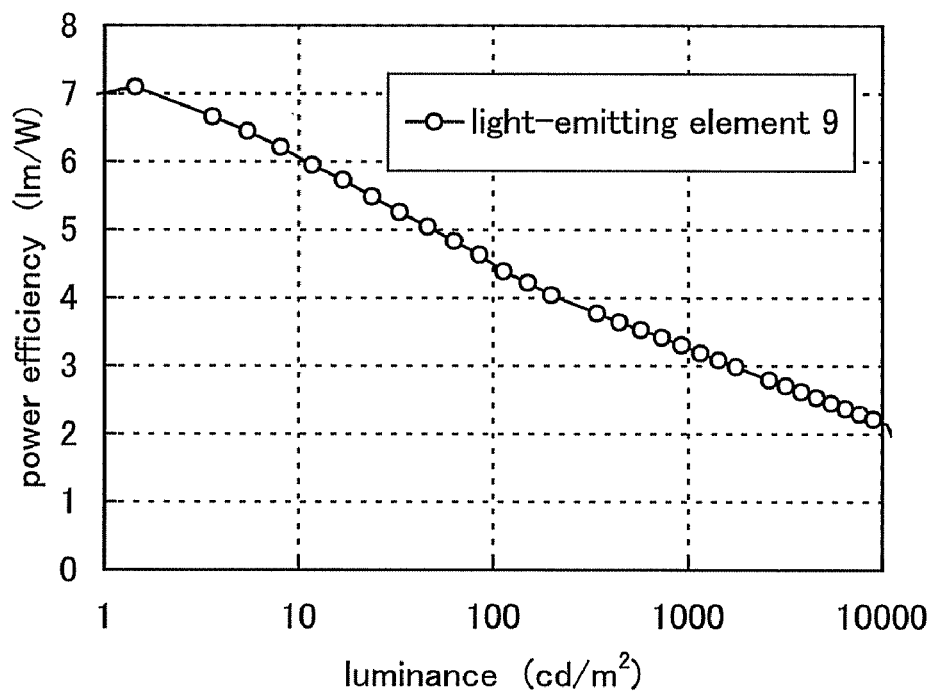
Figure 47:
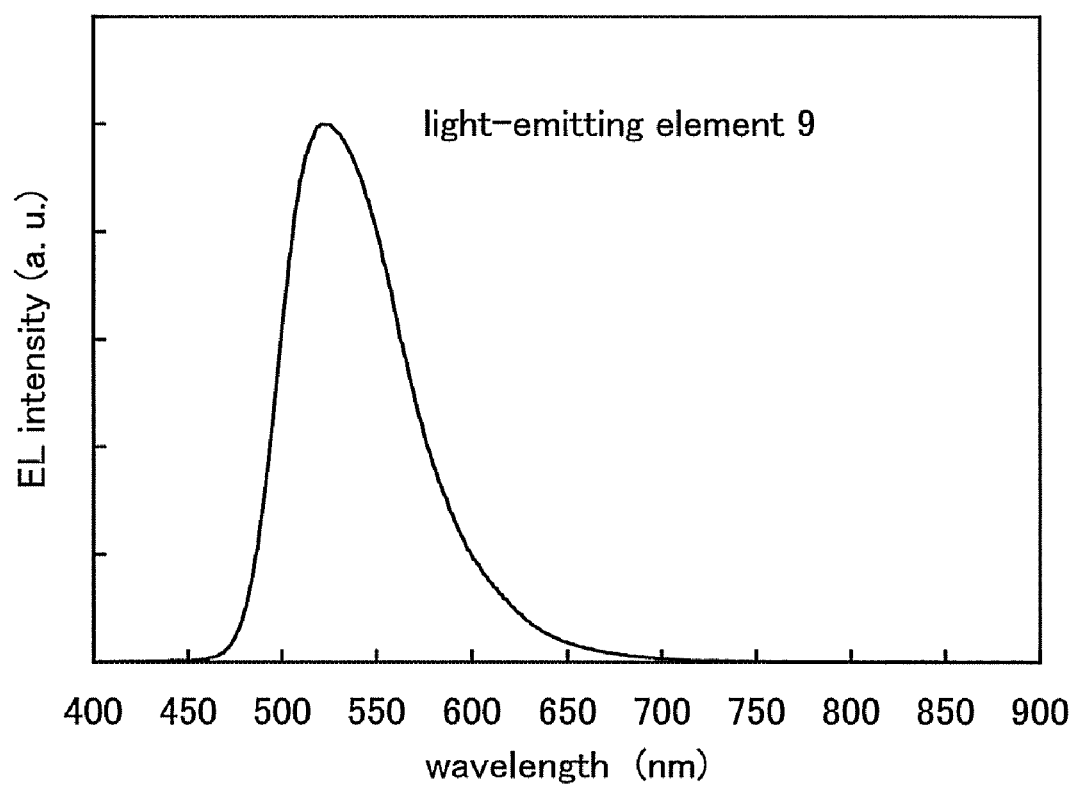
FIG. 47 shows characteristics of the light-emitting element of Example 7.

FIG. 45A shows the voltage vs. current density characteristics of the light-emitting element 9, and FIG. 45B shows the current density vs. luminance characteristics thereof. FIG. 46A shows the luminance vs. current efficiency characteristics of the light-emitting element 9, and FIG. 46B shows the luminance vs. power efficiency characteristics thereof. FIG. 47 shows the emission spectrum when the light-emitting element 9 was emitted by a current at a current density of 25 mA/cm$^2$. As apparent from FIG. 47, the light-emitting element 9 exhibits green light emission (an emission peak wavelength of 520 nm) from 2PCAPA, which was the light-emitting substance.

The current efficiency of the light-emitting element 9 at a luminance of 1000 cd/m$^2$ was 8.2 cd/A, and thus a good current efficiency was achieved. The power efficiency at a luminance was about 3.3 lm/W, which can provide sufficiently low power consumption.

As described in Example 3, in the light-emitting region obtained by adding CzPA to 2PCAPA, 2PCAPA has a strong tendency to trap holes while often failing to trap electrons. Thus, the light-emitting region tends to allow electrons to be transported to the anode. Besides, it is thought that in the light-emitting element 9 of the present invention, electrons which easily pass through the light-emitting region are trapped by the added DPQd so that the recombination efficiency is increased; thus, the high emission efficiency is obtained.

From the above-described results, it is understood that, by applying the element structure of a light-emitting element of the present invention, although it is a simple element structure, high emission efficiency can be obtained.

Furthermore, tests were performed in which the light-emitting element 9 was continuously lit by constant current driving. First, the light-emitting element 9 was driven to emit light at a current of 0.8 mA (at a current density of 20 mA/cm$^2$) for 48 hours and an aging treatment was performed. Although the initial luminance was about 1000 cd/m$^2$, the current efficiency was reduced by 22% by the aging treatment. Accordingly, after 48 hours, the luminance was reduced to about 780 d/m$^2$. This demonstrates that, for driving of a light-emitting element of the embodiment of the present invention, an aging treatment is effective to stabilize the current efficiency.

Figure 48:
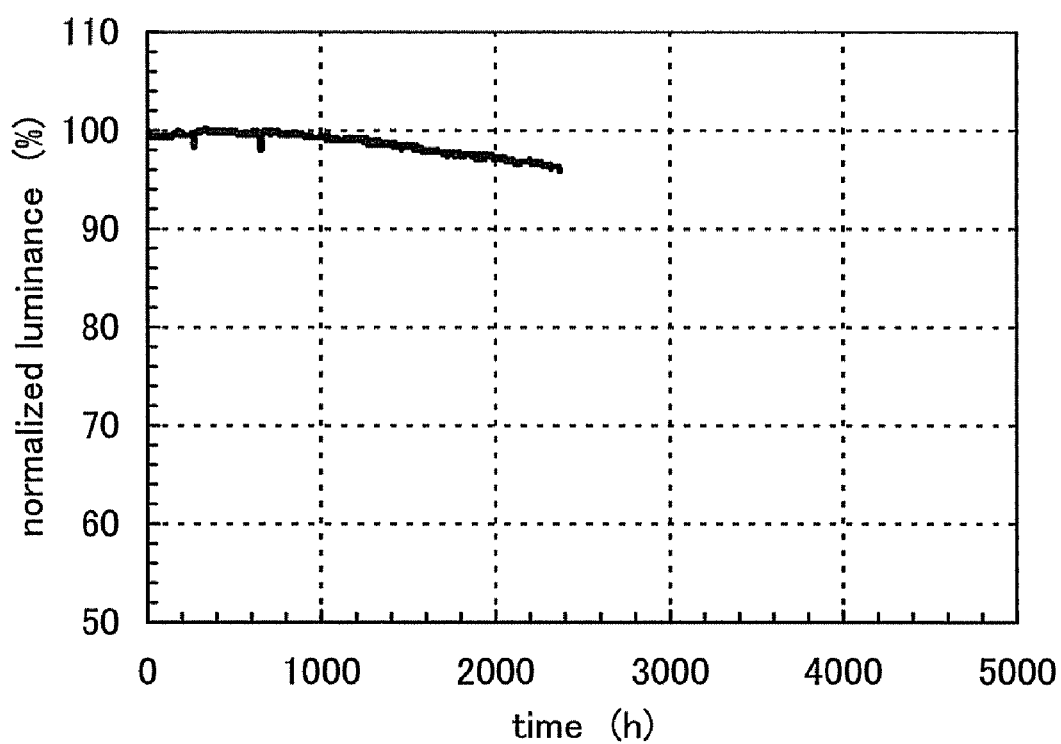
FIG. 48 shows characteristics of the light-emitting element of Example 7.

After the aging treatment, a luminance of 780 d/m$^2$ was kept and set to be the initial luminance, the light-emitting element 9 was continuously lit by constant current driving. FIG. 48 shows the results. The vertical axis represents normalized luminance under the conditions that the initial luminance was 100%, and the horizontal axis represents driving time.

As shown in FIG. 48, the light-emitting element 9 of the present invention shows slight deterioration and keeps 97% of the initial luminance even after 2000 hours; thus, the element is found to have very long lifetime. By an aging treatment, the current efficiency of a light-emitting element of the present invention is stabilized, and then long lifetime can be realized in the subsequent driving.

From the above-described results, it is understood that, by applying the element structure of a light-emitting element of the present invention, although it is a simple element structure, a light-emitting element having extremely long lifetime can be fabricated.

Example 8

In Example 8, in a manner similar to that of Example 4, the oxidation characteristics and reduction characteristics of the materials used for the light-emitting elements 5 to 7 fabricated in Example 5 were examined by cyclic voltammetry (CV) measurement. Further, from the measurement, the HOMO level and the LUMO level of each material were determined. Note that an electrochemical analyzer (ALS model 600A or 600C, manufactured by BAS Inc.) was used for the measurement.

As for a solution used for the CV measurement, dehydrated N,N-dimethylformamide (DMF, product of Sigma-Aldrich Inc., 99.8%, catalog No. 22705-6) was used as a solvent, and tetra-n-butylammonium perchlorate (n-Bu$_4$NClO$_4$, product of Tokyo Chemical Industry Co., Ltd., catalog No. T0836), which is a supporting electrolyte, was dissolved in the solvent such that the concentration of tetra-n-butylammonium perchlorate was 100 mmol/L. Further, the object that was to be measured was also dissolved in the solvent such that the concentration thereof was 2 mmol/L. Note that as for a substance having a low solubility, which cannot be dissolved at a concentration of 2 mmol/L, undissolved part of the substance is filtrated off and then a filtrate was used for the measurement. A platinum electrode (manufactured by BAS Inc., PTE platinum electrode) was used as a working electrode, a platinum electrode (manufactured by BAS Inc., Pt counter electrode for VC-3, (5 cm)) was used as an auxiliary electrode, and an Ag/Ag$^+$ electrode (manufactured by BAS Inc., RE-5 reference electrode for nonaqueous solvent) was used as a reference electrode. Note that the measurement was conducted at room temperature (20 to 25° C.). In addition, the scan rate at the CV measurement was set to 0.1 V/sec in all the measurements.

(Calculation of Potential Energy of Reference Electrode with Respect to Vacuum Level)

First, the potential energy (eV) of the reference electrode (Ag/Ag$^+$ electrode), which was used in Example 8, with respect to the vacuum level was calculated. That is, the Fermi level of the Ag/Ag$^+$ electrode was calculated. It is known that the oxidation-reduction potential of ferrocene in methanol is +0.610 [V vs. SHE] with respect to a standard hydrogen electrode (Reference: C. R. Goldsmith, et al., *J. Am. Chem. Soc.*, Vol. 124, No. 1, pp. 83-96, 2002). On the other hand, using the reference electrode used in Example 8, the oxidation-reduction potential of ferrocene in methanol was calculated to be +0.20 V [vs. Ag/Ag$^+$]. Thus, it is found that the potential energy of the reference electrode used in Example 8 was lower than that of the standard hydrogen electrode by 0.41 [eV].

Here, it is known that the potential energy of the standard hydrogen electrode with respect to the vacuum level is −4.44 eV (Reference: T. Ohnishi and T. Koyama, *High Molecular EL Material*, Kyoritsu Shuppan, pp. 64-67). Accordingly, the potential energy of the reference electrode used in Example 8 with respect to the vacuum level is able to be calculated as follows:

−4.44−0.41=−4.85 [eV].

Measurement Example 1

YGAO11

Figure 49A:
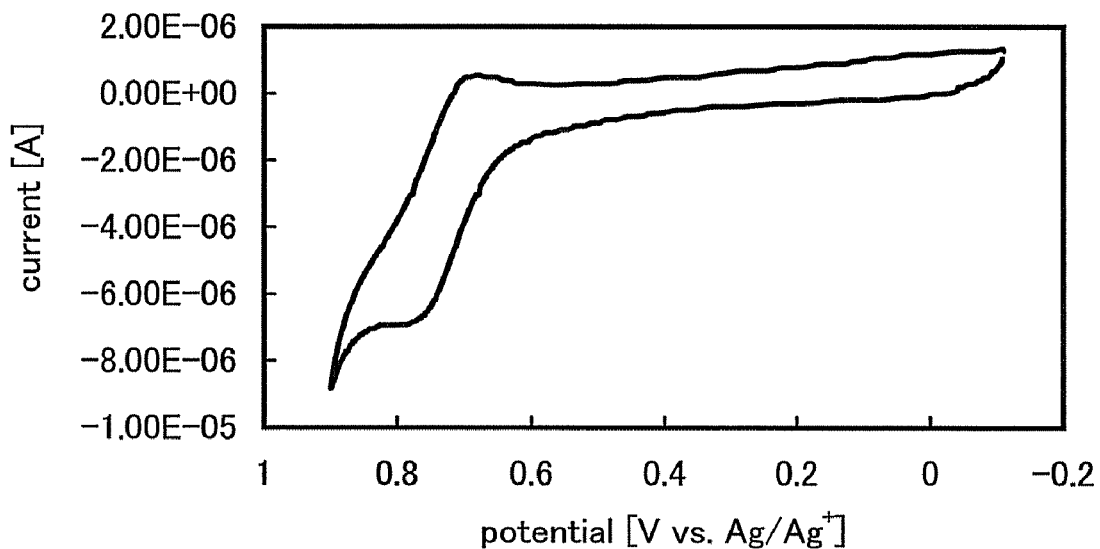
FIGS. 49A and 49B show CV characteristics of YGAO11.
Figure 49B:
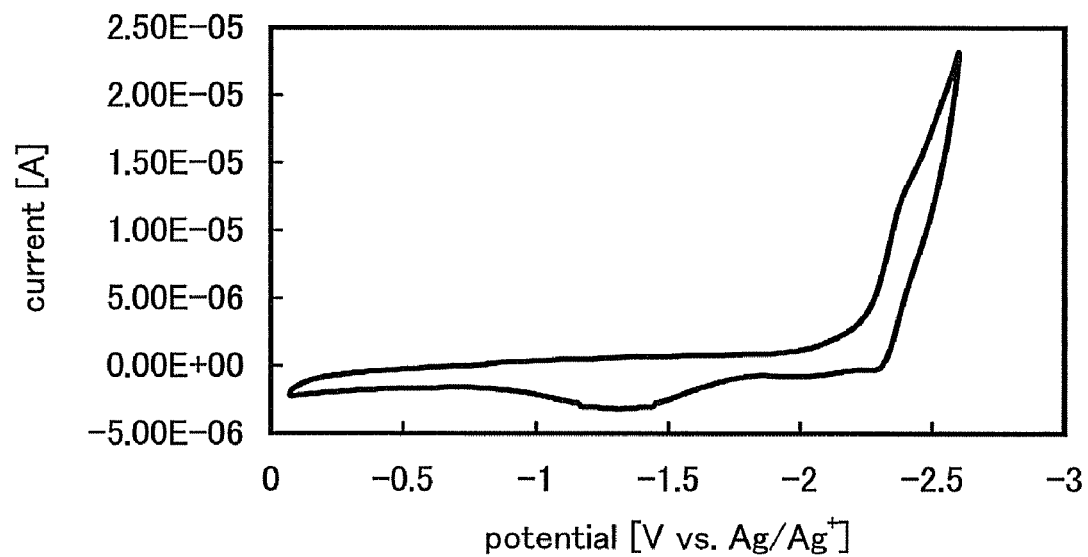

In Measurement Example 1, the oxidation characteristic and reduction characteristic of YGAO11 were examined by cyclic voltammetry (CV) measurement. FIGS. 49A and 49B show the measurement results. FIG. 49A shows the oxidation characteristic, and FIG. 49B shows the reduction characteristic. Note that for the measurement of the oxidation characteristic, the potential of the working electrode with respect to the reference electrode was scanned from −0.11 V to 0.90 V and then from 0.90 V to −0.11 V. Further, for the measurement of the reduction characteristic, the potential of the working electrode with respect to the reference electrode was scanned from −0.07 V to −2.60 V and then from −2.60 V to −0.07 V.

As shown in FIG. 49A, an oxidation peak potential $E_{pa}$ was 0.68 V and a reduction peak potential $E_{pc}$ was 0.78 V. Therefore, a half-wave potential (an intermediate potential between $E_{pc}$ and $E_{pa}$) can be calculated to be 0.73 V. This demonstrates that YGAO11 is oxidized by an electric energy of 0.73 [V vs. Ag/Ag$^+$], and this energy corresponds to the HOMO level. Here, as described above, the potential energy of the reference electrode used in Example 8 with respect to the vacuum level is −4.85 [eV]. Therefore, it is found that the HOMO level of YGAO11 is calculated as follows:

−4.85−(0.73)=−5.58 [eV].

Further, as shown in FIG. 49B, a reduction peak potential $E_{pc}$ was −2.40 V and an oxidation peak potential $E_{pa}$ was −2.31 V. Therefore, a half-wave potential (an intermediate potential between $E_{pc}$ and $E_{pa}$) can be calculated to be −2.36 V. This demonstrates that YGAO11 is reduced by an electric energy of −2.36 [V vs. Ag/Ag$^+$], and this energy corresponds to the LUMO level. Here, as described above, the potential energy of the reference electrode used in Example 8 with respect to the vacuum level is −4.94 [eV]. Therefore, it is found that the LUMO level of YGAO11 is calculated as follows:

−4.85−(−2.36)=−2.49 [eV].

Measurement Example 2

Ir(Fdppr-Me)$_2$(acac)

Figure 50A:
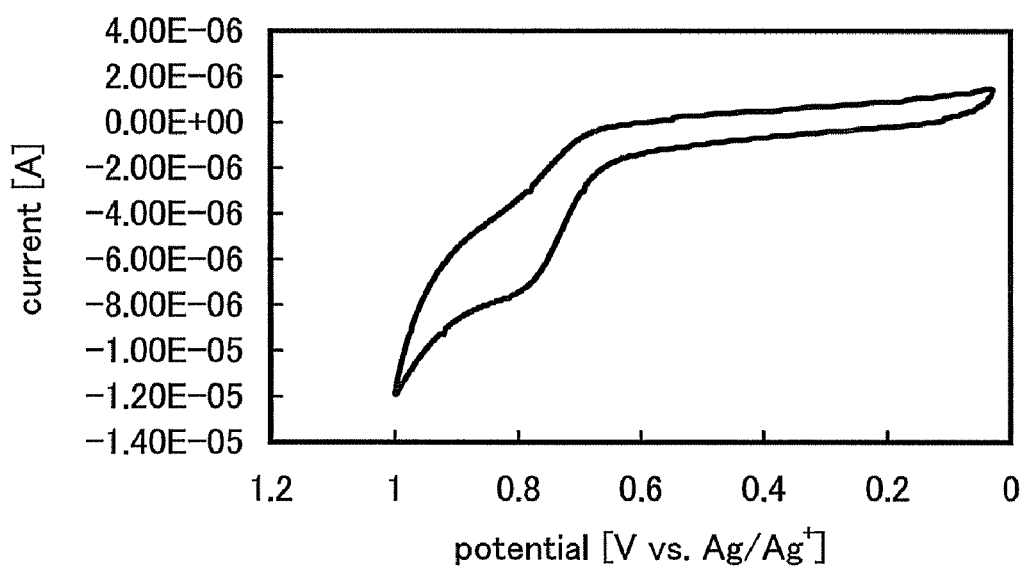
FIGS. 50A and 50B show CV characteristics of Ir(Fdppr-Me)$_2$(acac).
Figure 50B:
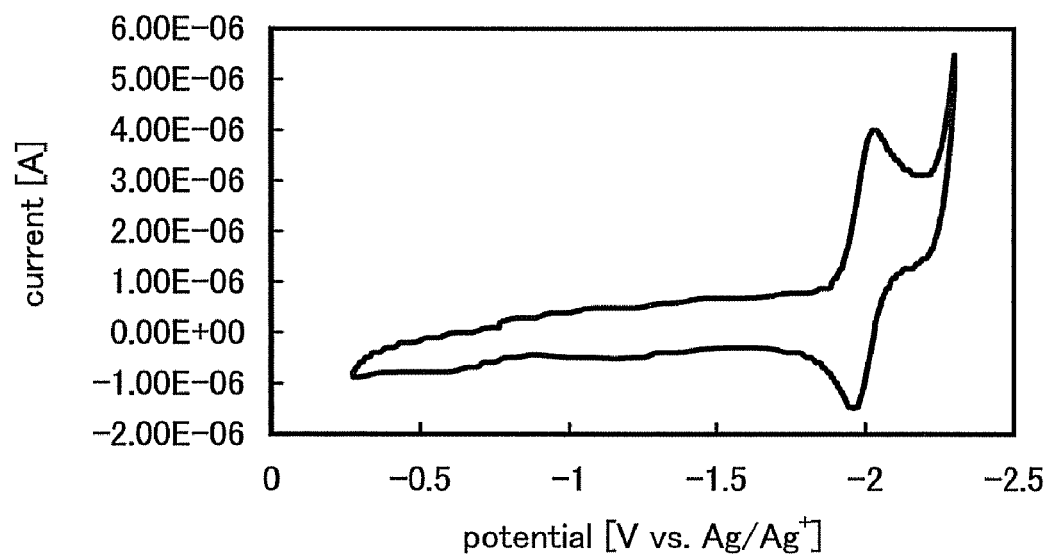

In Measurement Example 2, the oxidation characteristic and reduction characteristic of Ir(Fdppr-Me)$_2$(acac) were examined by cyclic voltammetry (CV) measurement. FIGS. 50A and 50B show the measurement results. FIG. 50A shows the oxidation characteristic, and FIG. 50B shows the reduction characteristic. Note that for the measurement of the oxidation reaction characteristic, the potential of the working electrode with respect to the reference electrode was scanned from 0.03 V to 1.00 V and then from 1.00 V to 0.03 V. Further, for the measurement of the reduction characteristic, the potential of the working electrode with respect to the reference electrode was scanned from −0.27 V to −2.30 V and then from −2.30 V to −0.27 V.

As shown in FIG. 50A, an oxidation peak potential $E_{pa}$ was 0.80 V and a reduction peak potential $E_{pc}$ was 0.67 V. Therefore, a half-wave potential (an intermediate potential between $E_{pc}$ and $E_{pa}$) can be calculated to be 0.74 V. This demonstrates that Ir(Fdppr-Me)$_2$(acac) is oxidized by an electric energy of 0.74 [V vs. Ag/Ag$^+$], and this energy corresponds to the HOMO level. Here, as described above, the potential energy of the reference electrode used in Example 8 with respect to the vacuum level is −4.85 [eV]. Therefore, it is found that the HOMO level of Ir(Fdppr-Me)$_2$(acac) is calculated as follows:

−4.85−(0.74)=−5.59 [eV].

Further, as shown in FIG. 50B, a reduction peak potential $E_{pc}$ was −2.03 V and an oxidation peak potential $E_{pa}$ was −1.96 V. Therefore, a half-wave potential (an intermediate potential between $E_{pc}$ and $E_{pa}$) can be calculated to be −2.00 V. This demonstrates that Ir(Fdppr-Me)$_2$(acac) is reduced by an electric energy of −2.00 [V vs. Ag/Ag$^+$], and this energy corresponds to the LUMO level. Here, as described above, the potential energy of the reference electrode used in Example 8 with respect to the vacuum level is −4.85 [eV]. Therefore, it is found that the LUMO level of Ir(Fdppr-Me)$_2$(acac) is calculated as follows:

−4.85−(−2.00)=−2.85 [eV].

This application is based on Japanese Patent Application serial no. 2008-130215 filed with Japan Patent Office on May 16, 2008 and Japanese Patent Application serial no. 2008-198721 filed with Japan Patent Office on Jul. 31, 2008, the entire contents of which are hereby incorporated by reference.

EXPLANATION OF REFERENCE

101: anode, 102: cathode, 103: organic compound film, 111: light-emitting region, 112: hole-transport region, 113: electron-transport region, 114: hole-inject region, 115: electron-inject region, 116: charge generation region, 117: charge generation region, 123: HOMO level, 124: LUMO level, 127: HOMO level, 128: LUMO level, 601: driver circuit portion (source side driver circuit), 602: pixel portion, 603: driver circuit portion (gate side driver circuit), 604: sealing substrate, 605: sealant, 607: space, 608: wiring, 609: flexible printed circuit (FPC), 610: element substrate, 611: switching TFT, 612: current-controlling TFT, 613: first electrode, 614: insulator, 616: organic compound film, 617: second electrode, 618: light emitting device, 623: n-channel TFT, 624: p-channel TFT, 701: main body, 702: display portion, 703: operation switch, 710: main body, 711: display portion, 712: memory portion, 713: operating portion, 714: earphone, 901: housing, 902: liquid crystal layer, 903: backlight, 904: housing, 905: driver IC, 906: terminal, 951: substrate, 952: electrode, 953: insulating layer, 954: partition layer, 955: organic compound film, 956: electrode, 1001: substrate, 1002: base insulating film, 1003: gate insulating film, 1006: conductive layer, 1009: low concentration impurity region, 1014: high concentration impurity region, 1018: high concentration impurity region, 1020: interlayer insulating film, 1021: interlayer insulating film, 1022: connection electrode, 1023: connection electrode, 1025: insulator, 1024: first electrode, 1028: organic compound film, 1029: second electrode, 1030:

gap, 1031: sealing substrate, 1032: sealant, 1033: transparent base material, 1035: black layer (black matrix), 1036: overcoat layer, 1037: third interlayer insulating film, 1040: pixel portion, 1041: driver circuit portion, 1042: peripheral portion, 116*a*: P-type region, 116*b*: N-type region, 117*a*: P-type region, 117*b*: N-type region, 2001: housing, 2002: light source, 3001: lighting apparatus, 3002: television set, 9101: housing, 9102: supporting base, 9103: display portion, 9104: speaker portion, 9105: video input terminal, 9201: main body, 9202: housing, 9203: display portion, 9204: keyboard, 9205: external connection port, 9206: pointing device, 9301: main body, 9302: display portion, 9303: housing, 9304: external connection port, 9305: remote control receiving portion, 9306: image receiving portion, 9307: battery, 9308: audio input portion, 9309: operation key, 9310: eye piece portion, 9401: main body, 9402: housing, 9403: display portion, 9404: audio input portion, 9405: audio output portion, 9406: operation key, 9407: external connection port, 9408: antenna, 1024W: first electrode, 1034B: color layer, 1034G: color layer, 1034R: color layer, 1044B: light-emitting region, 1044G: light-emitting region, 1044R: light-emitting region, 1044W: light-emitting region.

The invention claimed is:

1. A light-emitting element comprising:
an anode;
a first layer over and in contact with the anode, the first layer comprising a first organic compound;
an organic compound layer over and in contact with the first layer;
a second layer over and in contact with the organic compound layer, the second layer comprising the first organic compound; and
a cathode over and in contact with the second layer,
wherein:
the organic compound layer comprises a first region, a light-emitting region over and in contact with the first region, and a second region over and in contact with the light-emitting region;
the first region comprises the first organic compound and a hole-trapping substance;
the light-emitting region comprises the first organic compound and a light-emitting substance; and
the second region comprises the first organic compound and an electron-trapping substance.

2. The light-emitting element according to claim 1,
wherein the light-emitting substance is a phosphorescent compound.

3. The light-emitting element according to claim 1,
wherein a HOMO level of the hole-trapping substance is higher than a HOMO level of the first organic compound by 0.2 eV or more.

4. The light-emitting element according to claim 1,
wherein a LUMO level of the electron-trapping substance is lower than a LUMO level of the first organic compound by 0.2 eV or more.

5. A lighting apparatus comprising a light-emitting element, the light-emitting element comprising:
an anode;
a first layer over and in contact with the anode, the first layer comprising a first organic compound;
an organic compound layer over and in contact with the first layer;
a second layer over and in contact with the organic compound layer, the second layer comprising the first organic compound; and
a cathode over and in contact with the second layer,
wherein:
the organic compound layer comprises a first region, a light-emitting region over and in contact with the first region, and a second region over and in contact with the light-emitting region;
the first region comprises the first organic compound and a hole-trapping substance;
the light-emitting region comprises the first organic compound and a light-emitting substance; and
the second region comprises the first organic compound and an electron-trapping substance.

6. The lighting apparatus according to claim 5,
wherein the light-emitting substance is a phosphorescent compound.

7. The lighting apparatus according to claim 5,
wherein a HOMO level of the hole-trapping substance is higher than a HOMO level of the first organic compound by 0.2 eV or more.

8. The lighting apparatus according to claim 5,
wherein a LUMO level of the electron-trapping substance is lower than a LUMO level of the first organic compound by 0.2 eV or more.

9. A light-emitting element comprising:
an anode;
a first layer over and in contact with the anode, the first layer comprising a first organic compound;
an organic compound layer over and in contact with the first layer;
a second layer over and in contact with the organic compound layer, the second layer comprising the first organic compound; and
a cathode over and in contact with the second layer,
wherein:
the organic compound layer comprises a first region, a light-emitting region over and in contact with the first region, and a second region over and in contact with the light-emitting region;
the first region comprises the first organic compound and a hole-trapping substance;
the light-emitting region comprises the first organic compound and a light-emitting substance;
the second region comprises the first organic compound and an electron-trapping substance; and
the first organic compound is an anthracene derivative.

10. The light-emitting element according to claim 9,
wherein the light-emitting substance is a phosphorescent compound.

11. The light-emitting element according to claim 9,
wherein a HOMO level of the hole-trapping substance is higher than a HOMO level of the first organic compound by 0.2 eV or more.

12. The light-emitting element according to claim 9,
wherein a LUMO level of the electron-trapping substance is lower than a LUMO level of the first organic compound by 0.2 eV or more.

13. A lighting apparatus comprising a light-emitting element, the light-emitting element comprising:
an anode;
a first layer over and in contact with the anode, the first layer comprising a first organic compound;
an organic compound layer over and in contact with the first layer;
a second layer over and in contact with the organic compound layer, the second layer comprising the first organic compound; and
a cathode over and in contact with the second layer, wherein:
the organic compound layer comprises a first region, a light-emitting region over and in contact with the first region, and a second region over and in contact with the light-emitting region;
the first region comprises the first organic compound and a hole-trapping substance;
the light-emitting region comprises the first organic compound and a light-emitting substance;
the second region comprises the first organic compound and an electron-trapping substance;
the first organic compound is an anthracene derivative.

14. The lighting apparatus according to claim 13, wherein the light-emitting substance is a phosphorescent compound.

15. The lighting apparatus according to claim 13, wherein a HOMO level of the hole-trapping substance is higher than a HOMO level of the first organic compound by 0.2 eV or more.

16. The lighting apparatus according to claim 13, wherein a LUMO level of the electron-trapping substance is lower than a LUMO level of the first organic compound by 0.2 eV or more.

* * * * *